United States Patent
Peng

(10) Patent No.: US 9,905,477 B2
(45) Date of Patent: Feb. 27, 2018

(54) INVERTERS AND MANUFACTURING METHODS THEREOF

(71) Applicant: Taiwan Semiconductor Manufacturing Company, Ltd., Hsin-Chu (TW)

(72) Inventor: Cheng-Yi Peng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/413,030

(22) Filed: Jan. 23, 2017

(65) Prior Publication Data

US 2017/0133279 A1 May 11, 2017

Related U.S. Application Data

(60) Division of application No. 14/919,568, filed on Oct. 21, 2015, now Pat. No. 9,583,490, which is a continuation-in-part of application No. 14/601,084, filed on Jan. 20, 2015, now Pat. No. 9,406,697.

(51) Int. Cl.
| | |
|---|---|
| *H01L 21/8238* | (2006.01) |
| *H01L 27/092* | (2006.01) |
| *H01L 21/822* | (2006.01) |
| *H01L 21/84* | (2006.01) |
| *H01L 21/761* | (2006.01) |
| *H01L 27/06* | (2006.01) |
| *H01L 27/12* | (2006.01) |
| *H01L 29/66* | (2006.01) |
| *H01L 29/423* | (2006.01) |

(52) U.S. Cl.
CPC .... *H01L 21/823821* (2013.01); *H01L 21/761* (2013.01); *H01L 21/8221* (2013.01); *H01L 21/823807* (2013.01); *H01L 21/823814* (2013.01); *H01L 21/823878* (2013.01); *H01L 21/845* (2013.01); *H01L 27/0688* (2013.01); *H01L 27/0924* (2013.01); *H01L 27/1211* (2013.01); *H01L 29/42392* (2013.01); *H01L 29/66977* (2013.01)

(58) Field of Classification Search
CPC ............ H01L 21/823821; H01L 21/845
USPC .................................................. 438/220
See application file for complete search history.

(56) References Cited

U.S. PATENT DOCUMENTS

| | | | |
|---|---|---|---|
| 7,838,967 | B2 | 11/2010 | Chen |
| 8,338,939 | B2 | 12/2012 | Lin et al. |
| 2012/0309118 | A1 | 12/2012 | Wang et al. |
| 2013/0037823 | A1 | 2/2013 | Kanemura et al. |
| 2015/0206958 | A1 | 7/2015 | Walke et al. |

(Continued)

OTHER PUBLICATIONS

Datta, S., et al., "Tunnel FET Technology: A Reliability Perspective," Microelectronics Reliability 54 (2014), pp. 861-874.

(Continued)

*Primary Examiner* — Anthony Ho
(74) *Attorney, Agent, or Firm* — Slater Matsil, LLP

(57) ABSTRACT

Inverters and methods of manufacture thereof are disclosed. In some embodiments, an inverter includes a substrate and a first tunnel FET (TFET) disposed over the substrate. The first TFET is a first fin field effect transistor (FinFET). A second TFET is over the first TFET. The second TFET is a second FinFET. A junction isolation region is disposed between a source of the first TFET and a source of the second TFET.

20 Claims, 51 Drawing Sheets

(56) References Cited

U.S. PATENT DOCUMENTS

2015/0318213 A1 11/2015 Tsai et al.
2015/0318214 A1 11/2015 Tsai et al.

OTHER PUBLICATIONS

Dupre, C., et al., "15nm-Diameter 3D Stacked Nanowires with Independent Gates Operation: FFET," IEEE International Electron Devices Meeting (IEDM) 2008, pp. 749-752.
Hubert, A., et al., "A Stacked SONOS Technology, Up to 4 Levels and 6nm Crystalline Nanowires, with Gate-All-Around or Independent Gates (F-Flash), Suitable for Full 3D Integration," IEEE International Electron Devices Meeting (IEDM) 2009, pp. 27.6.1-27.6.4.
Seabaugh, A.C., et al., "Low-Voltage Tunnel Transistors for Beyond CMOS Logic," Proceedings of the IEEE, vol. 98, No. 12, Dec. 2010, pp. 2095-2110.

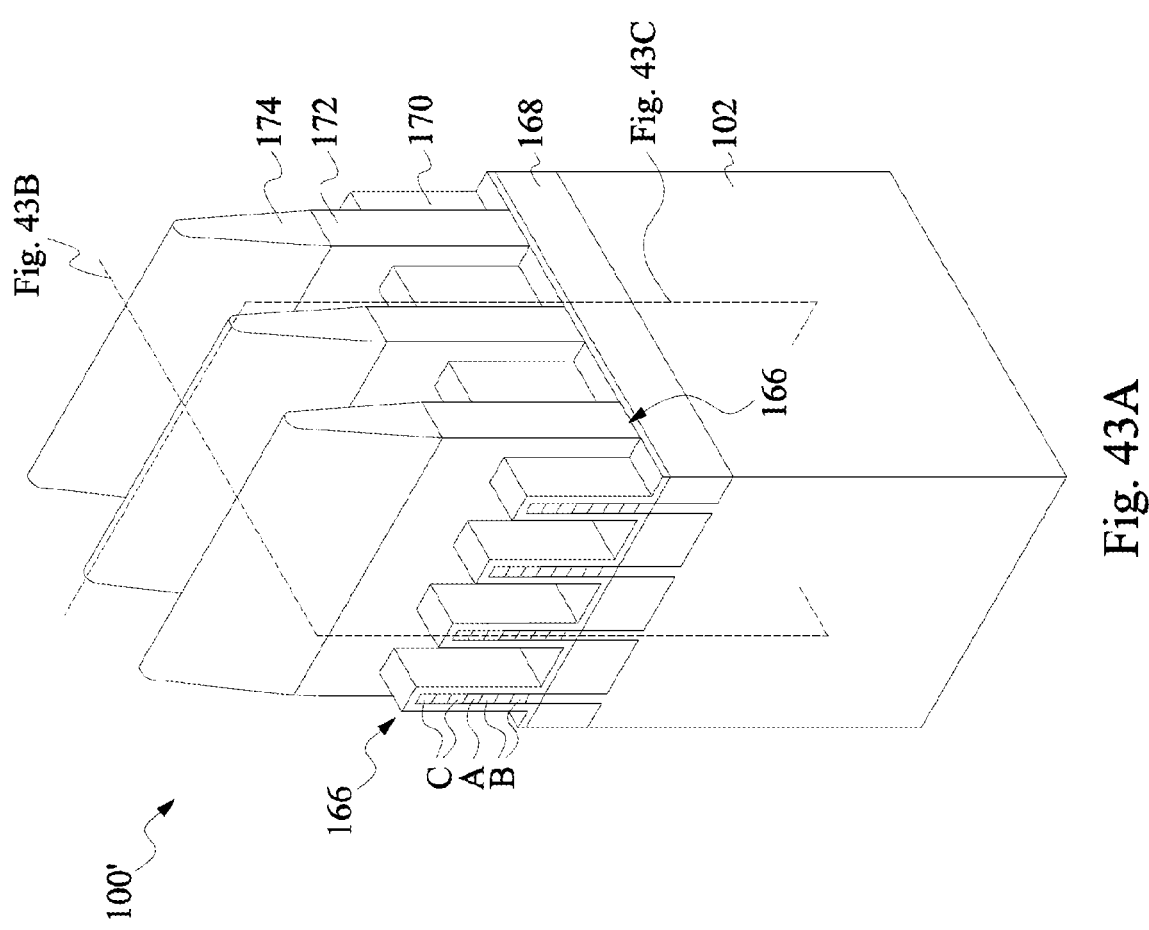

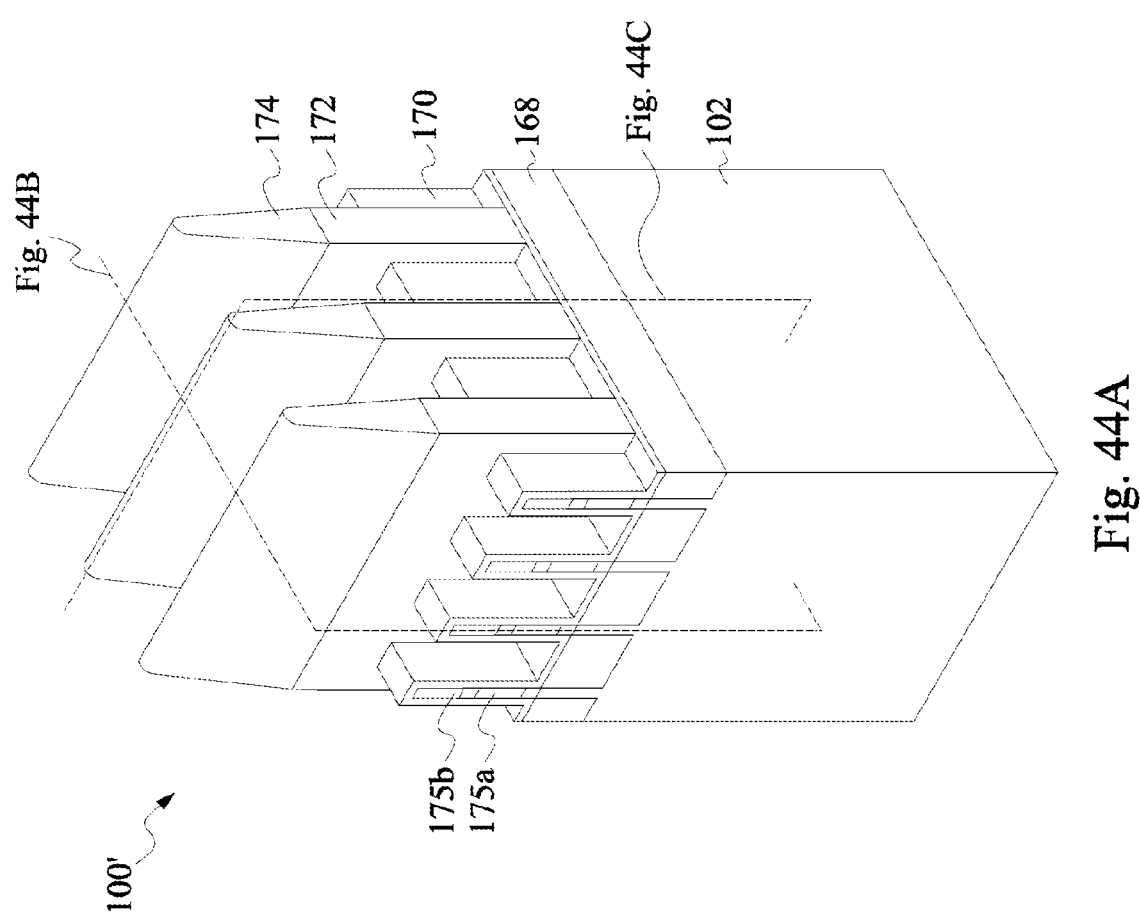

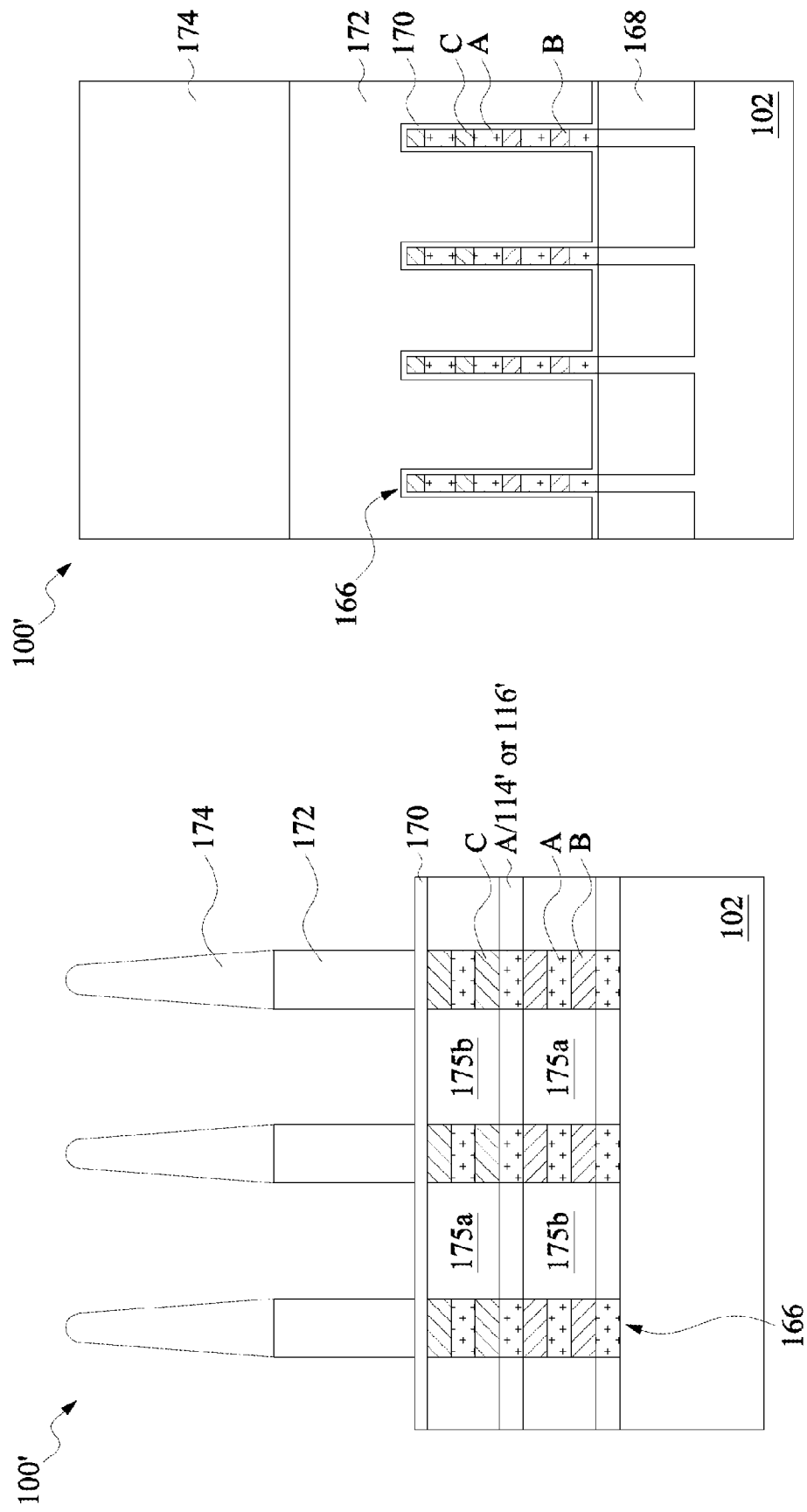

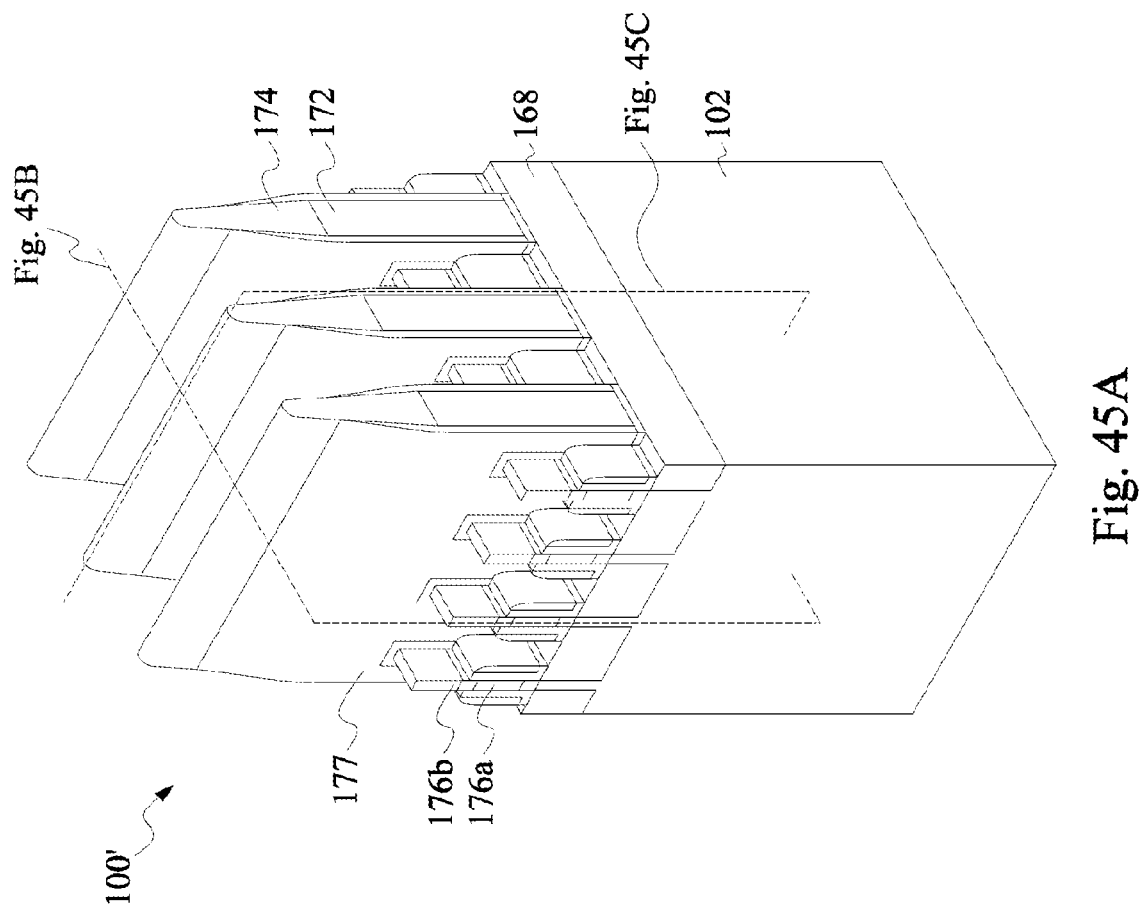

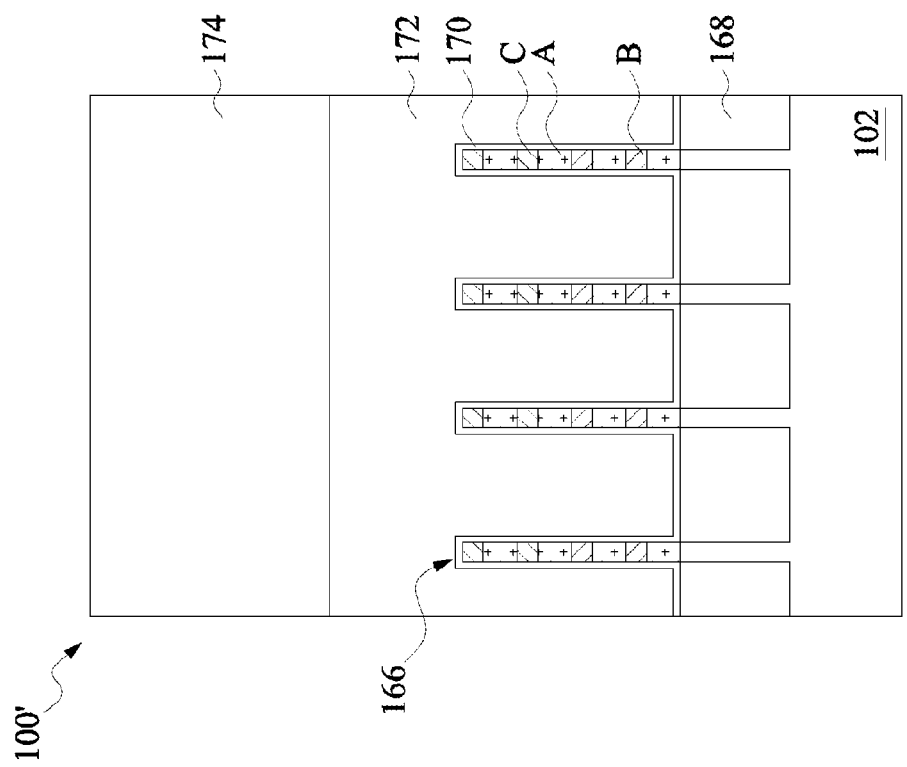
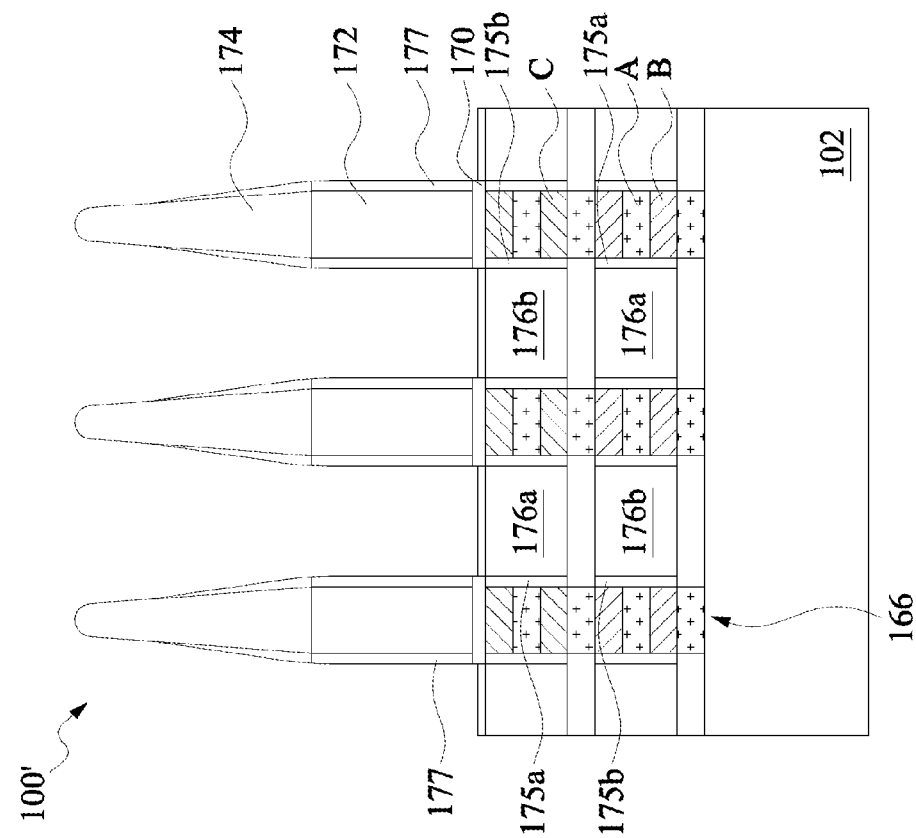
Fig. 45C
Fig. 45B

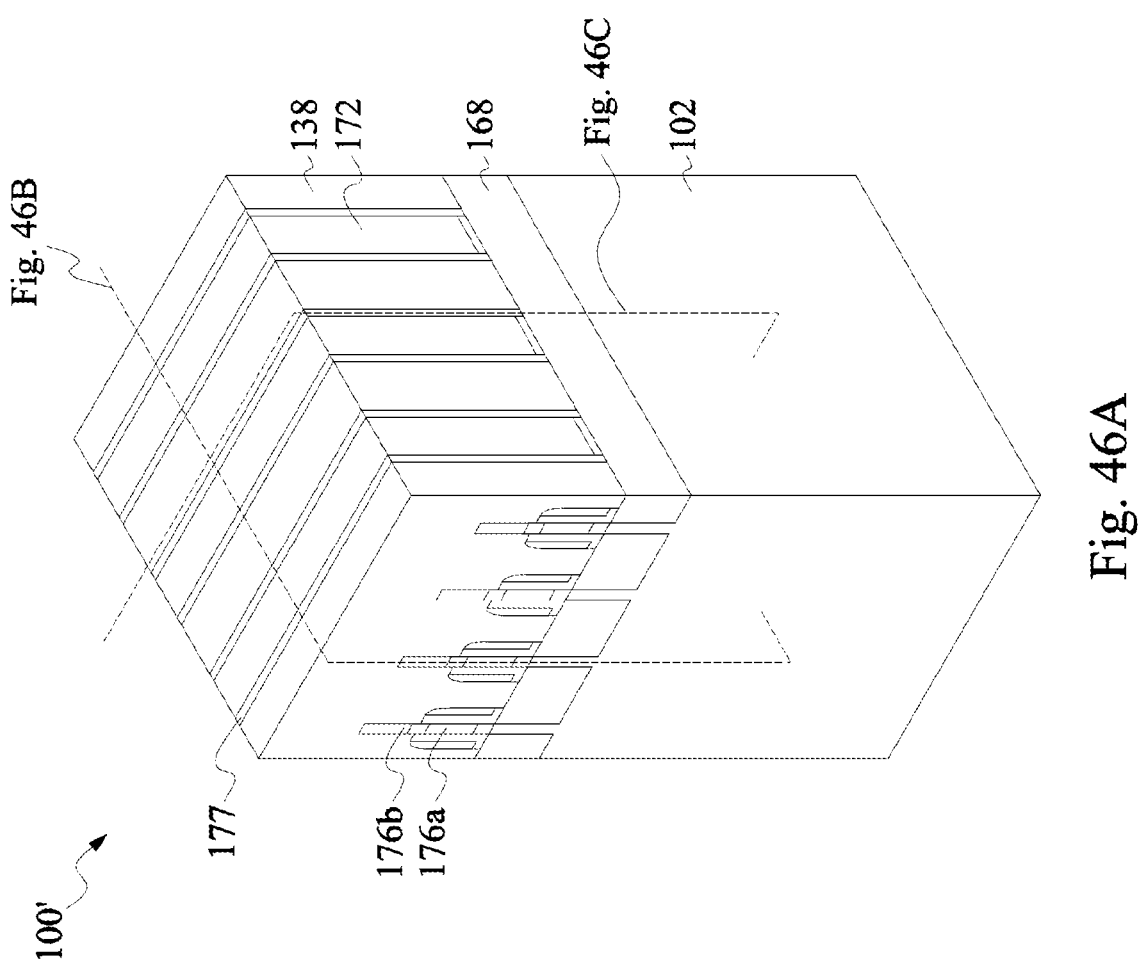

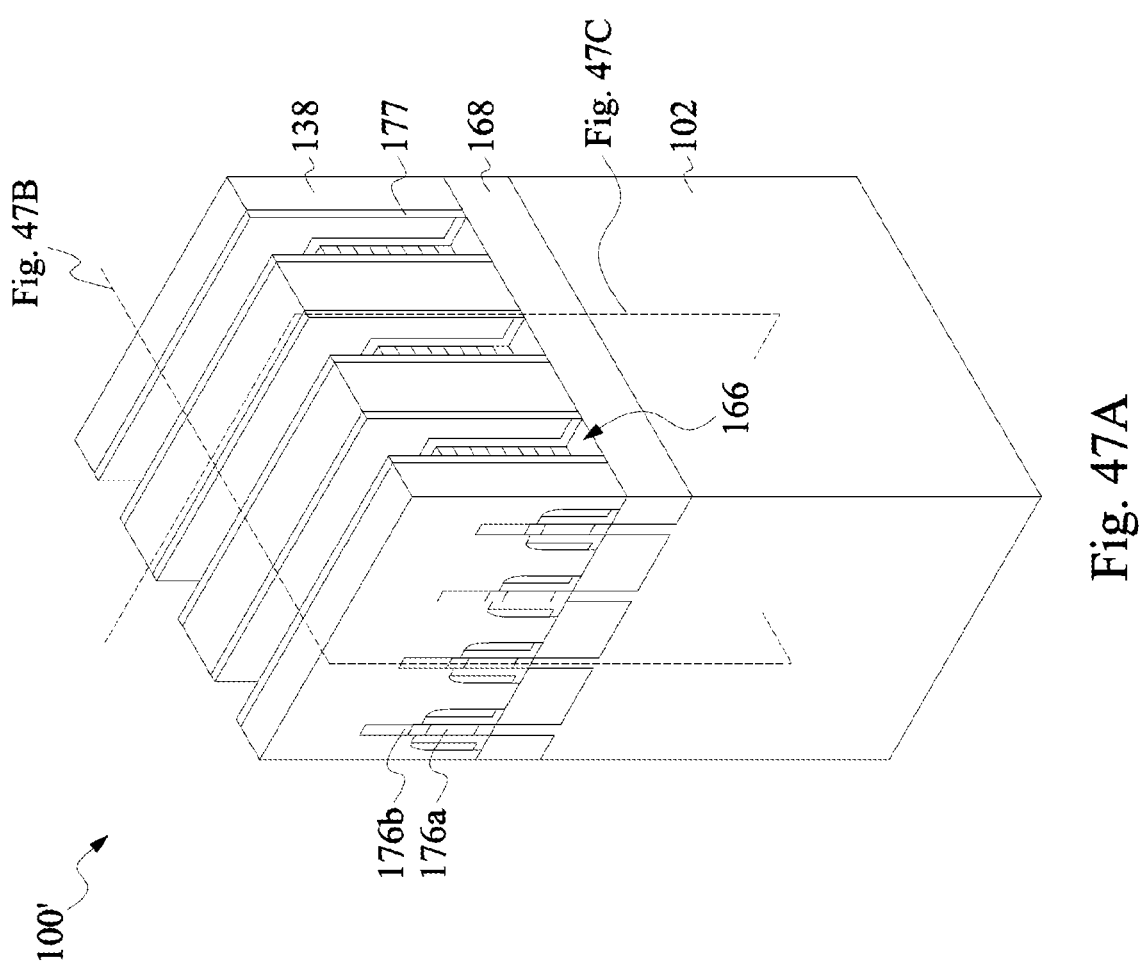

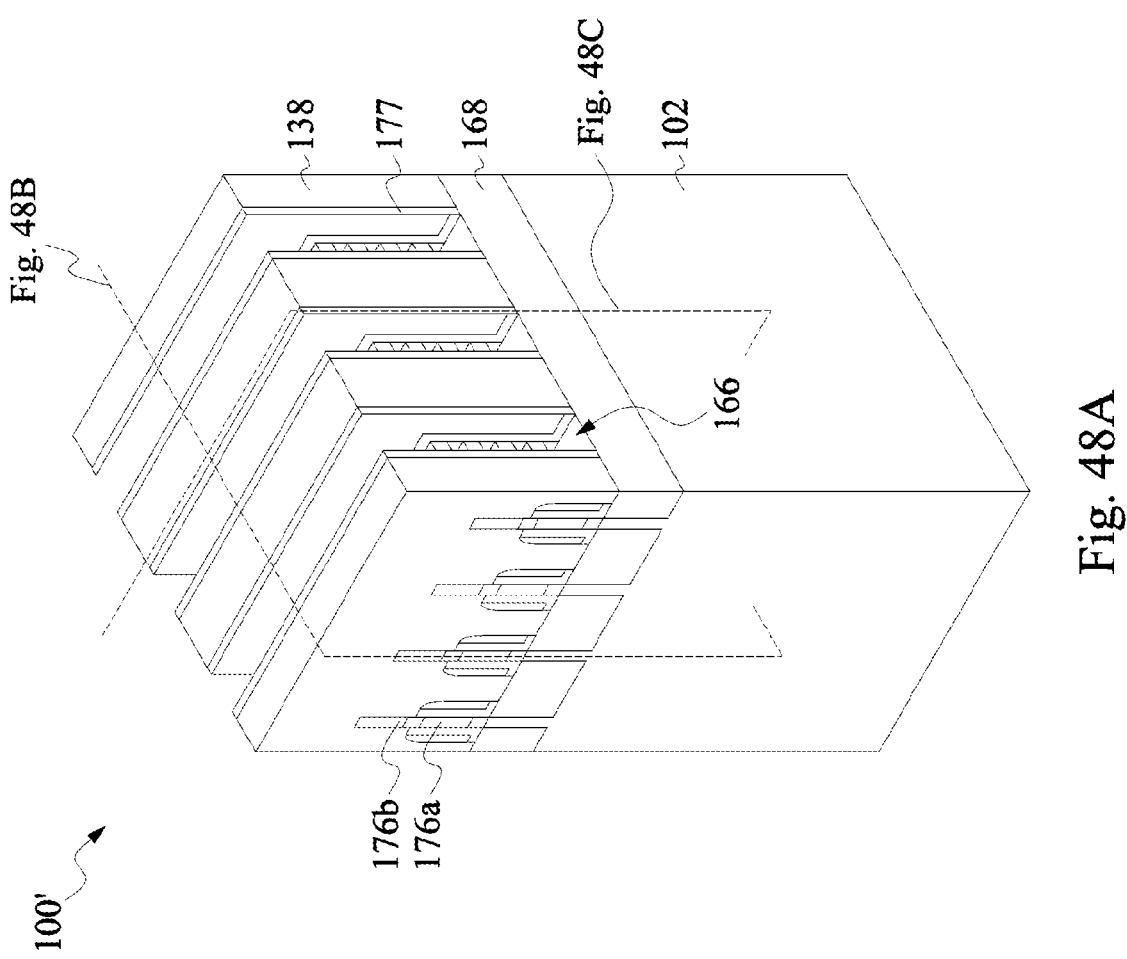

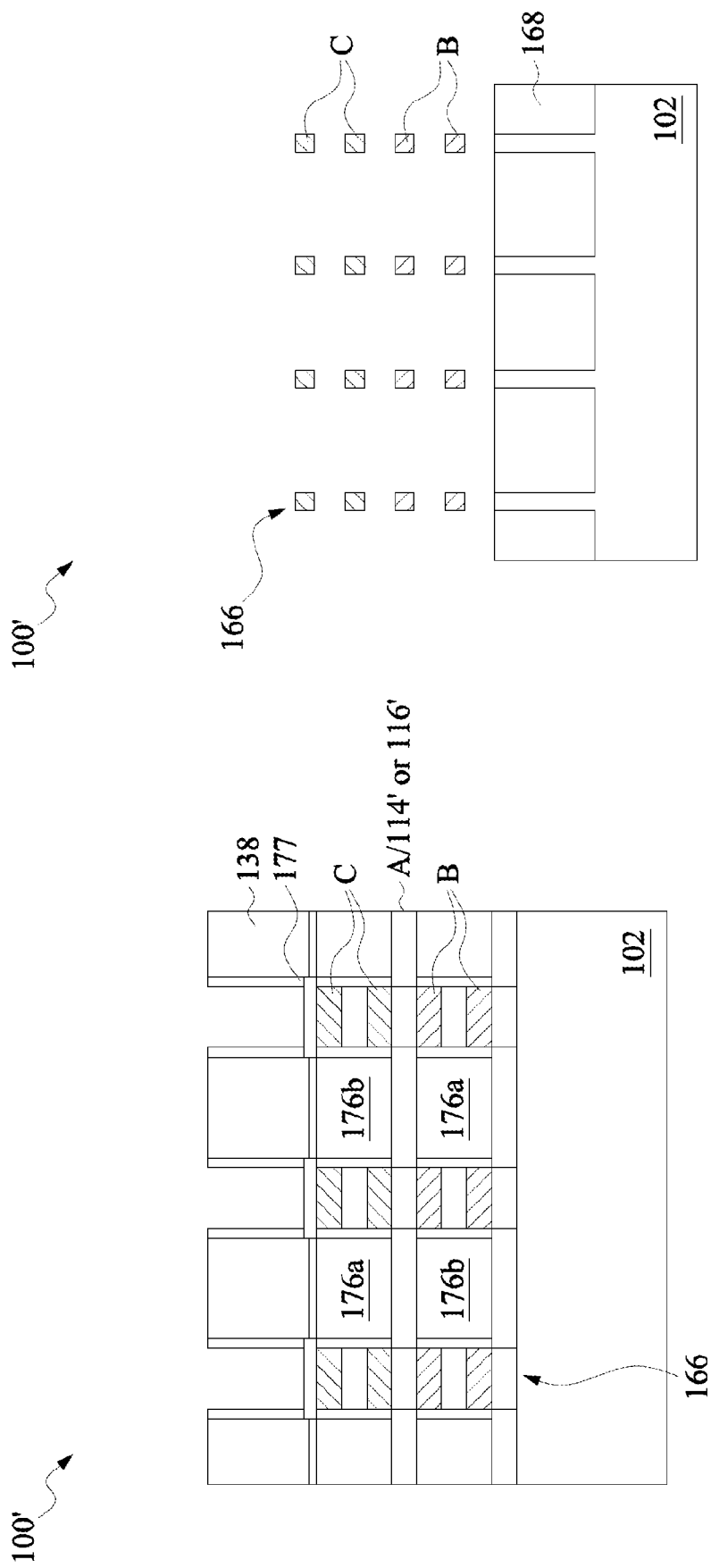

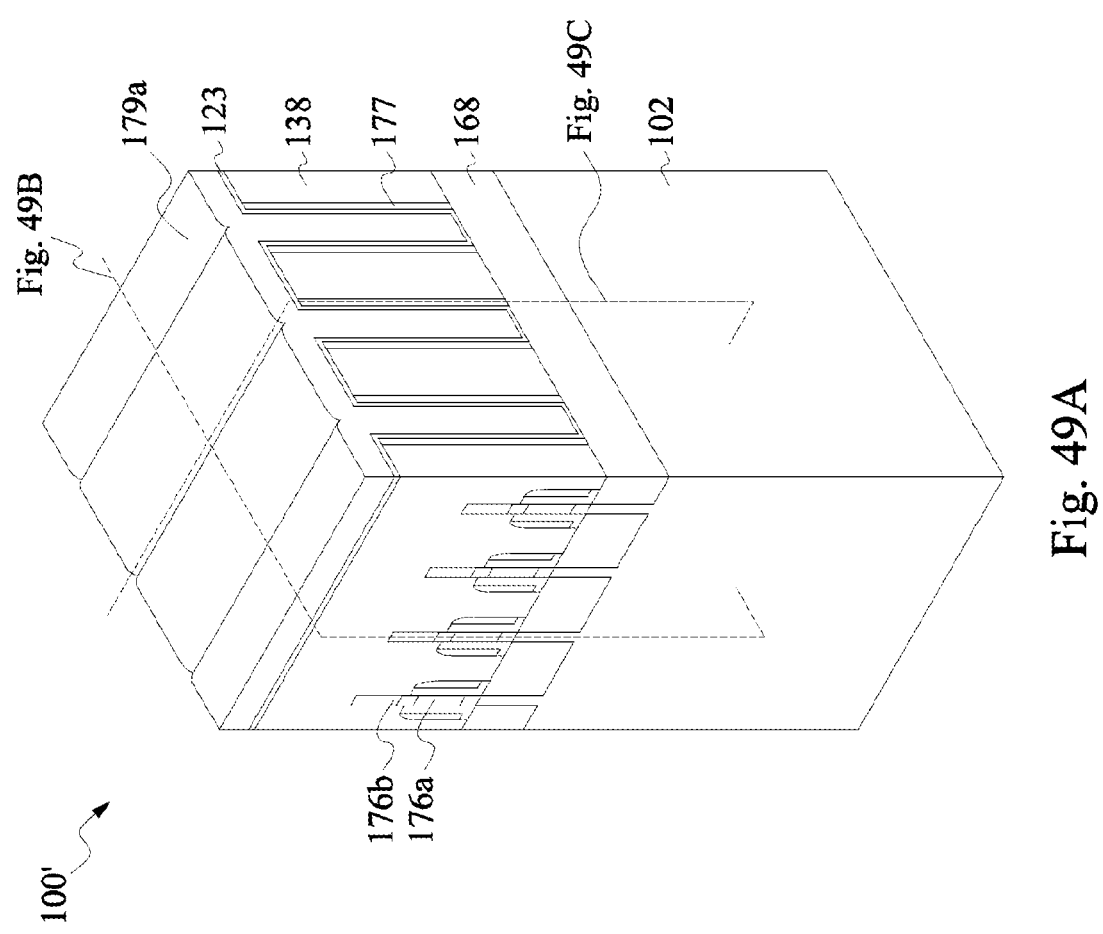

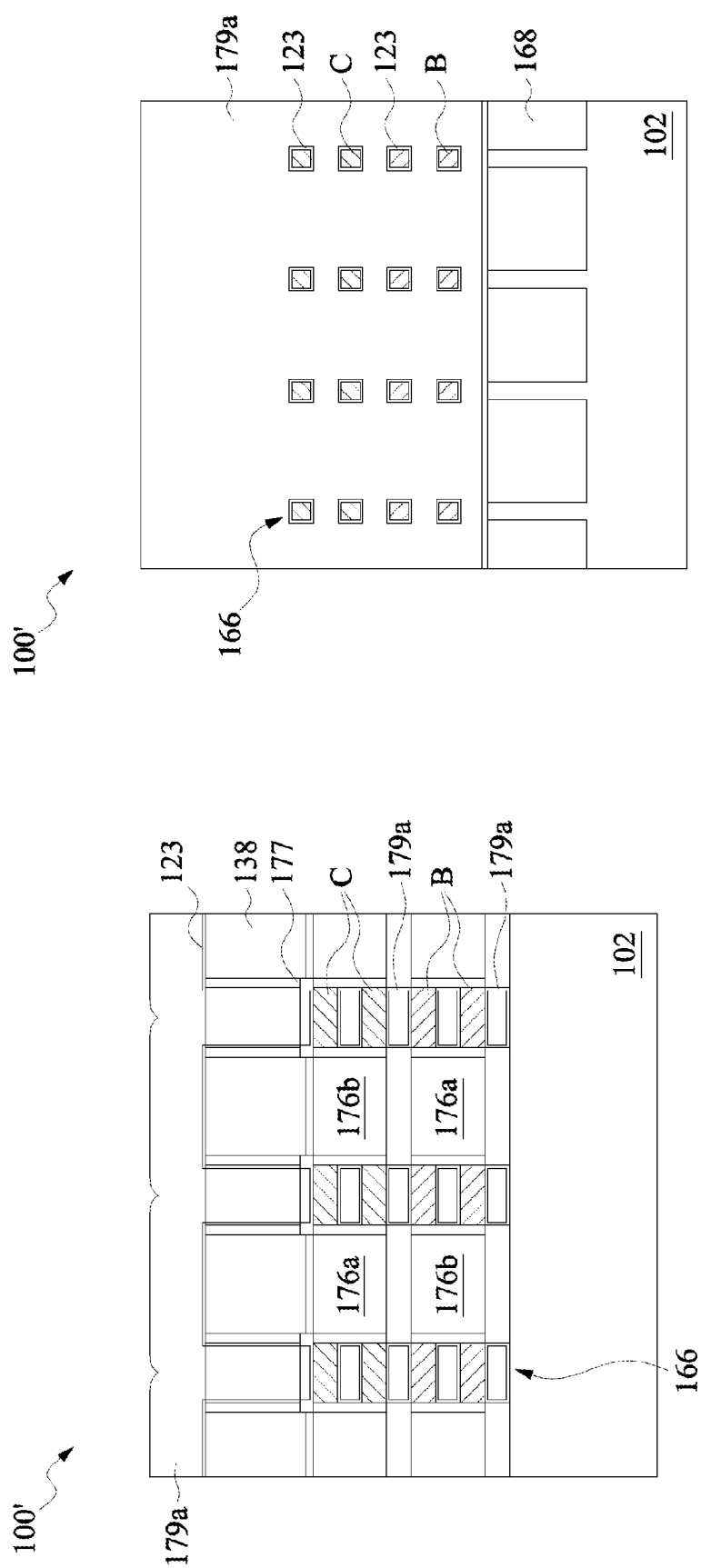

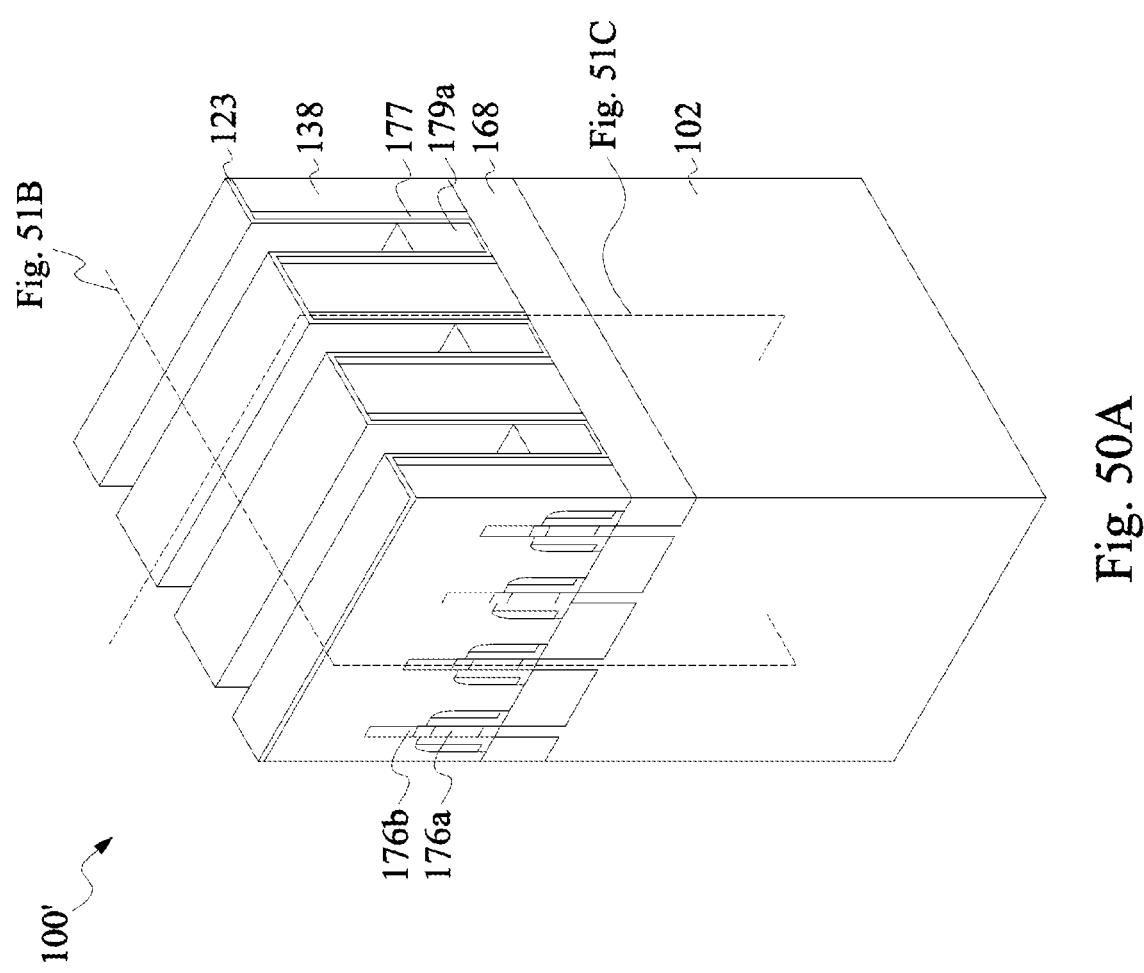

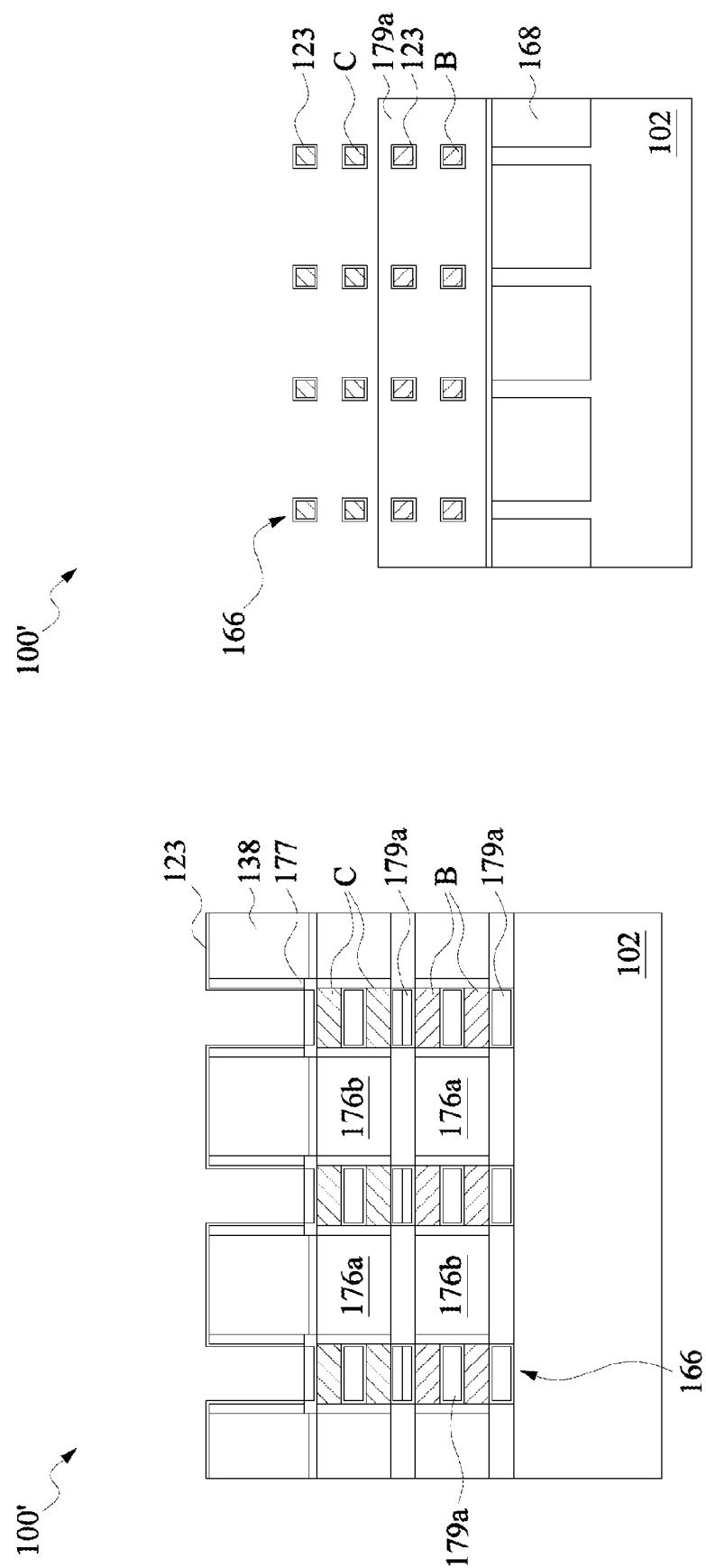

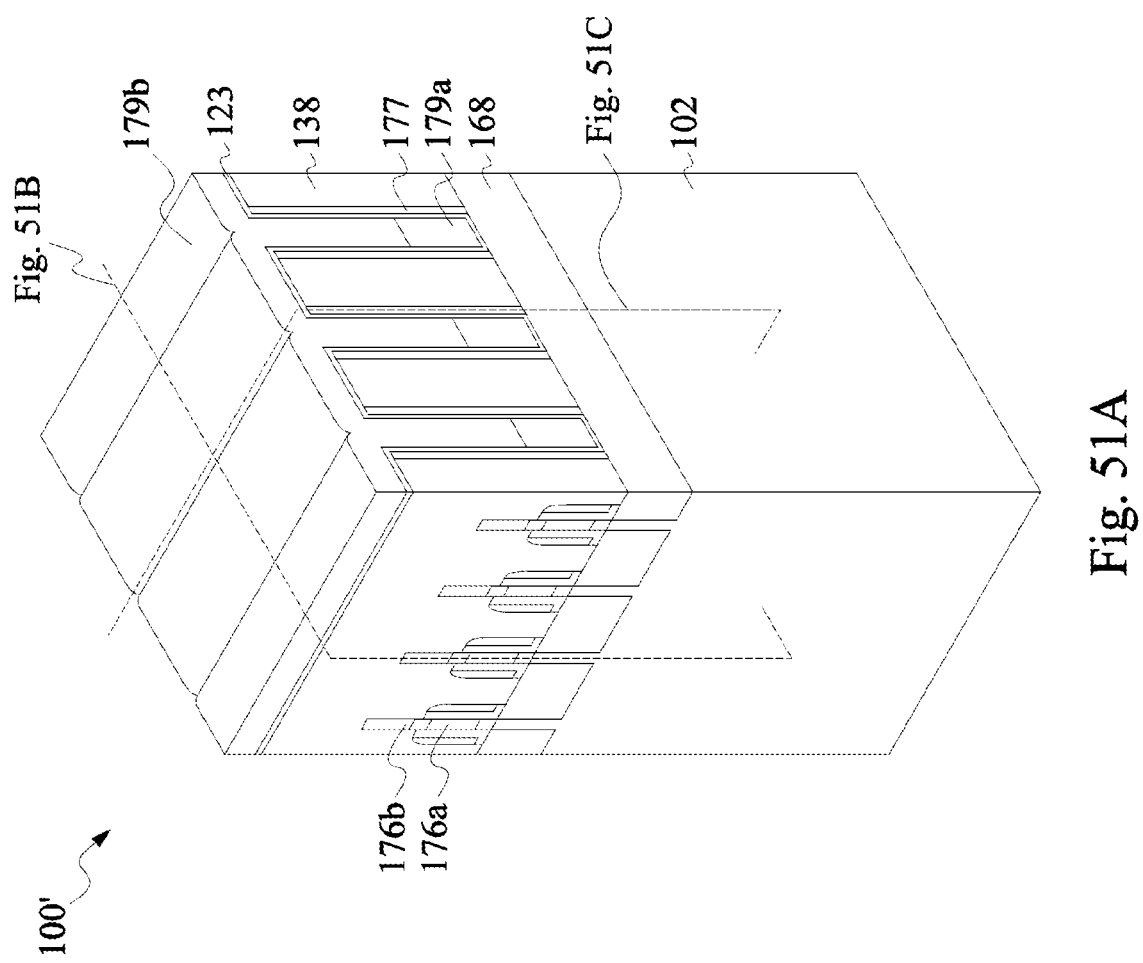

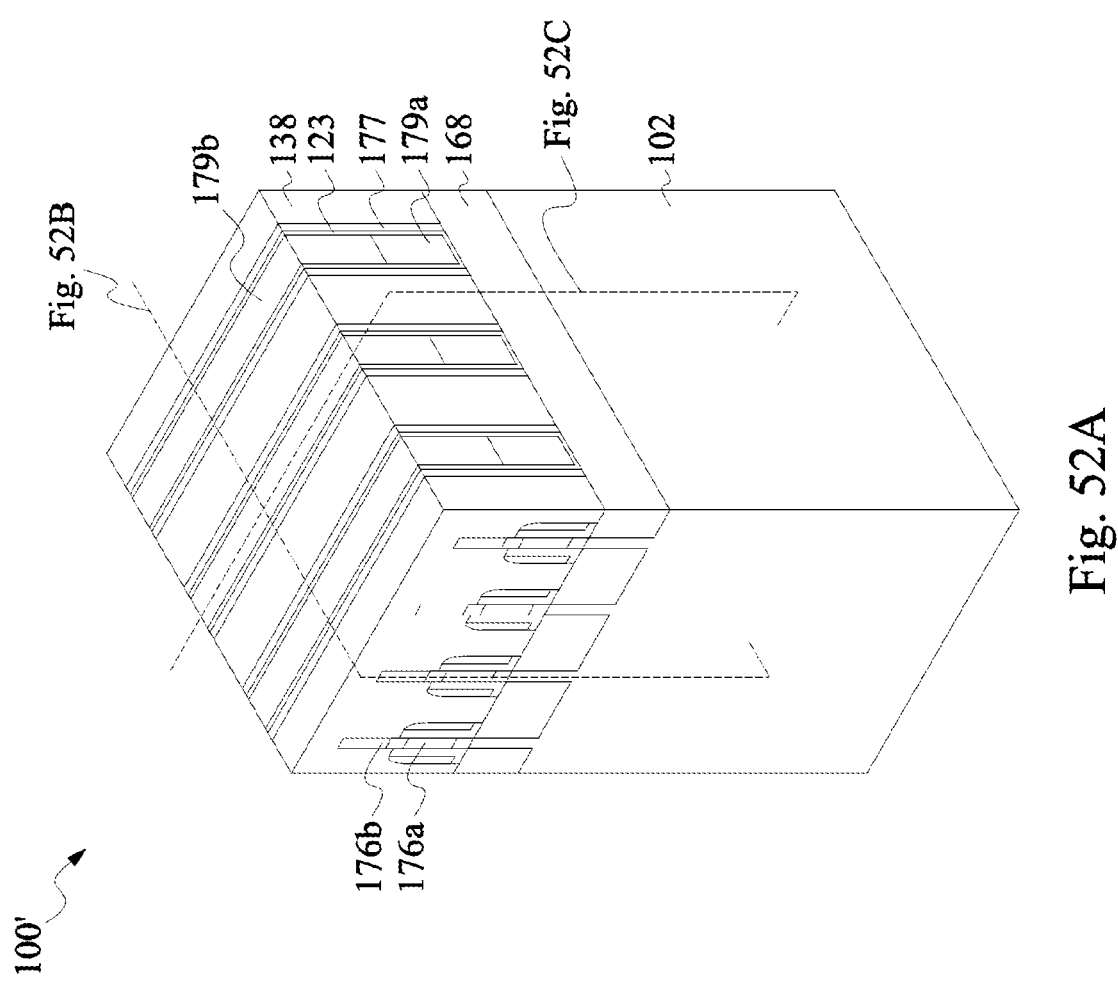

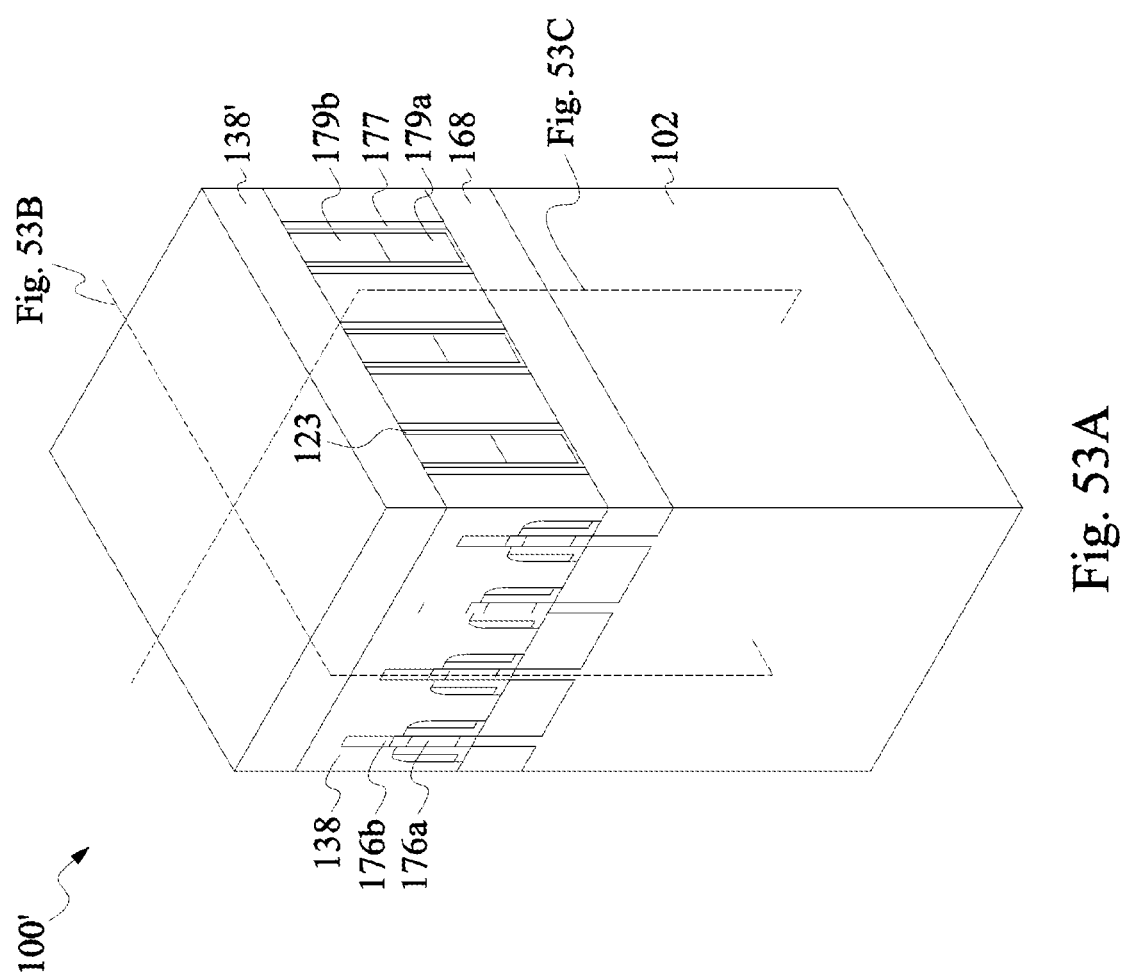

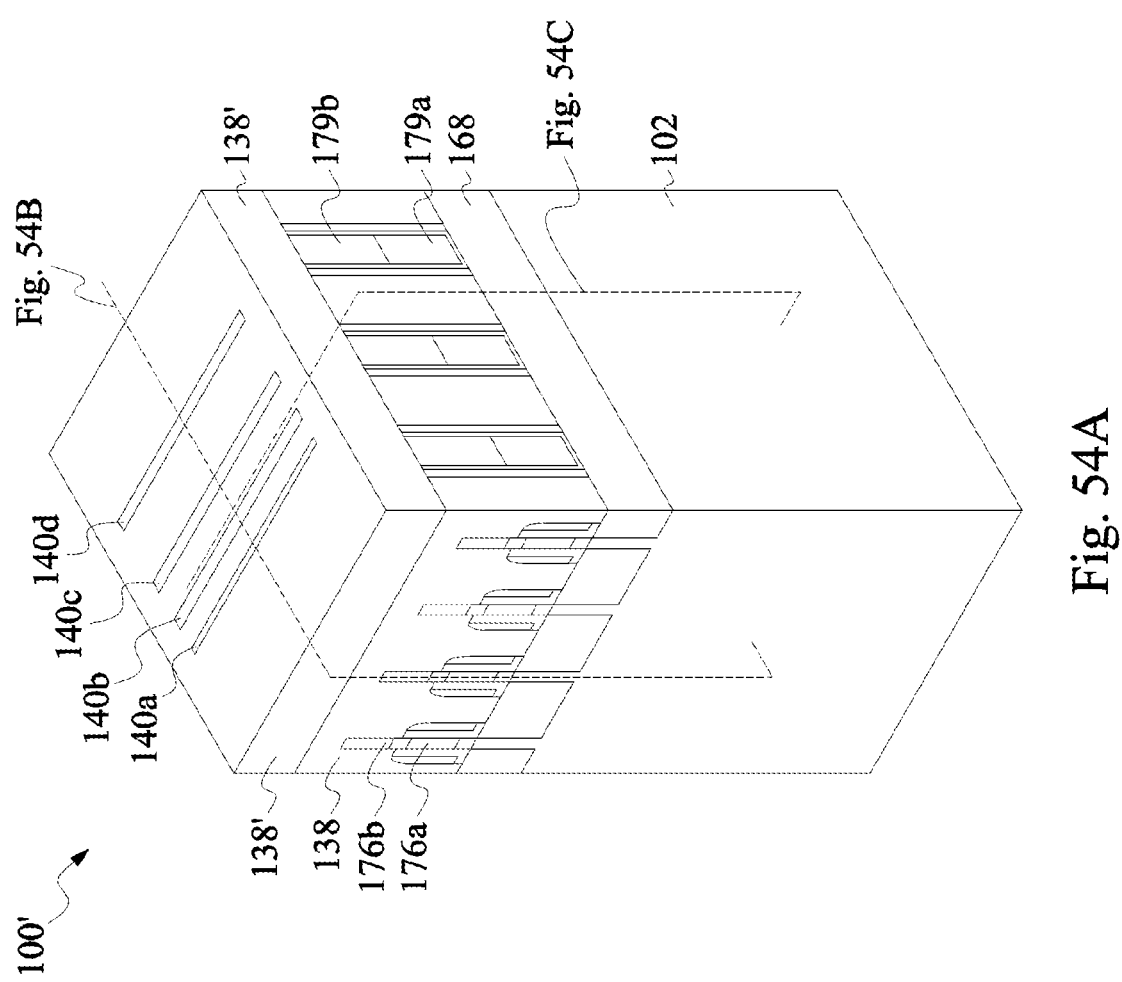

INVERTERS AND MANUFACTURING METHODS THEREOF

PRIORITY CLAIM AND CROSS-REFERENCE

This application is a divisional of, and claims the benefit of, U.S. patent application Ser. No. 14/919,568 filed on Oct. 21, 2015 and entitled, "Inverters and Manufacturing Methods Thereof," which application is a continuation-in-part of, and claims the benefit of, U.S. patent application Ser. No. 14/601,084 filed on Jan. 20, 2015 and entitled, "Semiconductor Devices and Manufacturing Methods Thereof," now U.S. Pat. No. 9,406,697 issued on Aug. 2, 2016, which patent applications are hereby incorporated herein by reference.

BACKGROUND

Semiconductor devices are used in a variety of electronic applications, such as computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is utilized extensively in semiconductor devices. There may be thousands of transistors on a single integrated circuit (IC) in some applications, for example. One common type of transistor used in semiconductor device fabrication is a metal oxide semiconductor field effect transistor (MOSFET). Two transistors may be coupled together to form an inverter.

Multiple gate field-effect transistors (MuGFETs) are a recent development in semiconductor technology which typically are MOSFETs that incorporate more than one gate into a single device. The multiple gates may be controlled by a single gate electrode, where the multiple gate surfaces act electrically as a single gate. The multiple gates may also be controlled by independent gate electrodes. One type of MuGFET is referred to as a fin field effect transistor (FinFET) device, which is a transistor structure with a fin-like semiconductor channel that is raised vertically out of the silicon surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 39 through 42, 43A through 43C, 44A through 44C, 45A through 45C, 46A through 46C, 47A through 47C, 48A through 48C, 49A through 49C, 50A through 50C, 51A through 51C, 52A through 52C, 53A through 53C, and 54A through 54C are perspective and cross-sectional views that illustrate an inverter at various stages of manufacturing in accordance with some embodiments.

DETAILED DESCRIPTION

Figure 1:
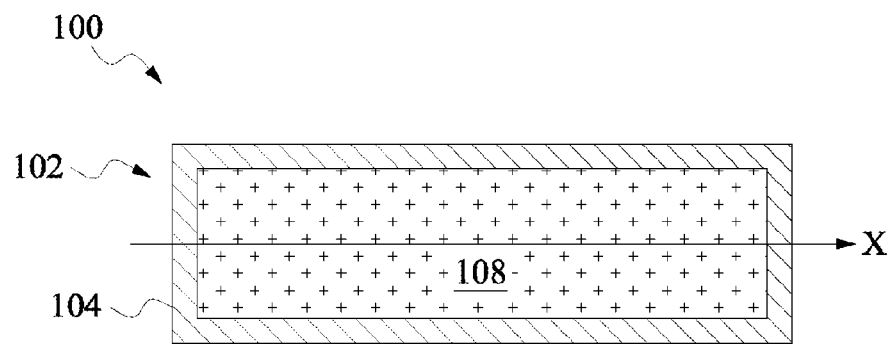
FIGS. 1 through 11 are top views and cross-sectional views that illustrate a method of manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of manufacture thereof are disclosed in the present disclosure, wherein stacked FinFETs are formed that are coupled together and comprise inverters. A junction isolation material or region between sources of the FinFETs is self-aligned. Additional stacked or non-stacked FinFETs may also be formed during the various manufacturing steps and processes for the material layers used to form the stacked FinFET inverters. The inverters comprise stacked NFETs and PFETs that may comprise single channels or multiple channels in some embodiments.

Some embodiments described herein are in reference to a specific context, namely forming fin field effect transistor (FinFET) devices. Aspects of this disclosure may also be applied in other contexts, such as forming other types of devices or semiconductor devices. Specific dimensions given below are for illustrative purposes for a given technology node, such as for about 15 nm technology or smaller. Other embodiments contemplate different dimensions, particularly at different technology nodes. The figures discussed below are not necessarily drawn to scale.

Some embodiments described herein comprise two tunnel FETs (TFETs) comprising FinFETs that are coupled together to form an inverter. The TFETs may comprise single channels or multiple channels. The inverters comprise three-dimensional (3D) stacked nanowire TFET inverters that have high mobility junction isolation in some embodiments.

Figure 2:
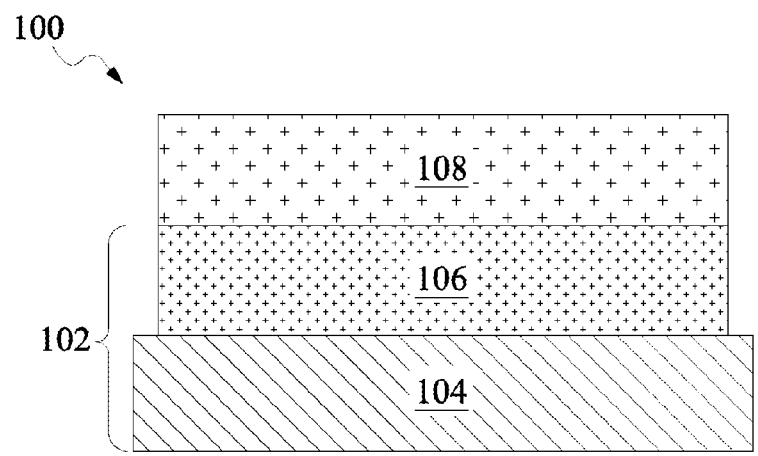
Figure 3:
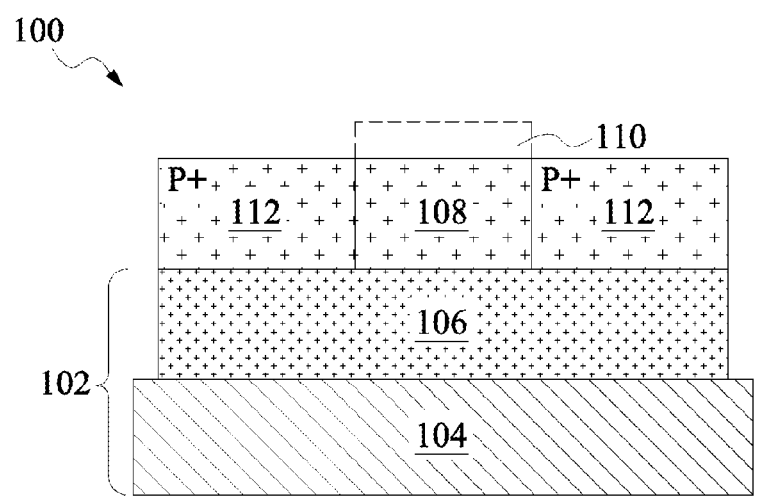
Figure 4:
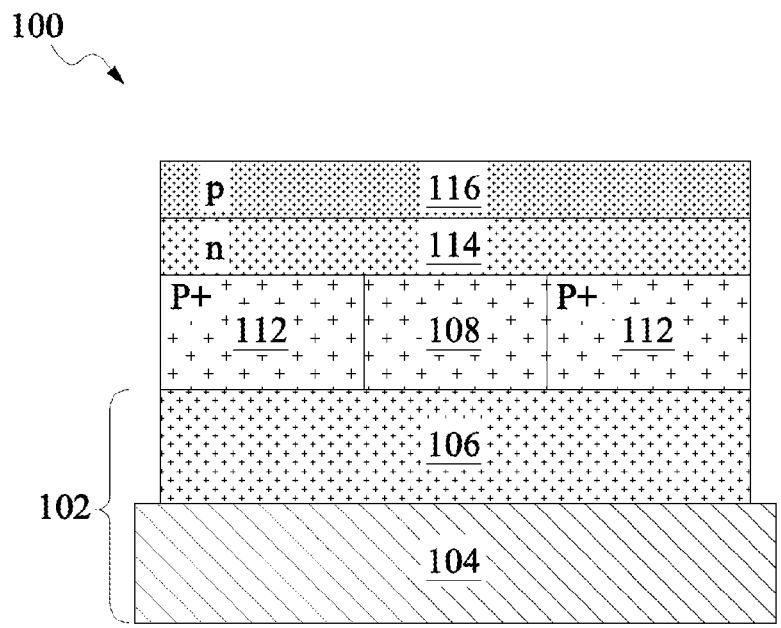
Figure 5:
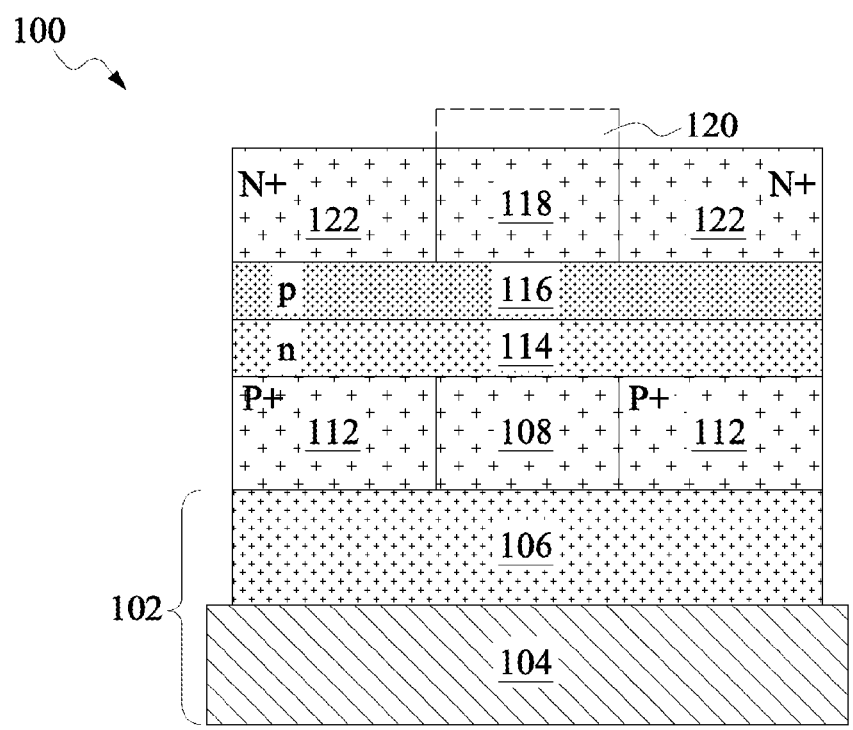
Figure 6:
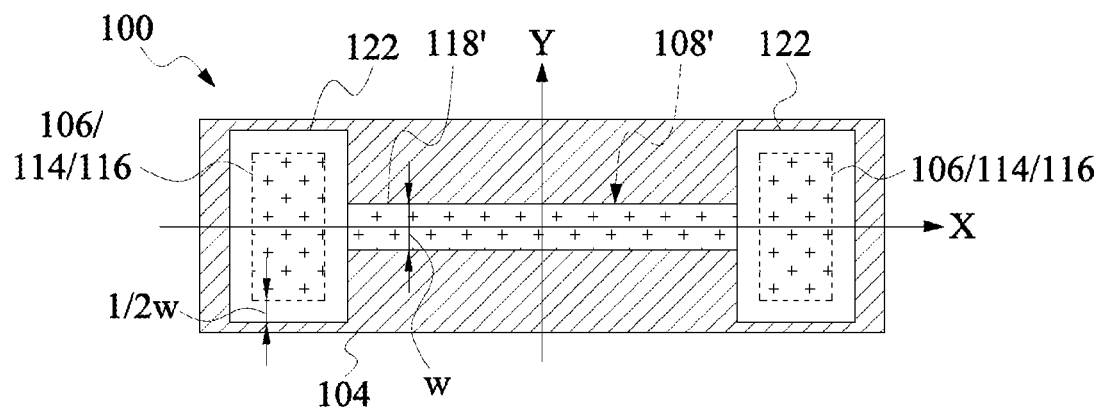
Figure 7:
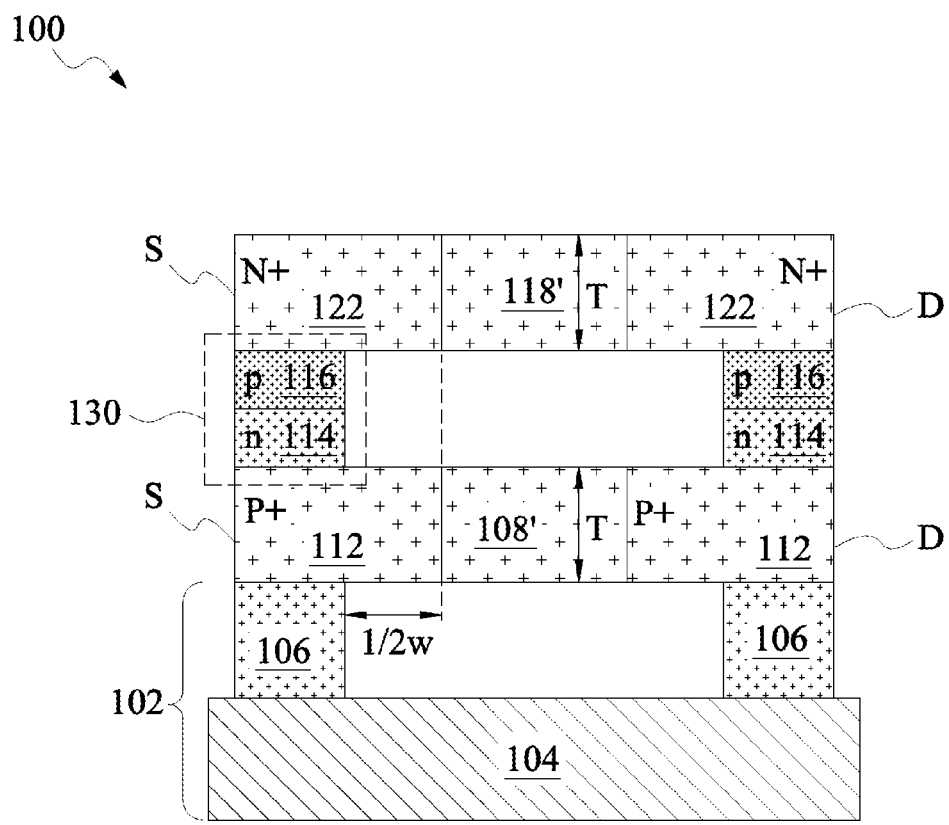
Figures 8, 9:
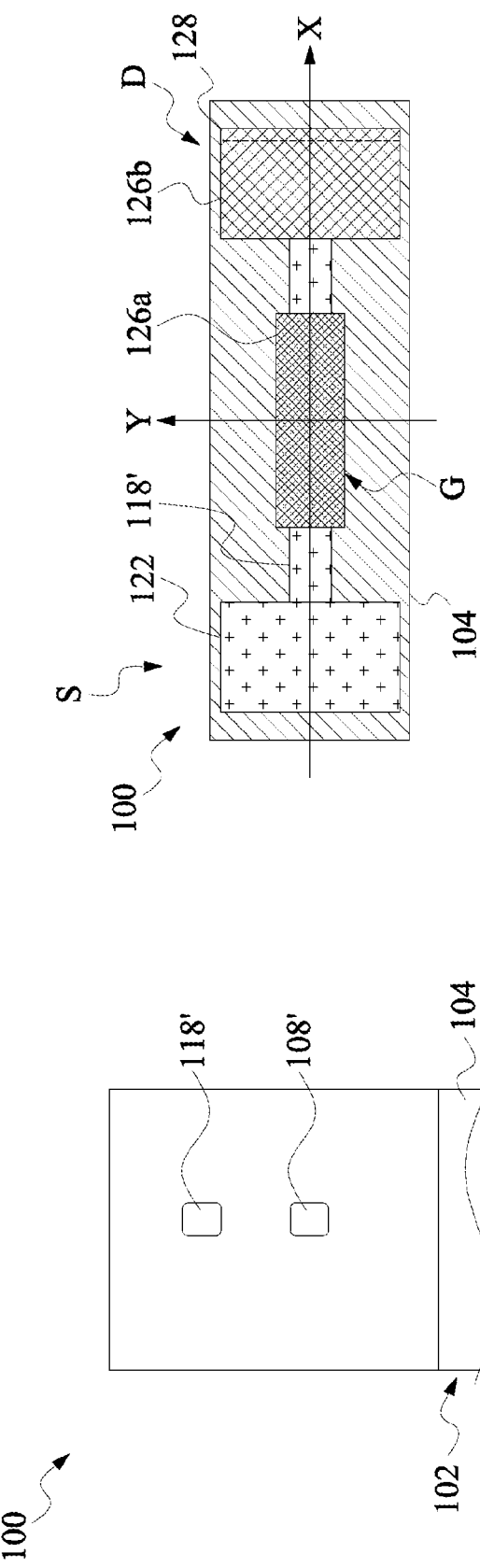
Figure 10:
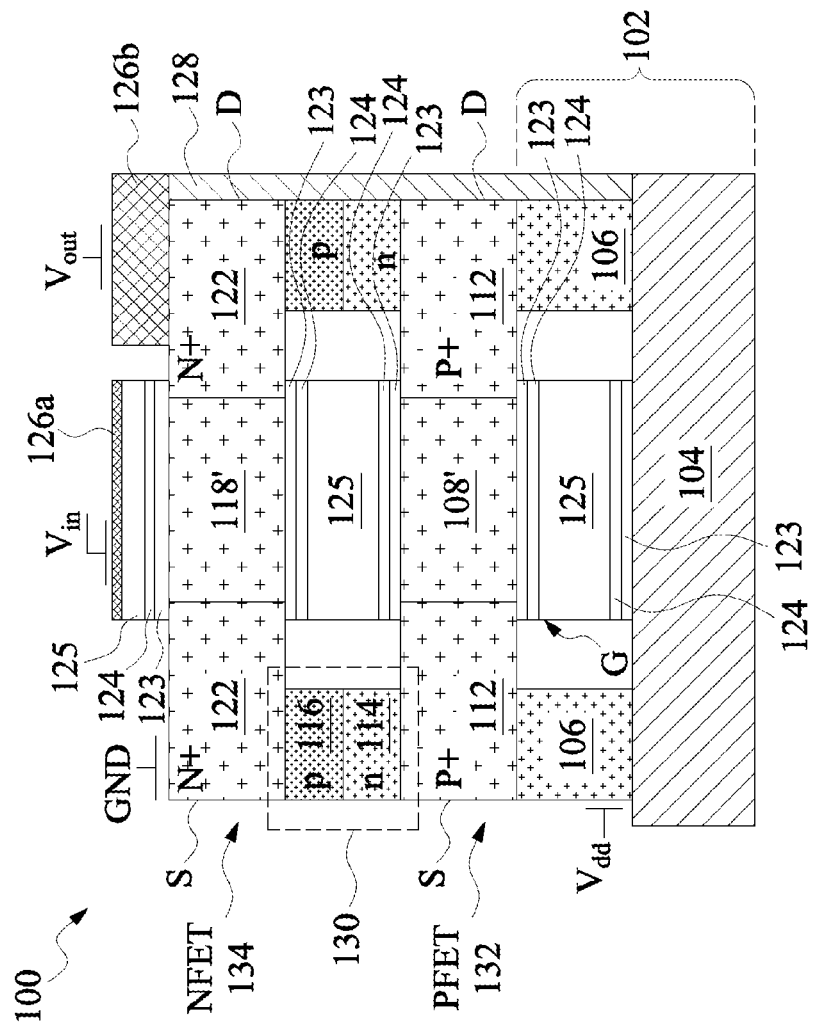
Figure 11:
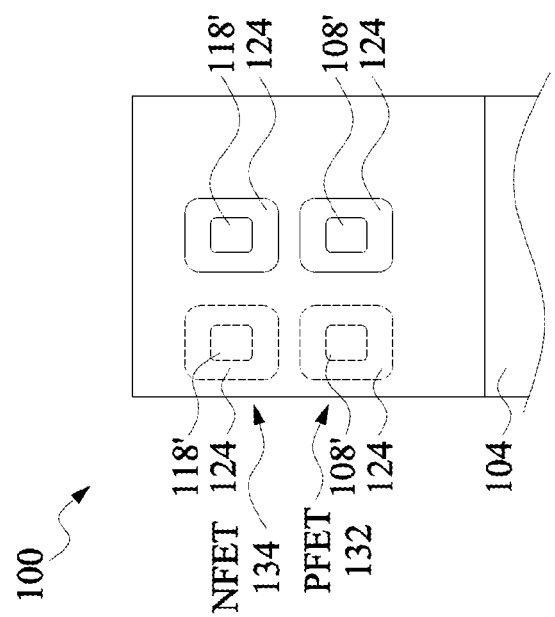

FIGS. 1 through 11 are cross-sectional views and top views that illustrate a method of manufacturing a semiconductor device 100 comprising a three-dimensional (3D) stacked FinFET device at various stages of the manufacturing process in accordance with some embodiments of the present disclosure. In the illustrated embodiments, a stacked FinFET device is formed wherein a negative channel FET (NFET) 134 comprising a FinFET is stacked over a positive channel FET (PFET) 132 comprising a FinFET (see FIG. 10). The PFET 132 materials are first formed over a substrate 102, as shown in FIGS. 1 through 3, and the NFET 134 materials are then formed over the PFET 132 materials, as shown in FIGS. 4 and 5. The PFET 132 materials and NFET 134 materials are then patterned, as shown in FIGS. 6 through 8, and processing of the semiconductor device 100 is continued as shown in FIGS. 9 through 11 to form gate dielectrics, gates, and contacts. In other embodiments, a stacked FinFET device may be formed wherein a PFET is stacked over an NFET.

In the embodiments shown in FIGS. 1 through 11, a cyclic epitaxial growth and implantation process is used. Referring first to FIG. 1, a top view of a semiconductor device 100 is shown. A cross-sectional view along an x plane of the semiconductor device 100 is shown in FIG. 2. To manufacture the semiconductor device 100 in accordance with some embodiments, a substrate 102 is provided. The substrate 102 may be part of a wafer. The substrate 102 may comprise a semiconductor substrate, such as a silicon substrate, a silicon carbon substrate, a silicon germanium substrate, or a substrate formed of other semiconductor materials, as examples. The substrate 102 may comprise a bulk substrate, a semiconductor-on-insulator (SOI) substrate, or other acceptable types of substrates. In some of the embodiments shown in FIGS. 1 and 2, the substrate 102 comprises an SOI substrate comprised of an insulating material 104 comprising an oxide such as silicon dioxide, and a layer of semiconductive material 106 comprising silicon disposed on the insulating material 104. The insulating material 104 comprises a buried oxide (BOX) in some embodiments, for example. The semiconductive material 106 may be lightly doped with a p-type impurity. In the embodiments illustrated, the semiconductive material 106 is doped with a p-type impurity, such as B, Ga, or In to a concentration of about $1\times10^{15}$ cm$^{-3}$ to about $1\times10^{16}$ cm$^{-3}$, as examples. The semiconductive material 106 may also be implanted using other materials to other concentration levels. In other embodiments, e.g., wherein a stacked FinFET device comprises a PFET stacked over an NFET, the semiconductive material 106 may be implanted with an n-type impurity. The insulating material 104 comprises a thickness of about 100 µm to about 500 µm, or about 250 µm to about 350 µm, and the semiconductive material 106 comprises a thickness of about 20 nm to about 50 nm, or about 30 nm to about 40 nm, as examples. The substrate 102 may also comprise other materials and dimensions. A portion of the semiconductor device 100 is shown in the drawings of the present disclosure; the semiconductor device 100 may initially comprise a circular or other shapes in a top view in some embodiments, for example. A plurality of PFETs, NFETs, and other devices is formed across a surface of the semiconductor device 100 in accordance with some embodiments, for example. In other embodiments, the substrate 102 does not comprise an SOI substrate, and the portion of the semiconductor device 100 illustrated in the drawings is formed over shallow trench isolation (STI) regions, BOX regions, or other isolation regions of the substrate 102, as another example.

A first semiconductive material 108 is formed over the semiconductive material 106 of the substrate 102, as illustrated in FIG. 2 in the cross-sectional view. The first semiconductive material 108 is formed using an epitaxial growth process in some embodiments, for example. The first semiconductive material 108 may be formed using metal-organic chemical vapor deposition (MOCVD), molecular beam epitaxy (MBE), liquid phase epitaxy (LPE), vapor phase epitaxy (VPE), selective epitaxial growth (SEG), the like, or a combination thereof. The first semiconductive material 108 comprises SiGe, Ge, GeSn, SiGeSn, or a III-V material in some embodiments, for example. In embodiments wherein the first semiconductive material 108 comprises a III-V material, the first semiconductive material 108 may comprise InAs, AlAs, GaAs, InP, GaN, InGaAs, InAlAs, GaSb, AlSb, AlP, or GaP, as examples. The first semiconductive material 108 comprises a thickness of about 3 nm to about 30 nm, or about 10 nm to about 20 nm in some embodiments, for example. The first semiconductive material 108 is in-situ doped with a desired doping level for channel regions of a PFET 132 in some embodiments, for example. The first semiconductive material 108 may also comprise other materials and dimensions, and may be formed using other methods.

An implantation process is used to implant dopants into portions of the first semiconductive material 108 to form source and drain regions 112 in the first semiconductive material 108, as shown in FIG. 3 in a cross-sectional view. A mask 110 is used in some embodiments to prevent the dopants from entering portions of the first semiconductive material 108, such as channel regions disposed between the source and drain regions 112. The mask 110 comprises a photoresist or other materials, which is deposited over the substrate 102 using a spin-on technique or other methods. The mask 110 is patterned using lithography, leaving the mask 110 shown in phantom (e.g., in dashed lines) in FIG. 3 disposed over regions of the first semiconductive material 108. The implantation process is then performed for the first semiconductive material 108, forming source and drain regions 112 of a first FinFET device. The implanted dopants comprise p-type dopants in the embodiments illustrated. The p-type impurities may comprise B, Ga, or In implanted to a concentration of about $1\times10^{20}$ cm$^{-3}$ to about $5\times10^{21}$ cm$^{-3}$, as examples. The implanted dopants may also comprise n-type dopants, e.g., in other embodiments wherein a stacked FinFET device comprises a PFET stacked over an NFET. The first semiconductive material 108 is doped in the source and drain regions 112 with a same type (i.e., n-type or p-type) of dopant that the semiconductive material 106 of the substrate 102 is doped with in some embodiments. The source and drain regions 112 may also be implanted using other materials to other concentration levels. After the implantation process, the mask 110 may be removed using an acceptable ashing process and/or an etch process. The ashing process may include an oxygen-containing plasma, for example.

The source and drain regions 112 comprise a P+ material in some embodiments, for example. The source and drain regions 112 comprise source (S) and drain (D) regions 112 of a PFET 132 (see FIG. 7), and other portions of the first semiconductive material 108 disposed between the source and drain regions 112 will be used to form channel regions of the PFET 132. The source and drain regions 112 may also comprise an N+ material, e.g., in other embodiments wherein a stacked FinFET device comprises a PFET stacked over an NFET. The first semiconductive material 108 comprises a different material than a material of the semiconductive material 106 of the substrate 102 in some embodiments, for example.

A second semiconductive material 114 is formed over the first semiconductive material 108, as shown in FIG. 4 in a cross-sectional view. The second semiconductive material 114 comprises silicon that is implanted with an n-type dopant in some embodiments. The second semiconductive material 114 may also comprise silicon that is implanted with a p-type dopant, e.g., in other embodiments wherein a stacked FinFET device comprises a PFET stacked over an NFET. The second semiconductive material 114 is doped with a different type (i.e., n-type or p-type) of dopant than source and drain regions 112 within the first semiconductive material 108 are doped with in some embodiments. The second semiconductive material 114 is epitaxially grown with in-situ doping included in the epitaxial growth process in some embodiments, for example. The second semiconductive material 114 is doped an n-type dopant such as P, As, or Sb to a concentration of about $1\times10^{15}$ cm$^{-3}$ to about $1\times10^{16}$ cm$^{-3}$, as examples. The second semiconductive material 114 comprises a thickness of about 10 nm to about 30 nm, or about 15 nm to about 25 nm. The second semiconductive material 114 may also comprise other materials, dimensions, dopants, dopant concentration levels, and formation methods. As other examples, the second semiconductive material 114 may be epitaxially grown or deposited, and an implantation process may be used to dope the second semiconductive material 114.

A third semiconductive material 116 is formed over the second semiconductive material 114, also shown in FIG. 4. The third semiconductive material 116 comprises silicon that is implanted with a p-type dopant in some embodiments. The third semiconductive material 116 may also comprise silicon that is implanted with an n-type dopant, e.g., in other embodiments wherein a stacked FinFET device comprises a PFET stacked over an NFET. The third semiconductive material 116 is doped with a different type (i.e., n-type or p-type) of dopant than the second semiconductive material 114 is doped with in some embodiments. The third semiconductive material 116 is epitaxially grown with in-situ doping included in the epitaxial growth process, for example. The third semiconductive material 116 is doped with a p-type dopant such as B, Ga, or In to a concentration of about $1\times10^{15}$ cm$^{-3}$ to about $1\times10^{16}$ cm$^{-3}$, as examples. The third semiconductive material 116 comprises a thickness of about 10 nm to about 30 nm, or about 15 nm to about 25 nm. The third semiconductive material 116 may also comprise other materials, dimensions, dopants, dopant concentration levels, and formation methods. As other examples, the third semiconductive material 116 may be epitaxially grown or deposited, and an implantation process may be used to dope the third semiconductive material 116.

The second semiconductive material 114 and the third semiconductive material 116 are later patterned to form a junction isolation material 130 (see FIG. 7) in some embodiments that is advantageously self-aligned, to be described further herein.

A fourth semiconductive material 118 is then formed over the third semiconductive material 116 using an epitaxial growth process, as illustrated in FIG. 5 in a cross-sectional view. As deposited, the fourth semiconductive material 118 comprises similar materials and dimensions as described for the first semiconductive material 108. The fourth semiconductive material 118 is in-situ doped with a desired doping level for channel regions of an NFET 134 in some embodiments, for example. A mask 120 (shown in phantom in FIG. 5) similar to the mask 110 used to implant dopants into source and drain regions 112 formed within the first semiconductive material 108 is deposited over the fourth semiconductive material 118. An implantation process is then used to implant dopants into the fourth semiconductive material 118 and form source and drain regions 122 in the fourth semiconductive material 118. The dopants implanted into the fourth semiconductive material 118 comprise a different type (i.e., p-type or n-type) than the dopants implanted into the first semiconductive material 108.

The fourth semiconductive material 118 is implanted with an n-type dopant in some embodiments to form the source and drain regions 122. The fourth semiconductive material 118 may also be implanted with a p-type dopant, e.g., in other embodiments wherein a stacked FinFET device comprises a PFET stacked over an NFET. The fourth semiconductive material 118 is doped with a different type (i.e., n-type or p-type) of dopant than the source and drain regions 112 within the first semiconductive material 108 are doped with in some embodiments. The fourth semiconductive material 118 is also doped with a different type (i.e., n-type or p-type) of dopant than the third semiconductive material 116 is doped with in some embodiments. The fourth semiconductive material 114 is doped with an n-type dopant such as P, As, or Sb to a concentration of about $1\times10^{20}$ cm$^{-3}$ to about $1\times10^{21}$ cm$^{-3}$, as examples. The fourth semiconductive material 118 may also be implanted with other dopants in other dopant concentration levels.

The source and drain regions 122 comprise an N+ material in some embodiments, for example. The source and drain regions 122 comprise source (S) and drain (D) regions 122 of an NFET 134 (see FIG. 10), and other portions of the fourth semiconductive material 118 disposed between the source and drain regions 122 will be used to form channel regions of the NFET 134. The source and drain regions 122 may also comprise a P+ material, e.g., in other embodiments wherein a stacked FinFET device comprises a PFET stacked over an NFET. After the implantation process used to dope the fourth semiconductive material 118 to form the source and drain regions 122, the mask 120 is removed using an ashing process and/or etch process.

After the implantation process used to dope the fourth semiconductive material 118 to form the source and drain regions 122, and/or after the implantation process used to dope the first semiconductive material 108 to form the source and drain regions 112, the implanted dopants are then activated, e.g., by heating the semiconductor device 100 to a predetermined temperature for a predetermined period of time.

The semiconductor device 100 is then patterned using lithography to form channel regions 108' and 118' comprised of the first semiconductive material 108 and the fourth semiconductive material 118, respectively, as illustrated in a top view in FIG. 6, a cross-sectional x plane view in FIG. 7, and a cross-sectional y plane view in FIG. 8. Portions of the first semiconductive material 108 after the patterning process comprise channel regions 108', and portions of the second semiconductive material 118 after the patterning process comprise channel regions 118'. The source and drain regions 112 and 122 are also defined during the patterning process for the channel regions 108' and 118'. The shapes of the source (S) and drain (D) regions 112 and 122 are defined in the patterning process, for example.

A masking material such as a photoresist, not shown, is deposited over the fourth semiconductive material 118, and the masking material is patterned with a desired shape of channel regions 108' and 118' and source (S) and drain (D) regions 112 and 122 of the PFET 132 and the NFET 134 (see FIG. 10), respectively. The patterning process is performed using a suitable etch process, such as a reactive ion etch (RIE), a neutral beam etch (NBE), tetramethyalammonium hydroxide (TMAH), ammonium hydroxide ($NH_4OH$), a wet etchant capable of etching silicon with good etch selectivity between silicon and a material of the insulating material 104, the like, or a combination thereof, using the masking material as an etch mask. The etch process may be anisotropic or isotropic and may comprise a selective etch process, as examples. The etch process used to form the channel regions 108' and 118' and source (S) and drain (D) regions 112 and 122 of the PFET 132 and the NFET 134 may also comprise other types of etch processes and properties. The masking material is then removed using an ashing process and/or etch process.

A width of the channel regions 108' and 118' comprise a dimension W, wherein dimension W comprises about 5 nm to about 50, or about 10 nm to about 30 nm in some embodiments, as shown in the top view in FIG. 6. A thickness of the channel regions 108' and 118' comprise a dimension T (see FIG. 7), wherein dimension T comprises a thickness of the first semiconductive material 108 and the fourth semiconductive material 118. Dimension T comprises about 3 nm to about 30 nm, or about 10 nm to about 20 nm in some embodiments, for example. Dimensions W and T may also comprise other values. Channel region 108' is disposed beneath channel region 118', as illustrated in the x plane view in FIG. 7 and in the y plane view in FIG. 8. The channel regions 108' and 118' may comprise substantially square or rectangular shapes in the cross-sectional y plane view shown in FIG. 8. The channel regions 108' and 118' may also comprise substantially square or rectangular shapes with rounded corners, as a result of the etch process used to pattern the first and fourth semiconductive materials 108 and 118.

The channel regions 108' and 118' comprise single channels in the embodiments shown in FIG. 1 through 10. Either one of the channel regions 108' and 108', or both, may comprise multiple channels formed in the horizontal direction (see FIG. 11) or in the vertical direction (see FIGS. 32 and 33).

The semiconductive material 106 of the substrate 102, the second semiconductive material 114, and the third semiconductive material 116 etch at a faster rate than the first and fourth semiconductive materials 108 and 118 during the etch process in some embodiments, so that the semiconductive material 106, the second semiconductive material 114, and the third semiconductive material 116 comprise an undercut beneath and/or above the first and fourth semiconductive materials 108 and 118, as illustrated in FIGS. 6 and 7. A selective etch process may be used that forms a predetermined amount of undercut beneath and above the source (S) and drain (D) regions 112 and 122. The amount of the undercut comprises about ½ of dimension W, or about (½*W) in some embodiments. The amount of the undercut may also comprise other values and relative values to the width of the channel regions 108' and 118' comprising dimension W. The undercut may be formed on one or more sides of the semiconductive material 106, the second semiconductive material 114, and the third semiconductive material 116.

A gate dielectric 123 and a gate material 124/125 are formed around each of the channel regions 108' and 118', and contacts 126a that are coupled to the gates (G) 124/125 and contacts 126b that are coupled to drain (D) regions 112 and 122 of the PFET 132 and the NFET 134 are formed, as shown in FIG. 9 in a top view, in FIG. 10 in a cross-sectional x plane view, and in FIG. 11 in a cross-sectional y plane view of the semiconductor device 100. The gate dielectrics 123 and gates 124/125 comprise a gate all around (GAA) structure around the channel regions 108' and 118' in some embodiments, for example.

The gate dielectrics 123 may comprise $SiO_2$, $Al_2O_3$, $ZrO_2$, $HfO_2$, $TiO_2$, or a combination or multiple layers thereof, as examples. The gate dielectrics 123 may comprise a material having a dielectric constant or k value of greater than a dielectric constant of $SiO_2$ in some embodiments, such as greater than about 3.9. The gate dielectrics 123 may be formed using a deposition process such as atomic layer deposition (ALD), plasma-enhanced ALD (PEALD), CVD, plasma-enhanced CVD (PECVD), an oxidation process, or a combination thereof, as examples. The gate dielectrics 123 may comprise a thickness of about 1 nm to about 3 nm, such as about 2 nm, as examples. The gate dielectrics 123 of the PFET 132 and NFET 134 may also comprise other materials and dimensions and may be formed using other methods.

The gates (G) 124/125 comprise a first gate material 124 and a second gate material 125 in some embodiments. The first gate material 124 may comprise TiN or TiSiN having a thickness of about 0.5 nm to about 3 nm, such as about 1 nm to about 2 nm, formed by PVD or ALD, for example. The first gate material 124 is formed around the gate dielectric 123 disposed on the channel regions 108' and 118'. The second gate material 125 is formed over the first gate material 124 and may comprise TiAl, TaAl, TiAlC, TaAlC, W, Co, WAl, CoAl, TiN, TaN, WSi, or a combination or multiple layers thereof, as examples. The second gate 125 material may be formed using a deposition process such as PVD or ALD. The second gate material 125 comprises a metal gate (MG) filling in some embodiments, for example. The overall width and thickness of the gates (G) 124/125 may vary as a function of the height and length of the channel regions 108' and 118' and overall semiconductor device 100, for example. The gates (G) 124/125 of the PFET 132 and NFET 134 may also comprise other materials and dimensions and may be formed using other methods.

Note that the gate dielectric 123 shown in FIG. 10 is not shown in other drawings of the present disclosure, in order to simplify the drawings, such as in FIGS. 13, 16, 17, 24, 26, and 32, as examples. However, the gate dielectric 123 is also disposed around the channel regions 108' and 118' of the FinFETs 132 and 134 beneath the gate 124/125 material in the embodiments shown in FIGS. 13, 16, 17, 24, 26, and 32.

The gate dielectric 123 material and the gate (G) 124/125 materials are formed or deposited, and are then patterned using photolithography, by depositing a photoresist (not shown), patterning the photoresist, and using an etch process to pattern the gate dielectric 123 material and the gate (G) 124/125 material using the photoresist as an etch mask, leaving the gate dielectrics 123 material and the gates (G) 124/125 disposed around the channel regions 108' and 118' in desired locations. The photoresist is then removed. The contacts 126a and 126b are then formed by depositing a contact material such as W, $WSi_x$, Al, $AlSi_x$, Cu, or a combination or multiple layers thereof, having a thickness of about 5 nm to about 50 nm, such as about 15 nm to 40 nm, and patterning the contact material using photolithography. The contacts 126a and 126b may comprise a diameter or width in a top view of about 3 nm to about 15 nm, or other dimensions, as examples. A side contact 128 may be formed in the photolithography process that makes electrical connection to the drain (D) regions 112 and 122 of the PFET 132 and NFET 134, respectively, in some embodiments. In some embodiments, a single photolithography process may be used to pattern and form the contacts 126a, 126b, side contacts 128, gates 124/125, and gate dielectrics 123, for example.

The PFET 132 is also referred to herein, e.g., in some of the claims, as a first FinFET 132, and the NFET 134 is also referred to as a second FinFET 134.

FIG. 10 also illustrates electrical connections of the PFET 132 and NFET 134 in some embodiments wherein the PFET 132 and NFET 134 are coupled together and utilized as an inverter. Gates (G) 124/125 of the PFET 132 and NFET 134 are coupled together by the second gate material 125, and drains (D) 112 and 122 of the PFET 132 and NFET 134 are coupled together by a side contact 128 or other types of contacts. Coupling of the gates (G) 124 and the drains (D) 112 and 122 of the first and second FinFETs 132 and 134 forms an inverter in some embodiments.

The semiconductor device 100 shown in FIG. 10 comprises a 3D stacked FinFET complementary metal oxide semiconductor (CMOS) inverter in some embodiments, for example. A junction isolation material or region 130 of the semiconductor device 100 is advantageously self-aligned due to the structure and manufacturing method. The second semiconductive material 114 comprising the n-type material and the third semiconductive material 116 comprising the p-type material are patterned in the same patterning process used to form the PFET 132 and NFET 134 sources (S) 112 and 122, drains (D) 112 and 122, and channel regions 108' and 118', and thus, the junction isolation material or region 130 is self-aligned to the PFET 132 and the NFET 134, for example.

To electrically connect the inverter to a device outside the semiconductor device 100 or to another device disposed on the semiconductor device 100, as examples, a source (S) 112 of the PFET 132 is coupled to a voltage supply (Vdd) contact via a portion of the semiconductive material 106 of the substrate 102. The source (S) 122 of the NFET 134 is coupled to a ground (GND) contact. The gates (G) 124/125 of the PFET 132 and NFET 134 are coupled to a voltage input (Vin) contact. The drains (D) 112 and 122 of the PFET 132 and the NFET 134, respectively, are coupled to a voltage output (Vout) contact. The ground (GND) contact and the voltage supply (Vdd) contact are not shown in FIG. 10; see the embodiments shown in FIG. 13, which will be described further herein.

The cross-sectional y plane view of the semiconductor device 100 shown in FIG. 11 also illustrates that the channel regions 108' and/or 118' of the PFET 132 and the NFET 134 may comprise multiple channels 108' and 118', respectively.

The first semiconductive material 108 and/or the fourth semiconductive material 118 may be patterned to include two or more channels 108' and/or 118' in a horizontal direction, as shown in the cross-sectional view in phantom.

Figure 12:
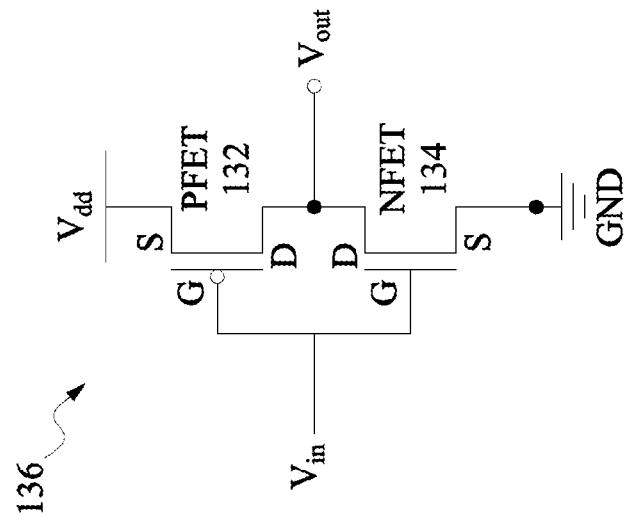
FIG. 12 is a schematic of a semiconductor device in accordance with some embodiments.

FIG. 12 is a schematic 136 of a semiconductor device 100 in accordance with some embodiments. The semiconductor device 100 comprises an inverter that includes a PFET 132 FinFET and an NFET 134 FinFET, as illustrated in FIGS. 9, 10, and 11. Electrical connections shown and described with reference to the cross-sectional view of the semiconductor device 100 shown in FIG. 10 are illustrated in the schematic 136. The schematic 136 of the semiconductor device 100 may also comprise other configurations.

Figure 13:
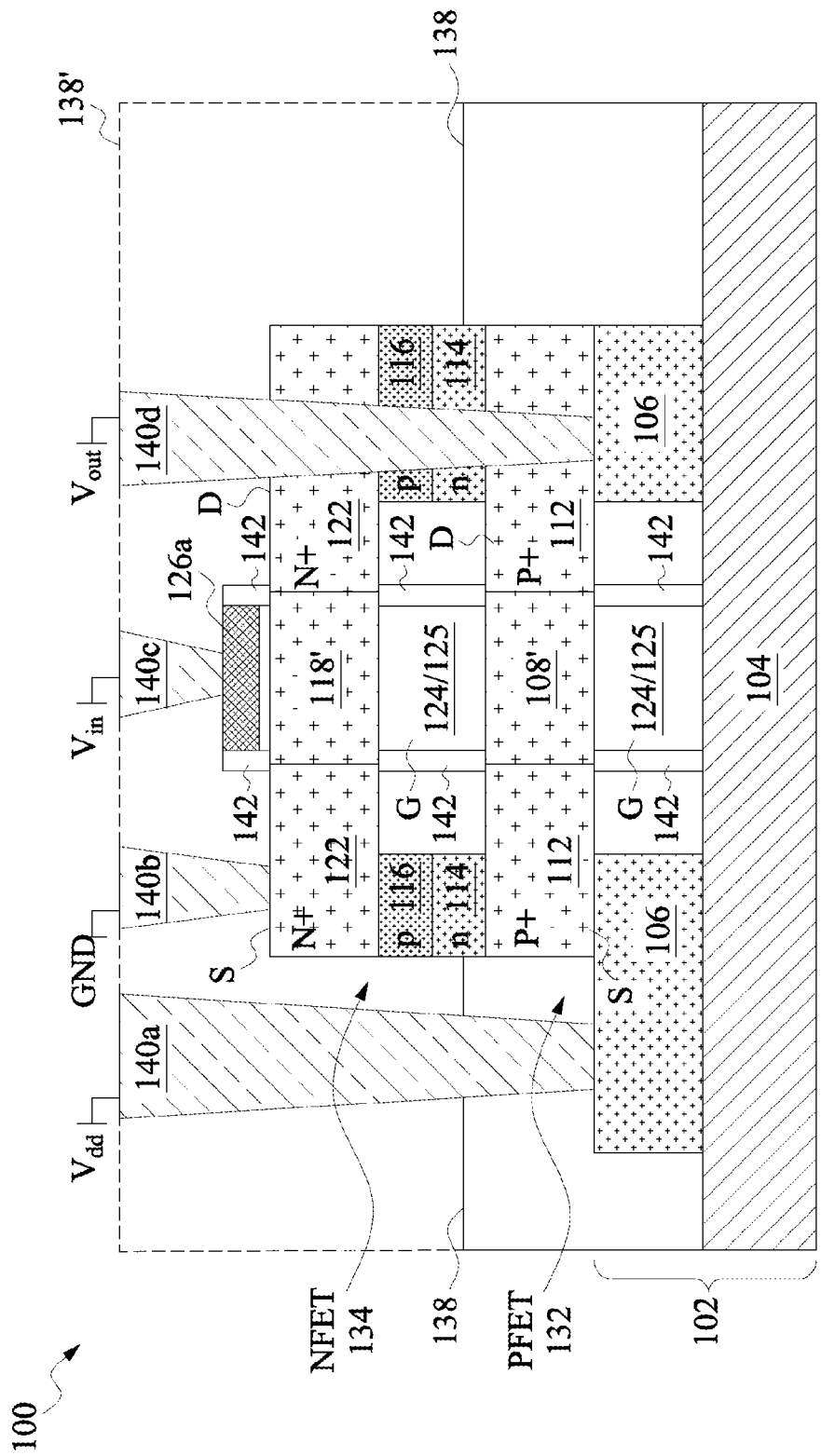
FIG. 13 shows a cross-sectional view of a semiconductor device in accordance with some embodiments.

FIG. 13 is a cross-sectional view of a semiconductor device 100 in accordance with some embodiments. Additional elements of a semiconductor device 100 in accordance with some embodiments are illustrated in FIG. 13. Insulating material 138 comprises an isolation oxide which is disposed over the substrate 102 before or after the formation of the FinFETs 132 and 134. The insulating material 138 may comprise $SiO_2$, SiON, or other oxide materials having a thickness of about 20 nm to 100 nm, such as about 40 nm to about 60 nm. The insulating material 138 may also comprise other materials and dimensions. The insulating material 138 may be deposited over the substrate 102 before the first semiconductive material 108 is formed, and the insulating material 138 may be patterned using lithography. The first semiconductive material 108 is then epitaxially grown through the patterned insulating material 138, for example. The insulating material 138 may also be deposited after the FinFETs 132 and 134 are formed.

Additional insulating material(s) 138' may be formed over insulating material 138, also shown in FIG. 13 in phantom. The insulating material(s) 138' may comprise one or more inter-layer dielectric (ILD) materials in some embodiments, for example, and may comprise similar materials and dimensions as described for insulating material 138. Contacts 140a, 140b, 140c, and 140d are formed within the insulating materials 138' and 138 using a damascene process, by patterning the insulating materials 138' and 138 with a desired pattern for the contacts 140a, 140b, 140c, and 140d, and filling the patterned insulating materials 138' and 138 with a conductive material. Excess portions of the conductive material are then removed from over the insulating material 138' using a chemical-mechanical polishing (CMP) process and/or etch process. The contacts 140a, 140b, 140c, and 140d may comprise a similar material as described for contacts 126a and 126b, such as W, $WSi_x$, Al, $AlSi_x$, Cu, or a combination or multiple layers thereof, having a diameter in a top view of about 3 nm to about 15 nm, or other dimensions, as examples. Additional metallization layers that include conductive lines, vias, and underball metallization (UBM) layers may be subsequently formed over the insulating material 138', not shown.

The contacts 140a, 140b, 140c, and 140d make electrical connections to various portions of the semiconductor device 100 comprising a stacked FinFET inverter. Contact 140a comprises a voltage supply (Vdd) contact and is coupled to the source (S) 112 of the PFET 132 by a portion of the semiconductive material 106 of the substrate. Contact 140b comprises a ground (GND) contact and is coupled to the source (S) 122 of the NFET 134. Contact 140c comprises a voltage input (Vin) contact and is coupled to a contact 126a coupled to the gates (G) 124/125 of the PFET 132 and the NFET 134. Contact 140d is coupled to the drains (D) 112 and 122 of the PFET 132 and the NFET 134, and illustrates another method of making electrical connection to the drains (D) 112 and 122 other than the side contact 128 shown in FIG. 10. The contacts 140a, 140b, 140c, and 140d comprise plug contacts that are formed in subsequently deposited insulating material 138' and other material layers of the semiconductor device 100.

FIG. 13 also illustrates a sidewall spacer 142 that is disposed on sidewalls of the gates (G) 124/125 in accordance with some embodiments. The sidewall spacer 142 is formed after the gates (G) 124/125 are formed in some embodiments, by depositing the sidewall spacer 142 material, and anisotropically etching the material using a dry RIE process or other etch process, leaving the sidewall spacers 142 on sidewalls of the gates (G) 124/125. The sidewall spacers 142 may comprise $SiO_2$, $Si_3N_4$, or SiCN having a thickness of about 1 nm to about 10 nm, or about 3 nm to about 7 nm, for example. The sidewall spacers 142 may also comprise other materials, dimensions, and formation methods. The sidewall spacers 142 may prevent shorting of the gates (G) 124/125 to the sources and drains 112 and 122, for example. The sidewall spacers 142 may also be included in the other embodiments described herein, although the sidewall spacers 142 are not shown in the other figures.

In FIGS. 1 through 11, a method of forming a 3D stacked FinFET CMOS inverter using multiple cyclic epitaxial growth and implantation processes is illustrated in accordance with some embodiments. In other embodiments, implantation of the various dopant materials may be made after the epitaxial layers are formed.

Figure 14:
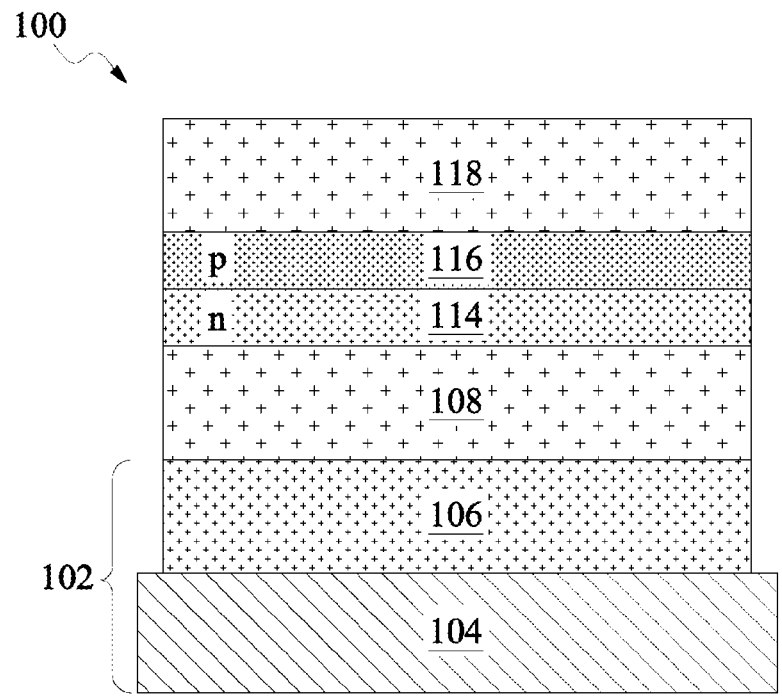
FIGS. 14 through 18 are cross-sectional views and a top view that illustrate a method of manufacturing a semiconductor device at various stages in accordance with some embodiments.
Figure 15:
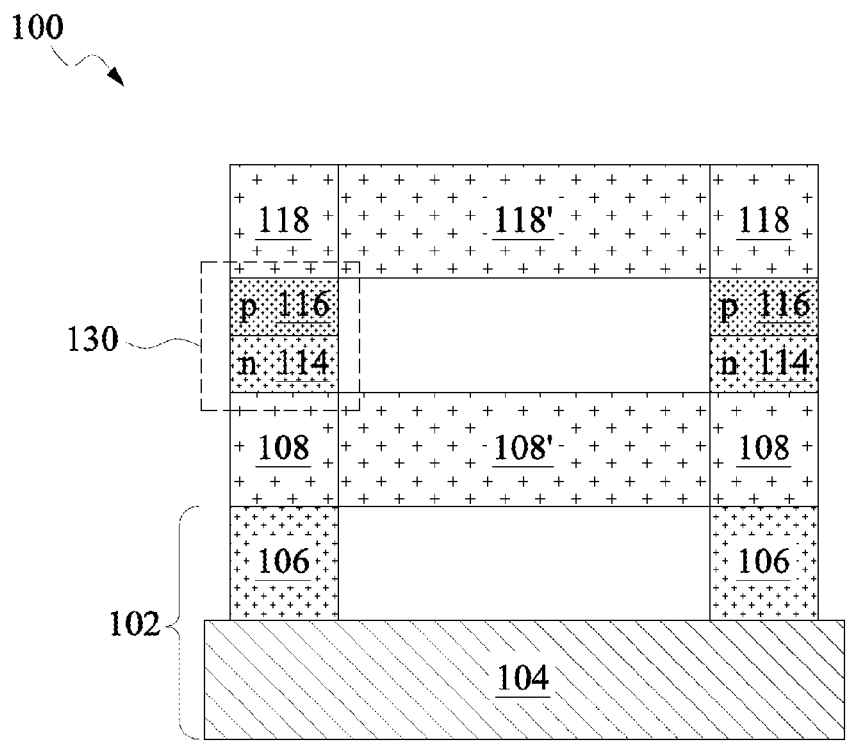
Figure 16:
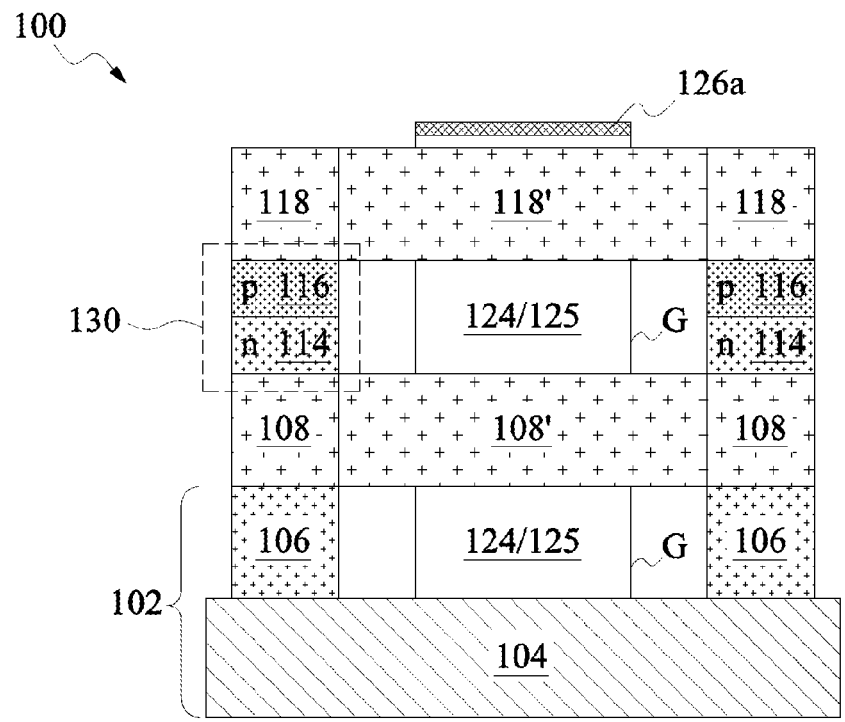
Figure 17:
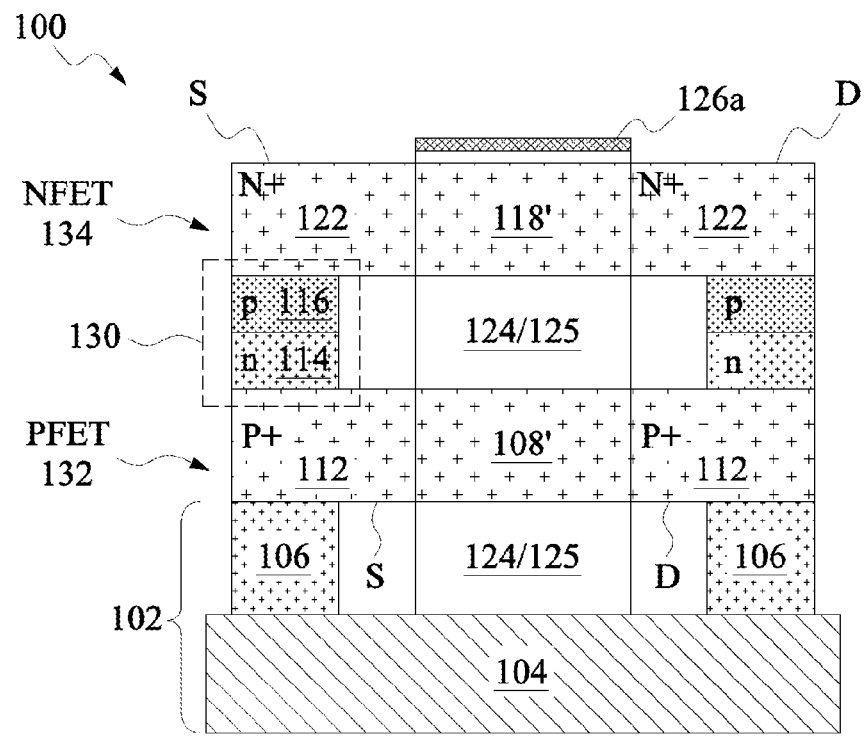
Figure 18:
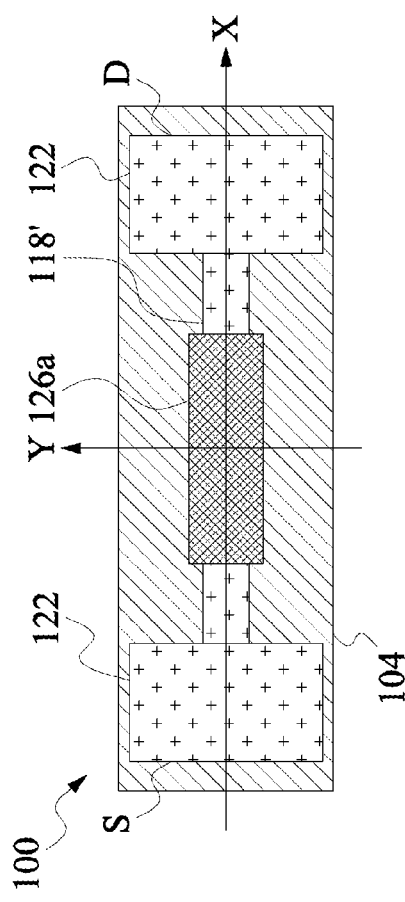

For example, FIGS. 14 through 18 are top views and cross-sectional views of a method of manufacturing a semiconductor device 100 at various stages in accordance with some embodiments, wherein the epitaxially grown semiconductive material layers 108, 114, 116, and 118 described for FIGS. 1 through 11 are implanted with dopants after their formation. In FIG. 14, the first semiconductive material 108 is formed over the substrate 102 using an epitaxial growth process, the second semiconductive material 114 is epitaxially grown over the first semiconductive material 108, the third semiconductive material 114 is epitaxially grown over the second semiconductive material 108, and the fourth semiconductive material 114 is epitaxially grown over the third semiconductive material 108. The growth processes are similar to the growth processes shown and described for FIGS. 1 through 5. In FIG. 15, an etch process is used to pattern the first and fourth semiconductive materials 108 and 118, forming the desired shapes of the source and drain regions and the channel regions 108' and 118'. The etch process is similar to the etch process described for FIGS. 6 through 8. The source and drain regions may also be undercut, as described for the previous embodiments, not shown. The gate dielectrics (not shown), gates (G) 124/125, and gate contacts 126a are formed, as shown in FIG. 16, and as described for the previous embodiments herein. Two implantation processes are then performed to implant P+ for the PMOS FinFET 132 and implant N+ for the NMOS FinFET 134 into the first and fourth semiconductive materials 108 and 118, respectively, forming the source (S) and drain (D) regions 112 and 122, respectively, of the PMOS FinFET 132 and the NMOS FinFET 134, respectively, as illustrated in FIG. 17. The implantation process is controlled to a predetermined depth within a top surface of the semiconductor device 100 to implant the dopants into the desired material layer, for example. A top view of the semiconductor device 100 shown in FIG. 17 is illustrated in FIG. 18. The dopants implanted are then activated, e.g., by heating the semiconductor device 100 to a predetermined temperature for a predetermined period of time.

The manufacturing methods for semiconductor devices 100 described herein may advantageously be integrated with fabrication of other devices on the same semiconductor device 100 in accordance with some embodiments. Other stacked or non-stacked devices, FETs, and/or FinFETs may be manufactured simultaneously with the fabrication of the FinFET inverters described herein, for example.

Figure 19:
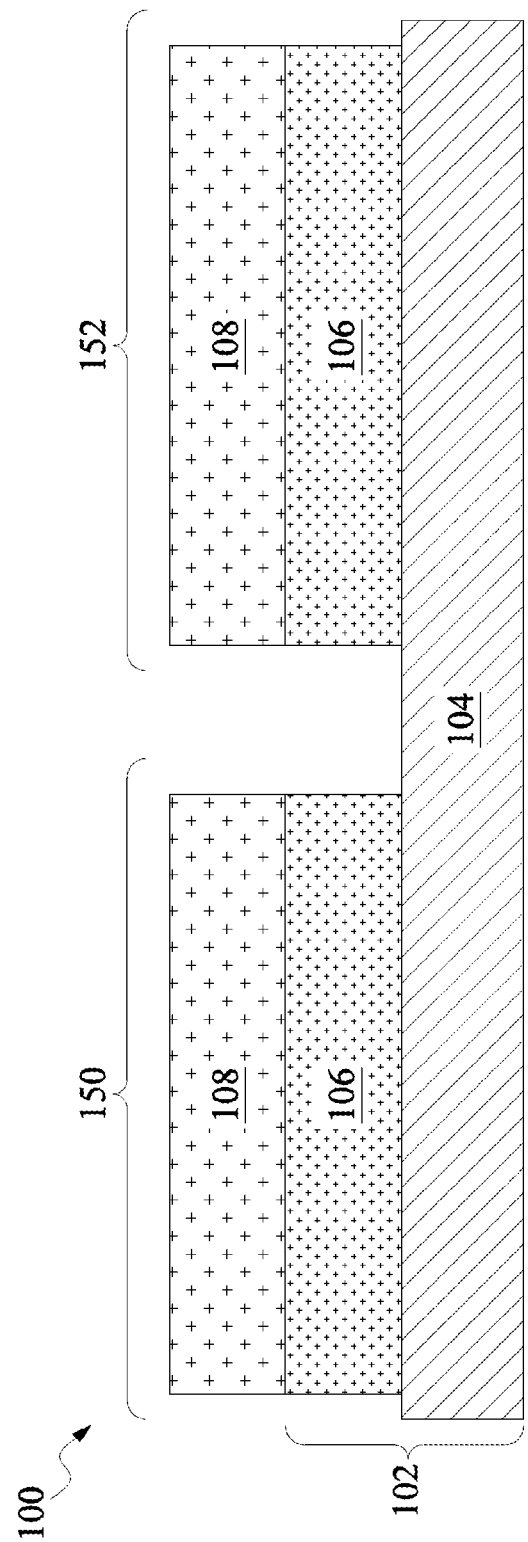
FIGS. 19 through 24 are cross-sectional views that illustrate a method of manufacturing a semiconductor device at various stages in accordance with some embodiments.

For example, FIGS. 19 through 24 are cross-sectional views of a method of manufacturing a semiconductor device 100 at various stages in accordance with some embodiments, wherein a non-stacked FinFET 132' is simultaneously formed when portions of a 3D stacked FinFET inverter described herein are formed. In FIG. 19, regions 150 and 152 are defined on the substrate 102, e.g., by patterning the semiconductive material 106 of the substrate 102 using lithography. The insulating material 104 disposed between regions 150 and 152 provides isolation between the two regions 150 and 152. Region 150 comprises a stacked region where a 3D stacked FinFET inverter will be formed, and region 152 comprises a non-stacked region of the substrate 102 where a non-stacked FinFET will be formed.

Figure 20:
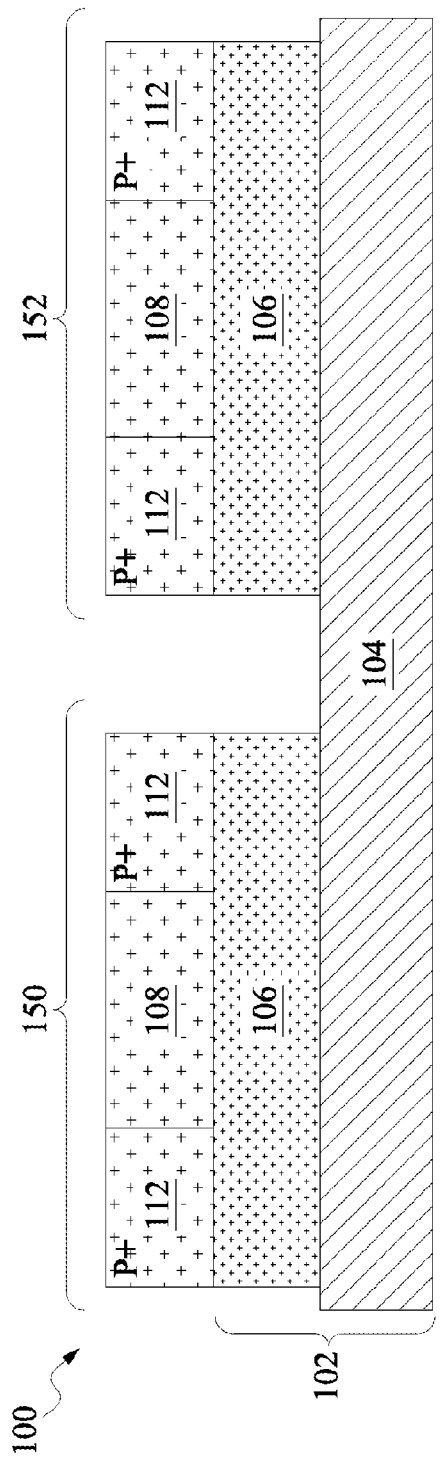

A first semiconductive material 108 is epitaxially grown over the semiconductive material 106 in the stacked region 150, as described for FIG. 2 and as shown in FIG. 19. The first semiconductive material 108 is also epitaxially grown simultaneously in the non-stacked region 152. A mask (not shown in FIG. 19; see mask 110 shown in phantom in FIG. 3) is formed to define channel regions, and source and drain regions 112 are formed in the first semiconductive material 108 by implanting dopants, as described for FIG. 3 and as shown in FIG. 20. The mask is then removed. The source and drain regions 112 comprise P+ regions. The source and drain regions 112 are formed in both the stacked region 150 and the non-stacked region 152. Portions of a non-stacked PFET comprising a FinFET are formed in the non-stacked region 152. Note that as in the other embodiments of the present disclosure, an NFET may first be formed by implanting N+ regions into the first semiconductive material 108, followed by the later formation of a PFET by implanting P+ regions into the fourth semiconductive material 118.

Figure 21:
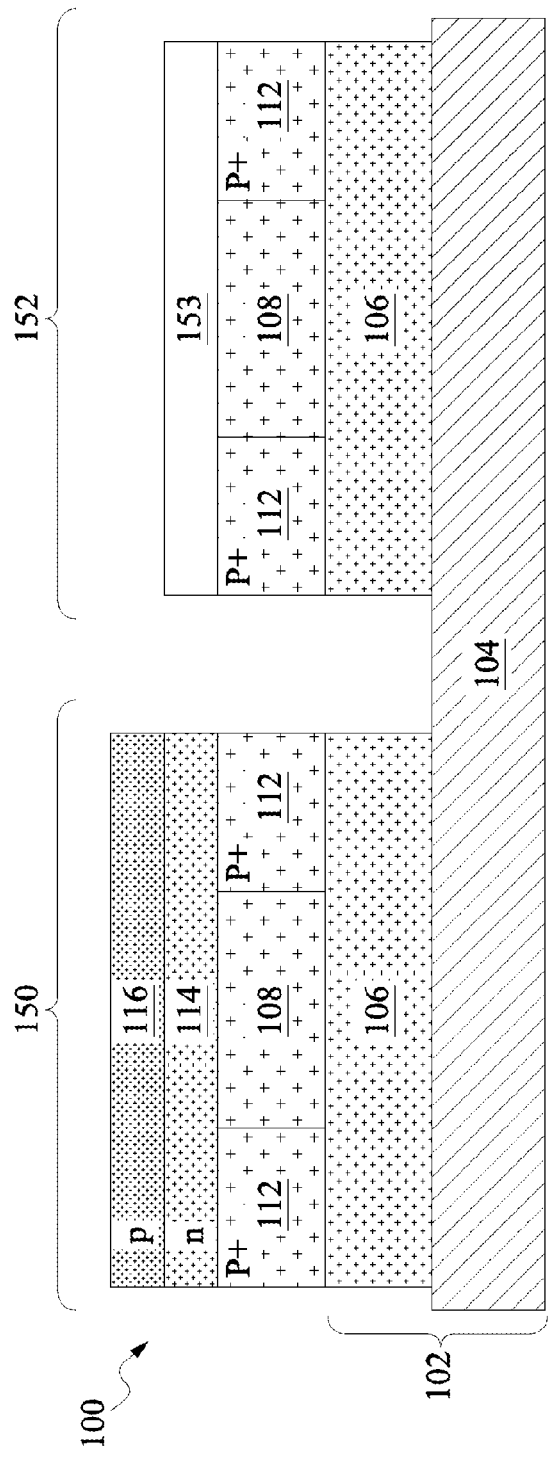
Figure 22:
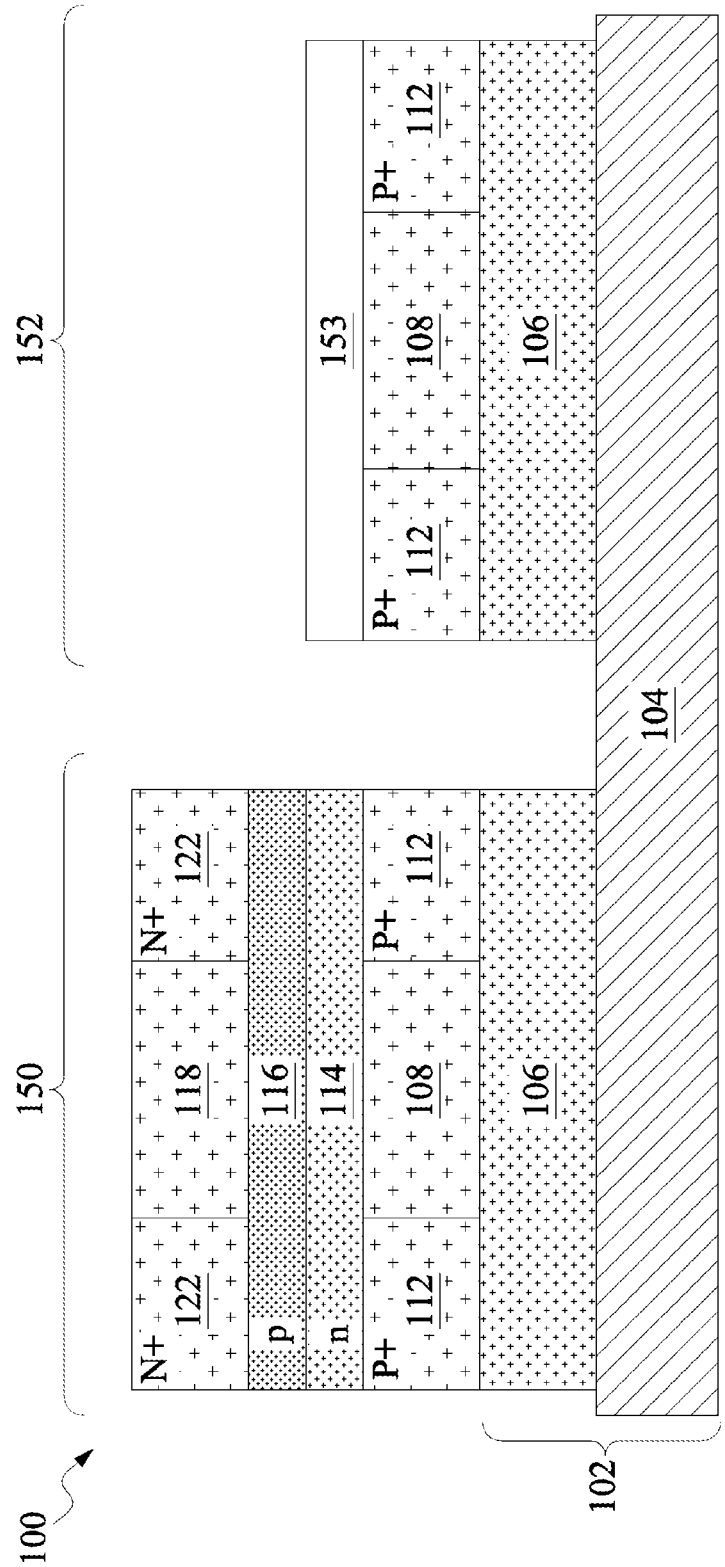

Another mask 153 is formed on the semiconductor device 100, as shown in FIG. 21. The mask 153 is patterned using lithography to remove the mask 153 from the stacked region 150. The mask 153 comprises a hard mask in some embodiments. The hard mask 153 may comprise a $SiO_2/Si_3N_4/$SiCN material stack or other materials. Processing of the stacked region 150 is then continued, such as forming the second and third semiconductive materials 114 and 116 sequentially over the first semiconductive material 108, as shown in FIG. 21, and forming the fourth semiconductive material 118 over the third semiconductive material 116 and implanting the third semiconductive material 116 with dopants to form source and drain regions 122, as shown in FIG. 22. Because an epitaxial growth process is used to form the second semiconductive material 114, the third semiconductive material 116, and the fourth semiconductive material 118, the second semiconductive material 114, the third semiconductive material 116, and the fourth semiconductive material 118 are not formed over the hard mask 153 in the non-stacked region 152.

Figure 23:
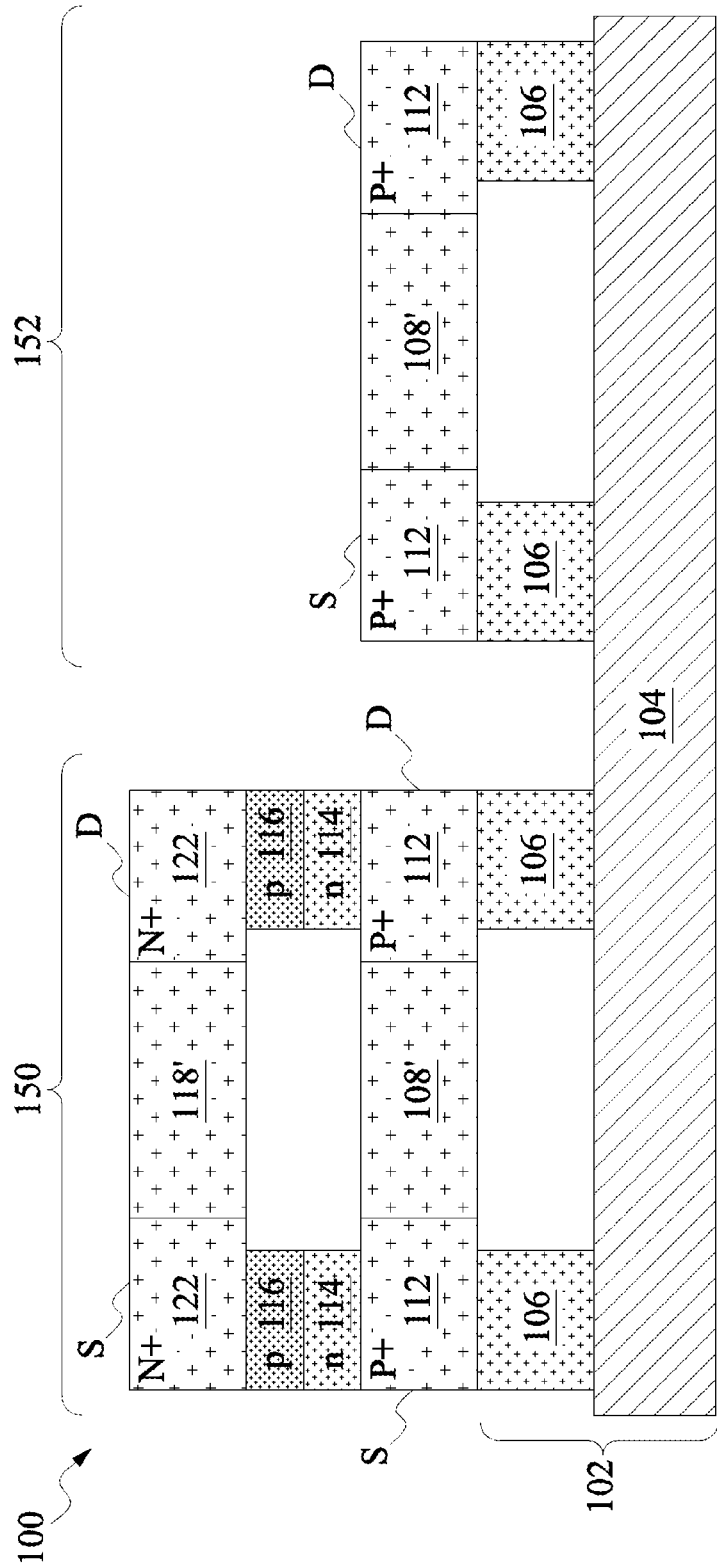
Figure 24:
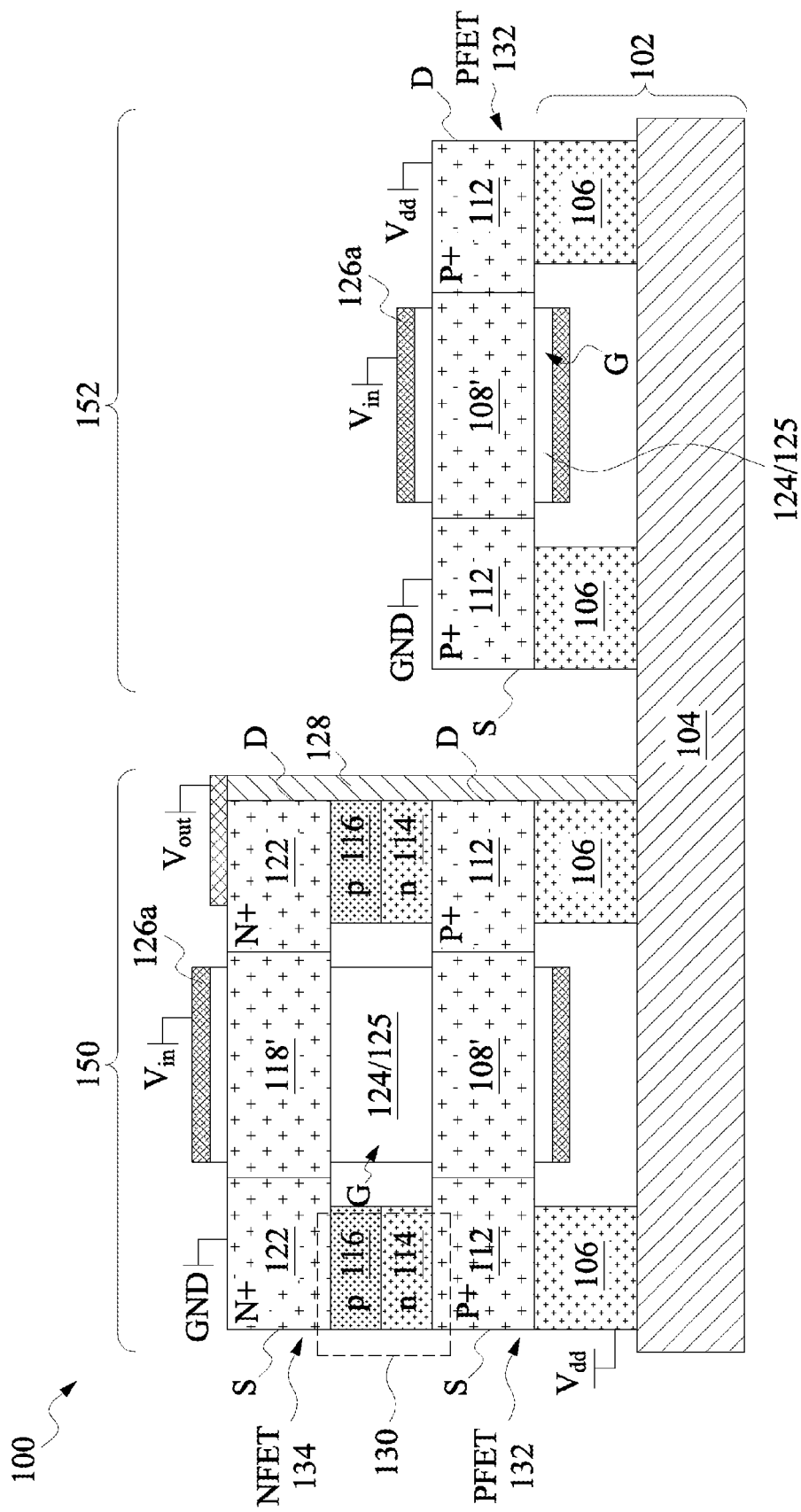

The mask 153 over the non-stacked region 152 is then removed, as shown in FIG. 23, and a patterning process and etch process are used to form the channels 108' and 118' in the stacked region 150 and form channels 108' in the non-stacked region 152. Portions of the semiconductive material 106 of the substrate 102 are undercut in the non-stacked region 152 beneath the first semiconductive material 108 from which the source (S) and drain (D) regions 112 and channel 108' is formed. A gate dielectric (not shown; see gate dielectric 123 shown in FIG. 10) and gate (G) 124/125 material is formed and patterned, as shown in FIG. 24. A contact 126a is coupled to the gate (G) 124/125 of the PFET 132' in the non-stacked region 152. The source (S) 112 of the non-stacked PFET 132' is coupleable to ground by a ground (GND) contact, the contact 126a coupled to the gate (G) 124/125 of the non-stacked PFET 132' is coupleable to a voltage input (Vin) contact, and the drain (D) 112 of the non-stacked PFET 132' is coupleable to a voltage supply (Vdd) contacts in some embodiments, for example. Other types of electrical connections may also be made to the non-stacked PFET 132' in the non-stacked region 152.

Advantageously, the non-stacked PFET 132' in the non-stacked region 152 is manufactured simultaneously with manufacturing process steps and material layers used to form the stacked NFET 134 and PFET 132 in the stacked region 150. An NFET 134 may also be formed in a non-stacked region 152 simultaneously with the formation of the stacked NFET 134 and PFET 132 in the stacked region 150. For example, before the first semiconductive material 108 is formed over the semiconductive material 106 of the substrate 102 as shown in FIG. 19, a mask comprising a hard mask or a photoresist may be formed on the non-stacked region 152. The first semiconductive material 108 is formed epitaxially and implanted with dopants as shown in FIGS. 19 and 20 in the stacked region 150, and the second semiconductive material 114 and third semiconductive material 116 are formed epitaxially in the stacked regions 150. The mask is then removed from the non-stacked region 152. Because the mask is present in the non-stacked region 152, the first semiconductive material 108, second semiconductive material 114, and third semiconductive material 116 formed by epitaxial growth are not formed in the non-stacked region 152. The fourth semiconductive material 118 is then deposited and implanted to form source and drain regions of an NFET in the non-stacked region 152 and of the NFET 134 in the stacked region 150. Thus, a non-stacked NFET may be formed simultaneously with forming the NFET 134 of the inverter in the stacked region 150. A non-stacked PFET 132' or NFET may also be formed simultaneously with the formation of the PFET 132 and/or NFET 134 in the stacked region 150 using other methods.

Figure 25:
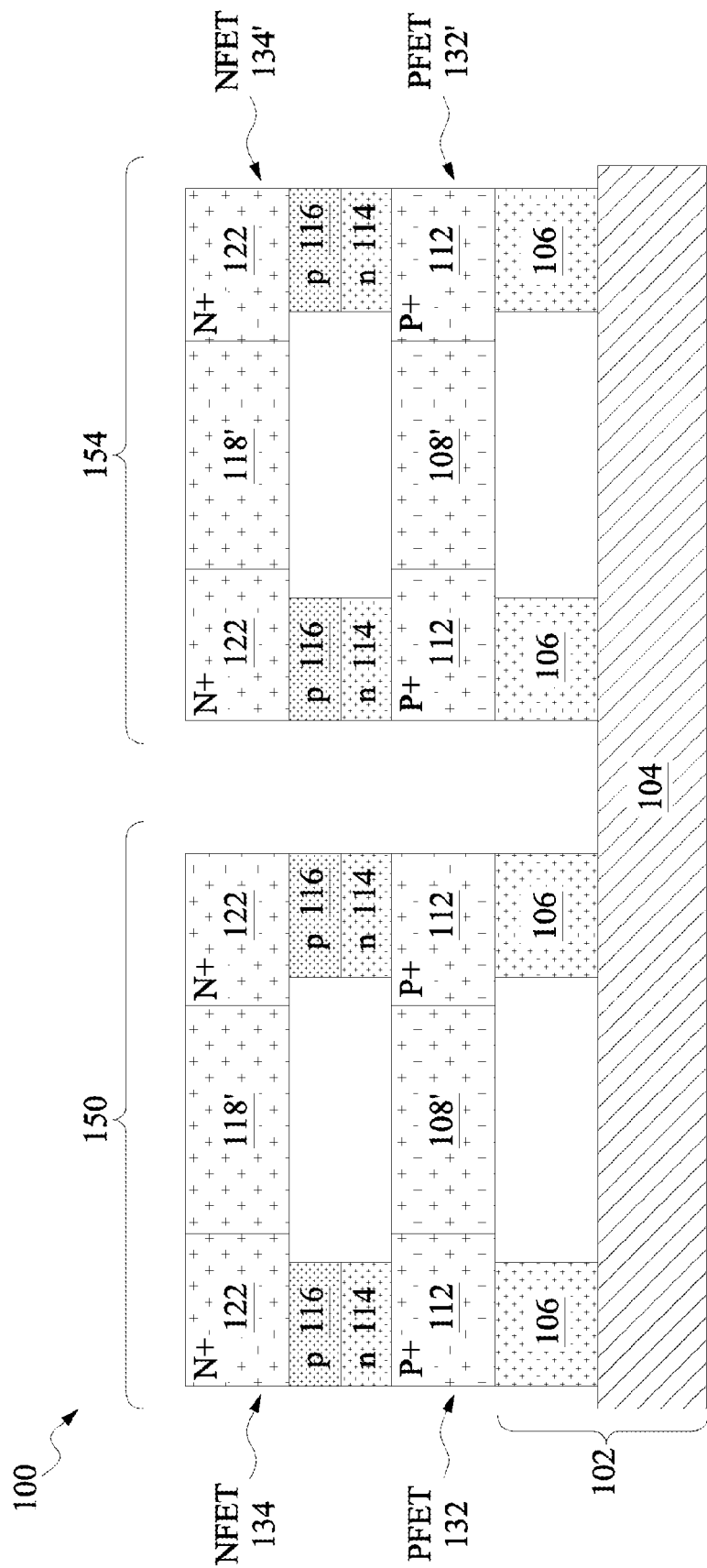
FIG. 25 is a cross-sectional view of a semiconductor device in accordance with some embodiments.
Figure 26:
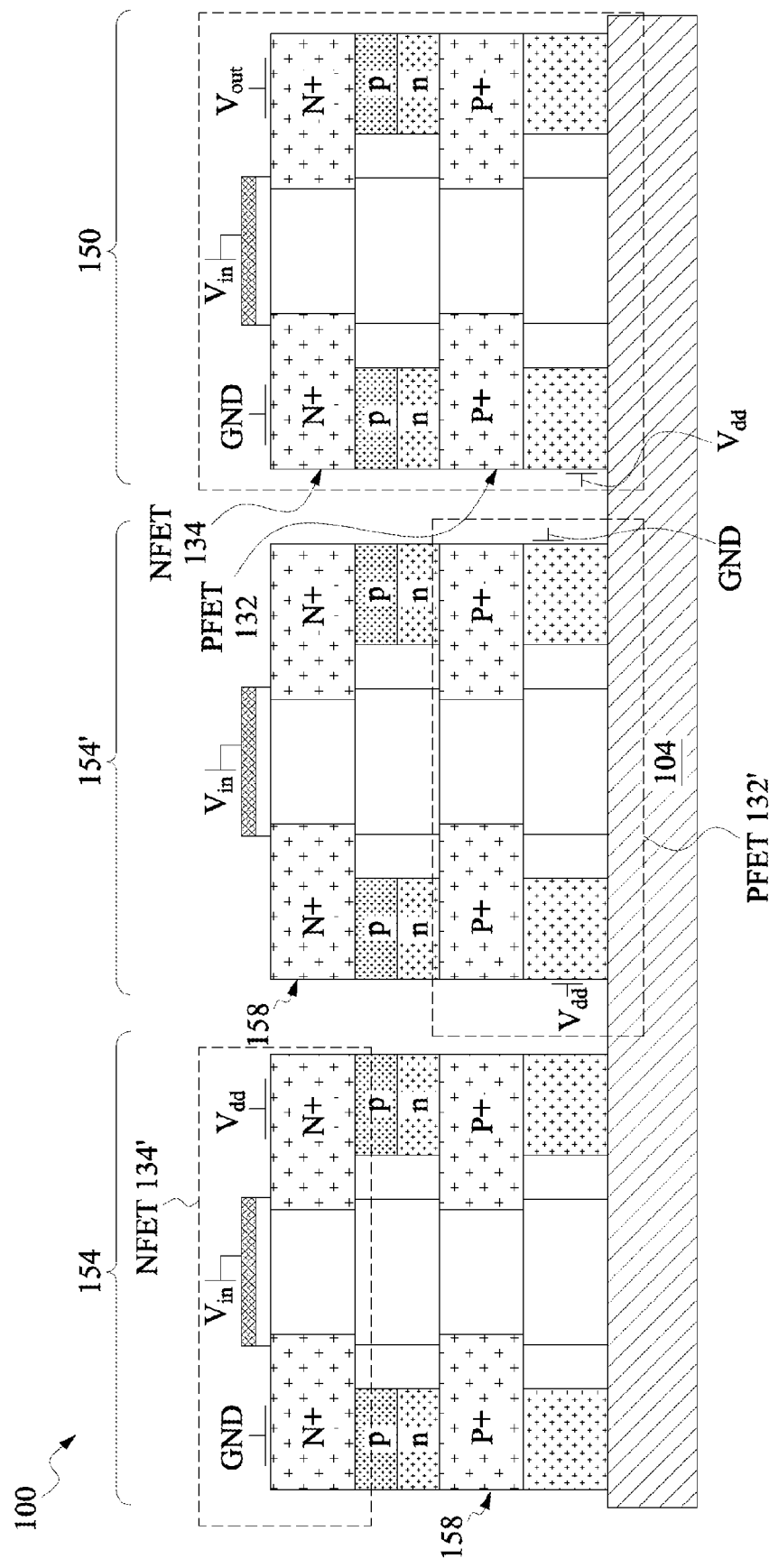
FIG. 26 is a cross-sectional view of a semiconductor device in accordance with some embodiments.

FIGS. 25 and 26 are cross-sectional views of a semiconductor device 100 in accordance with some embodiments. PFETs 132' and NFETs 134' may also be formed in other stacked regions 154 and 154' simultaneously with the formation of inverters in stacked regions 150, formed from the semiconductive material 106 of the substrate 102, and the first, second, third, and fourth semiconductive materials 108, 114, 116, and 118, using the same deposition, epitaxial growth, implantation, and etch processes previously described herein. Portions of the semiconductor device 100 may include dummy features 158 in some embodiments, as illustrated in FIG. 26. For example, stacked region 154 includes an NFET 134' disposed over a dummy feature 158 that is not electrically connected. Likewise, stacked region 154' includes a PFET 132' disposed beneath a dummy feature 158 that is not electrically connected. Electrical connections to ground (GND), voltage input (Vin), and voltage supply (Vdd) are illustrated for the NFET 134' and PFET 132'.

The additional PFETs 132' and NFETs 134' formed in non-stacked regions 152 or stacked regions 154 or 154' are also referred to herein, e.g., in some of the claims, as a third FinFET. The third FinFETs have source and drain regions that are formed when implanting source and drain regions of a first FinFET comprising a PFET 132 or that are formed when implanting source and drain regions of a second FinFET comprising an NFET 134. Forming the third FinFETs comprise forming non-stacked devices or stacked devices, for example.

Figure 27:
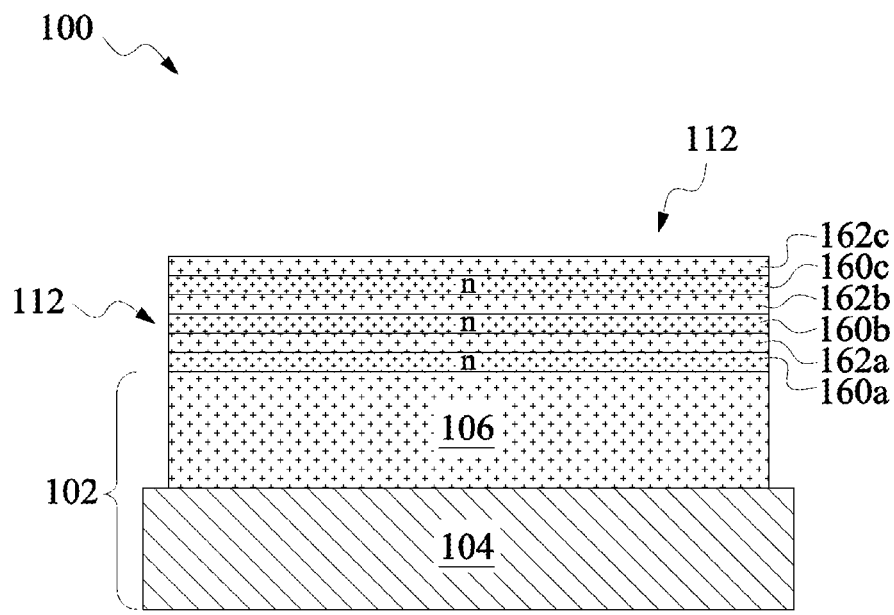
FIGS. 27 through 33 are cross-sectional views that illustrate a semiconductor device at various stages of manufacturing in accordance with some embodiments.

In some of the embodiments shown in FIGS. 1 through 11 and FIGS. 13 through 26, the PFETs 132 and NFETs 134 of the inverters comprise channel regions 108' and 118' that have single channels. In other embodiments, the channel regions of the PFETs and NFETs of the inverters may comprise multiple channels. In FIG. 11, multiple channels are shown that are formed in a horizontal direction. In other embodiments, multiple channels may be formed in a vertical direction. For example, FIGS. 27 through 33 are cross-sectional views of a semiconductor device 100 at various stages of manufacturing in accordance with some embodiments. In FIG. 27, a semiconductor device 100 comprises a substrate 102 including a semiconductive material 106 disposed over an insulator 104. To form a PFET having multiple channels, multiple semiconductive material layers 160a, 162a, 160b, 162b, 160c, and 162c are sequentially formed over the semiconductive material 106 of the substrate 102. The semiconductive material layers 160a, 162a, 160b, 162b, 160c, and 162c are epitaxially grown in some embodiments, for example. Alternating semiconductive material layers 160a, 162a, 160b, 162b, 160c, and 162c comprise the same material. For example, semiconductive material layers 160a, 160b, and 160c may comprise an n type material such as silicon doped with an n type dopant, and semiconductive material layers 162a, 162b, and 162c may comprise a similar material as described for the first semiconductive material 108 of the previous embodiments, such as SiGe, Ge, GeSn, SiGeSn, or a group III-V material. Semiconductive material layers 160a, 160b, and 160c may be in-situ doped with an n type material, for example. The semiconductive material layers 160a, 162a, 160b, 162b, 160c, and 162c may also comprise other materials and may be formed using other methods. The semiconductive material layers 160a, 162a, 160b, 162b, 160c, and 162c may each comprise a thickness of about 0.5 nm to about 10 nm, such as about 1 nm to about 7 nm, or other dimensions.

Figure 28:
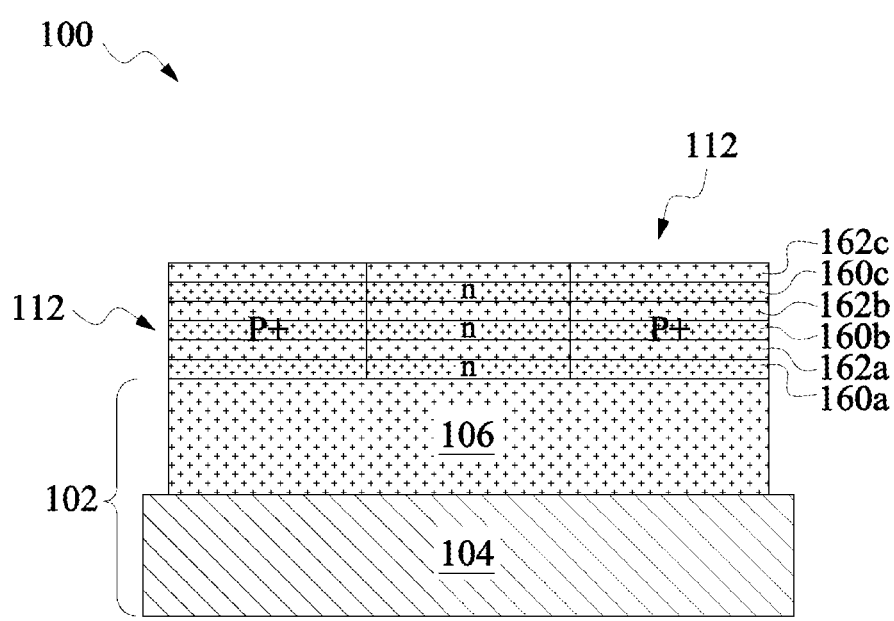
Figure 29:
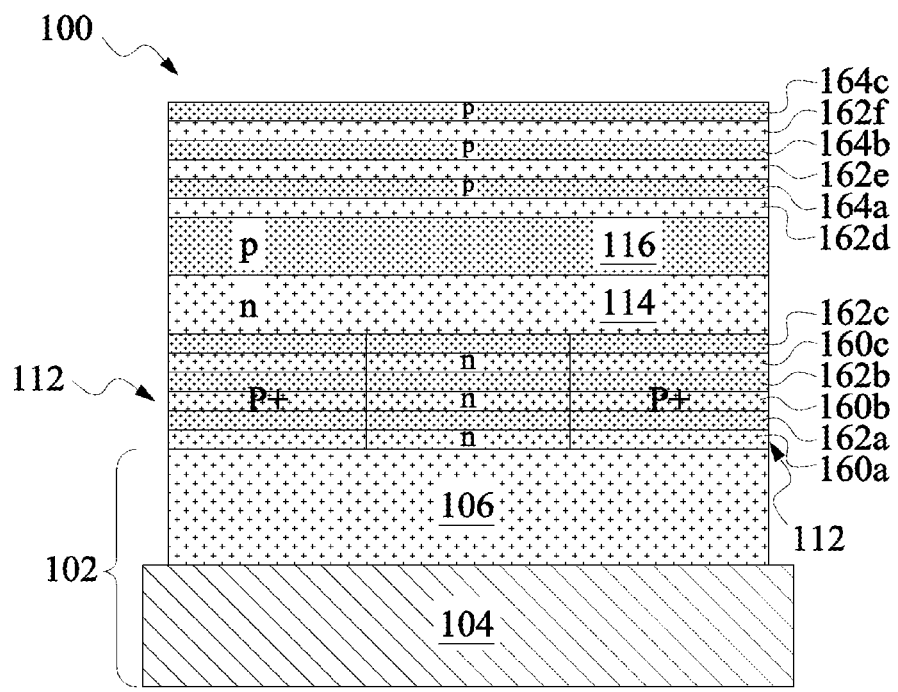

In FIG. 28, a mask (not shown) is deposited and patterned, and the semiconductive material layers 160a, 162a, 160b, 162b, 160c, and 162c are implanted with a P+ dopant to form source and drain regions 112, as described for the previous embodiments. The mask is then removed. In FIG. 29, the second semiconductive material 114 is formed over the upper-most semiconductive material layer 162c, and the third semiconductive material 116 is formed over the second semiconductive material 114. Semiconductive material layers 162d, 164a, 162e, 164b, 162f, and 164c are then sequentially formed over the third semiconductive material 116, also shown in FIG. 29. Semiconductive material layers 162d, 164a, 162e, 164b, 162f, and 164c may comprise similar materials and formation methods as described for semiconductive material layers 160a, 162a, 160b, 162b, 160c, and 162c, for example. Semiconductive material layers 164a, 164b, and 164c are in-situ doped with a p type material in some embodiments. The semiconductive material layers 162d, 164a, 162e, 164b, 162f, and 164c may each comprise a thickness of about 0.5 nm to about 10 nm, such as about 1 nm to about 7 nm, or other dimensions.

Figure 30:
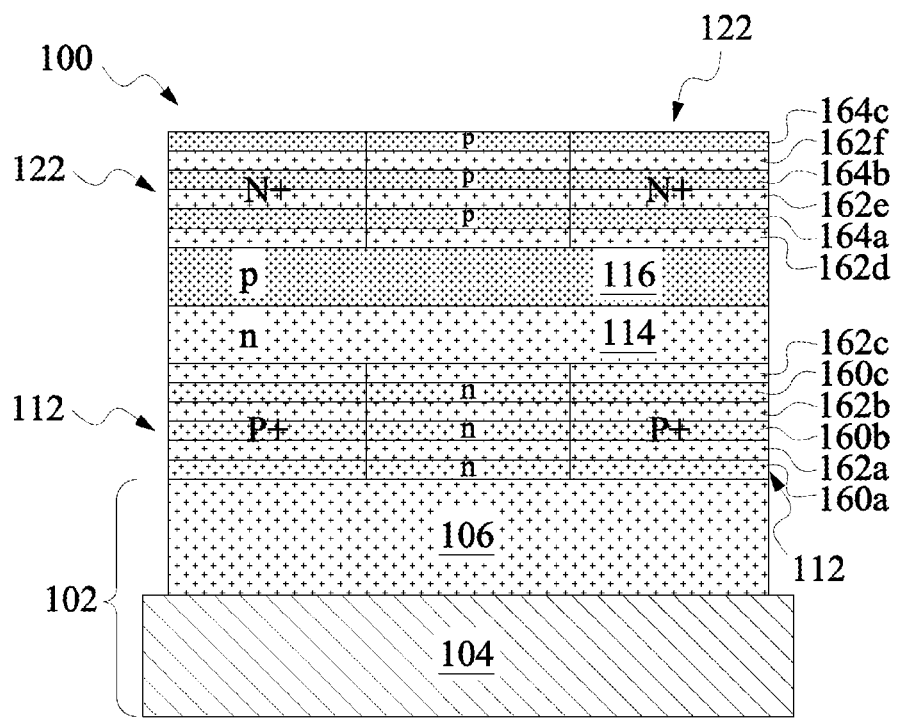
Figure 31:
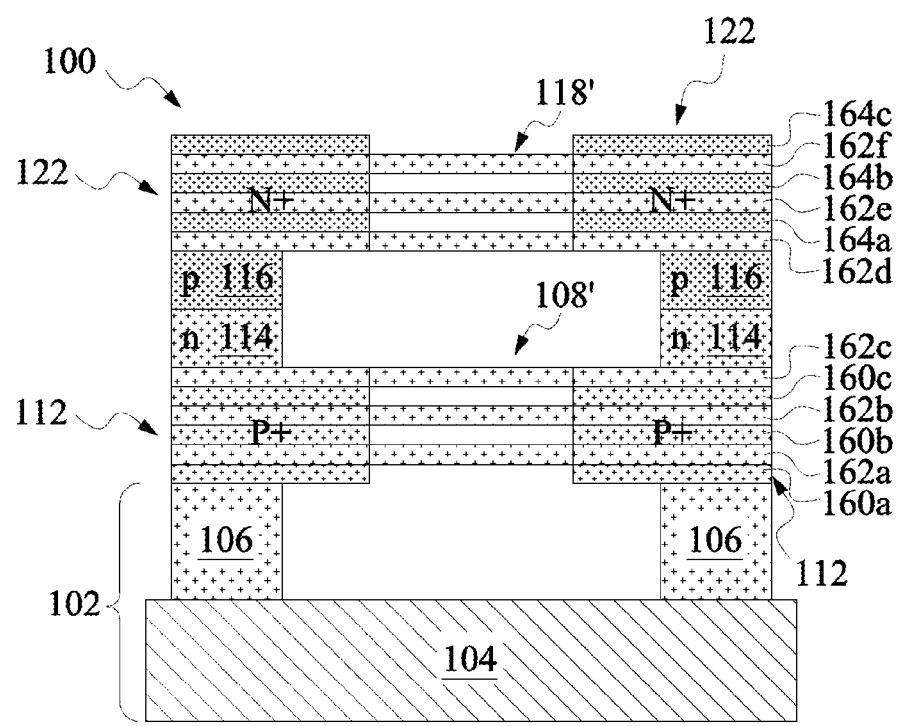
Figure 32:
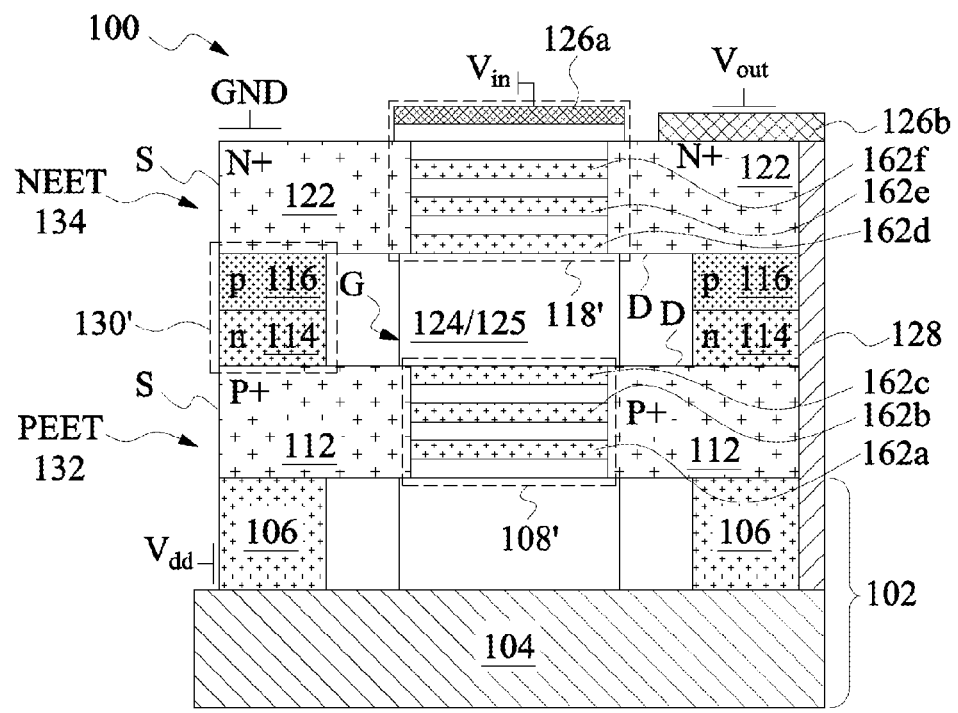

In FIG. 30, a mask (not shown) is deposited and patterned, and the semiconductive material layers 162d, 164a, 162e, 164b, 162f, and 164c are implanted to form source and drain regions 112, as described for the previous embodiments. The mask is then removed. The semiconductive material layers 162d, 164a, 162e, 164b, 162f, and 164c are implanted with an N+ dopant to form the source and drain regions 122, as described for the previous embodiments. In FIG. 31, a selective etch process is used to remove portions of material layers 160a, 160b, 160c, 164a, 164b, 164c, and the semiconductive material 106 of the substrate 102, leaving portions of semiconductive material layers 162a, 162b, 162c, 162d, 162e, and 162f remaining that form multiple channels of the PFET 132 and the NFET 134, as shown in FIG. 32. The gate dielectric 123, gate materials 124/125, and contacts 126a and 126b, and side contact 128 is formed, as shown in FIG. 32 and as described for the previous embodiments.

Figure 33:
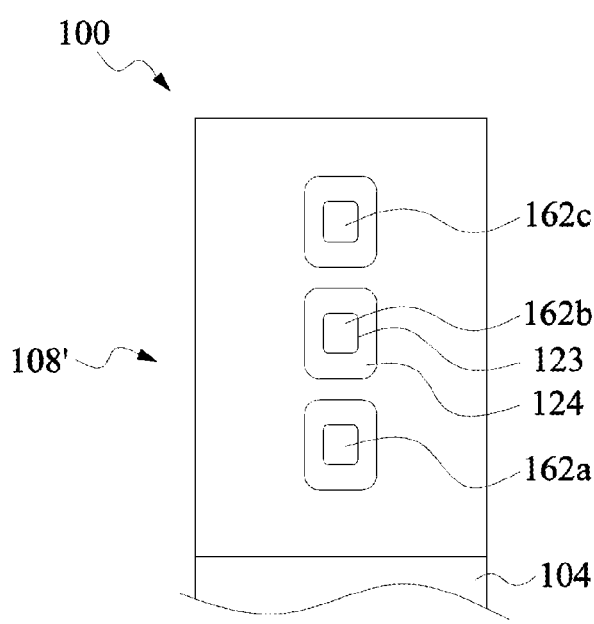

A cross-sectional view perpendicular to the view shown in FIG. 32 is shown in FIG. 33 of the channel region 108' of the PFET 132 shown in FIG. 32. The channel region 108' of the PFET 132 comprises three channels 162a, 162b, and 162c. The channel region 118' of the NFET 134 comprises a similar shape and three channels 162d, 162e, and 162f. A PFET 132 and NFET 134 comprising three channels is shown in the embodiments shown in FIGS. 27 through 33; however, an inverter comprising a stacked PFET 132 and NFET 134 may also comprise two channels or four or more channels, not shown. The PFET 132 and NFET 134 comprise the same number of channels in some embodiments. In other embodiments, the PFET 132 and NFET 134 of the inverter comprise a different number of channels.

FIGS. 34 through 38 are cross-sectional views that illustrate an inverter 100' at various stages of manufacturing in accordance with some embodiments. The inverter 100' is also referred to herein as a TFET inverter 100'. The inverter 100' comprises two TFETs 163 and 165 (see FIG. 38) that are coupled together and are stacked over a substrate 102. The TFETs 163 and 165 operate at a low voltage, e.g., typically lower than CMOS devices, and thus are advantageously adapted to operate at extremely low power levels, resulting in a power savings.

The TFETs 163 and 165 comprise FinFETs that have similar structures as the FinFETs previously described herein, and the TFETs 163 and 165 also comprise similar manufacturing methods. TFET 163 is also referred to herein as a first TFET 163, and TFET 165 is also referred to herein as a second TFET 165. The source of the second TFET 165 is disposed over the source of the first TFET 163 which is disposed over the substrate 102, the drain of the second TFET 165 is disposed over the drain of the first TFET 163, and the channel region of the second TFET 165 is disposed over the channel region of the first TFET 163, in some embodiments.

The TFETs 163 and 165 each have a source and drain that are doped differently. For example, the source of the first TFET 163 may be doped with a P+ dopant and the drain of the first TFET 163 may be doped with an N+ dopant, or vice versa. Likewise, the source of the second TFET 165 may doped with an N+ dopant and the drain of the second TFET 165 may be doped with an P+ dopant, or vice versa. In some embodiments, the drain of the first TFET 163 comprises a first dopant type, and the source of the second TFET 165 comprises the first dopant type. The source of the first TFET 163 comprises a second dopant type, and the drain of the second TFET 165 comprises the second dopant type. The second dopant type is different than the first dopant type.

Figure 34:
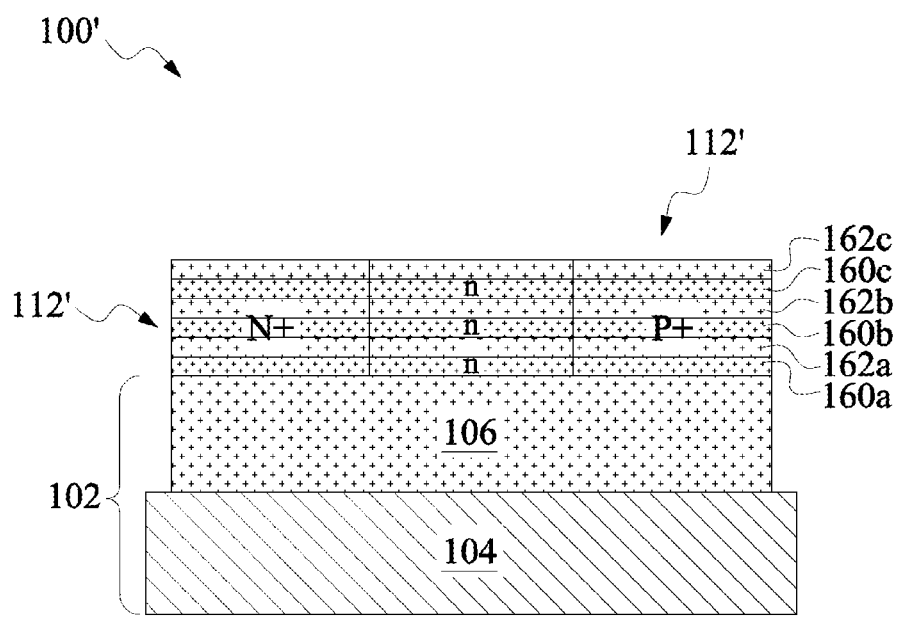
FIGS. 34 through 38 are cross-sectional views that illustrate an inverter at various stages of manufacturing in accordance with some embodiments of the present disclosure.

The manufacturing process for the TFET inverter 100' comprises similar processing steps as some of the embodiments shown in FIGS. 27 through 33 in some embodiments, with the doping of the source and drain regions being different for the TFETs 163 and 165 rather than the same. After the manufacturing process step shown in FIG. 27, rather than implanting a P+ dopant into both the source and drain regions 112 as shown in FIG. 28, the source 112' of a first TFET 163 is implanted with an N+ dopant and the drain 112' of the first TFET 163 is implanted with a P+ dopant in some embodiments, as shown in FIG. 34. A first mask (not shown) may be formed over the channel regions disposed between the source 112' and drain 112' regions and over the drain 112' region, and the N+ implantation process for the source 112' may then be performed. (Refer again to the description of FIG. 5 for additional details regarding the N+ implantation process, for example.) The first mask is then removed. A second mask (also not shown) may then be formed over the channel regions disposed between the source 112' and drain 112' regions and over the N+ source 112' region, and the P+ implantation process for the drain region 112' may then be performed. (Refer again to the description of FIG. 3 for additional details regarding the P+ implantation process, for example.) The second mask is then removed. The first and second mask may comprise a photoresist that is patterned using lithography, similar to the mask 110 shown in FIG. 3, for example. The N+ and P+ implantation processes may also be performed using other methods and in a reverse order. The source may be P+ doped, and the drain may be N+ doped, as another example (not shown).

The alternating semiconductive material layers 160a, 162a, 160b, 162b, 160c, and 162c include a plurality of layers of a first semiconductive material in some embodiments. A first dopant comprising an N+ dopant and a second dopant comprising a P+ dopant are implanted into the plurality of layers of the first semiconductive material in some embodiments, as illustrated in FIG. 34. After the implantation processes to form the source 112' and drain 112' of the first TFET 163 in the first semiconductive material, portions of semiconductive material layers 160a, 160b, and 160c in the source 112' and drain 112' regions were implanted, and other portions of semiconductive material layers 160a, 160b, and 160c disposed between the source 112' and drain 112' were not implanted and comprise a first sacrificial material in some embodiments. Some of the semiconductive material layers 160a, 160b, and 160c are disposed between adjacent ones of the semiconductive material layers 162a, 162b, and 162c, such as semiconductive material layers 160b and 160c. Semiconductive material layer 160a is formed beneath a bottom one of the semiconductive material layer 162a. Likewise, a semiconductive material layer 160x (not shown) may be disposed over a top one of the plurality of layers of the semiconductive material layer 162c, not shown.

The plurality of layers of the first semiconductive material are implanted with dopants to form the source 112' of the first TFET 163 that is implanted with an N+ dopant and the drain 112' of the first TFET 163 that is implanted with a P+ dopant in some embodiments, as illustrated in FIG. 34. Portions of semiconductive material layers 160a, 160b, and 160c disposed between the source 112' and drain 112" of the first TFET 163 that are not implanted in the implantation processes comprise the first sacrificial material that is later removed (see FIG. 37) to form the channel region 108' comprising multiple channels of the first TFET 163. The channel region 108' of the first TFET 163 comprises the unimplanted plurality of layers of the first semiconductive material 162a, 162b, and 162c that are left remaining, for example.

In some embodiments, the plurality of layers of the first semiconductive material shown in FIG. 34 comprises alternating layers of a first material comprising semiconductive material layers 162a, 162b, and 162c and a second material comprising semiconductive material layers 160a, 160b, and 160c, the second material comprising semiconductive material layers 160a, 160b, and 160c being different than the first material comprising semiconductive material layers 162a, 162b, and 162c. The second material comprising semiconductive material layers 160a, 160b, and 160c comprises a first sacrificial material disposed between the source 112' and the drain 112' of the first TFET 163. After the first sacrificial material of the second material comprising semiconductive material layers 160a, 160b, and 160c is later removed (FIG. 37), the first material comprising semiconductive material layers 162a, 162b, and 162c left remaining of the first TFET 163 comprises a channel region 108' comprising multiple channels disposed between the source 112' and the drain 112' of the first TFET 163.

Figure 35:
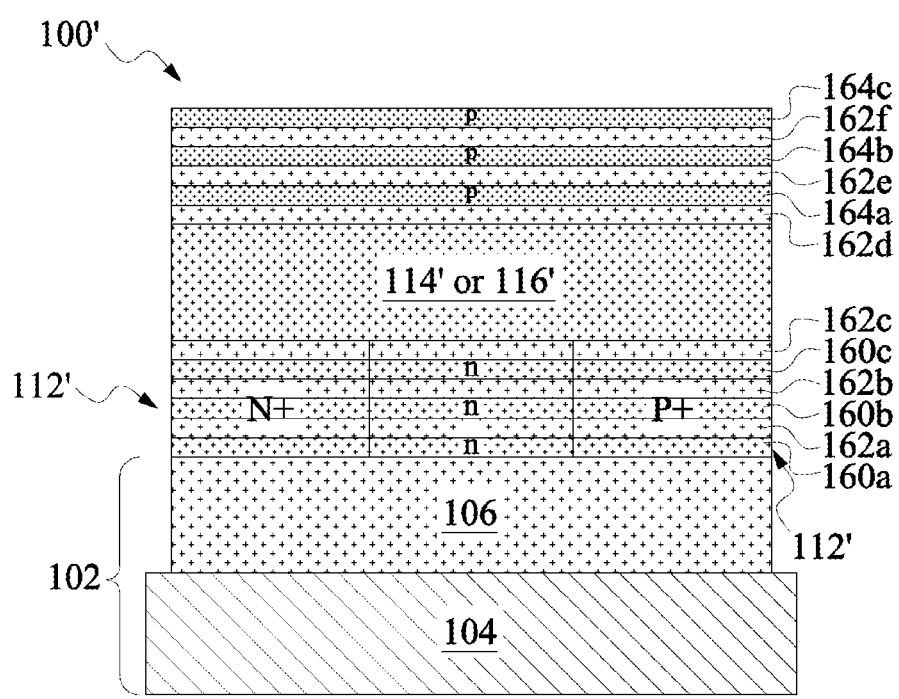

Referring next to FIG. 35, a second semiconductive material 114' or 116' is then formed over the first semiconductive material comprising the alternating semiconductive material layers 160a, 162a, 160b, 162b, 160c, and 162c. The second semiconductive material 114' or 116' may be doped and may comprise similar materials as described for second semiconductive material 114 and third semiconductive material 116 for some of the previous embodiments herein. In accordance with some embodiments, the second semiconductive material 114' or 116' is not doped. The second semiconductive material 114' or 116' may comprise an undoped semiconductive material such as silicon, for example. For the inverter 100' comprising the TFETs 163 and 165, one semiconductive material layer 114' or 116' is disposed between multiple alternating semiconductive material layers of the first TFET 163 and the second TFET 165 in some embodiments. A bias at the two sources of the TFETs is naturally reverse biased for a P-N junction for a stacked TFET inverter configuration in some embodiments, so that an additional semiconductor material layer 114 or 116 is not required. In some embodiments, two semiconductor material layers 114 and 116 may be included, not shown.

Figure 36:
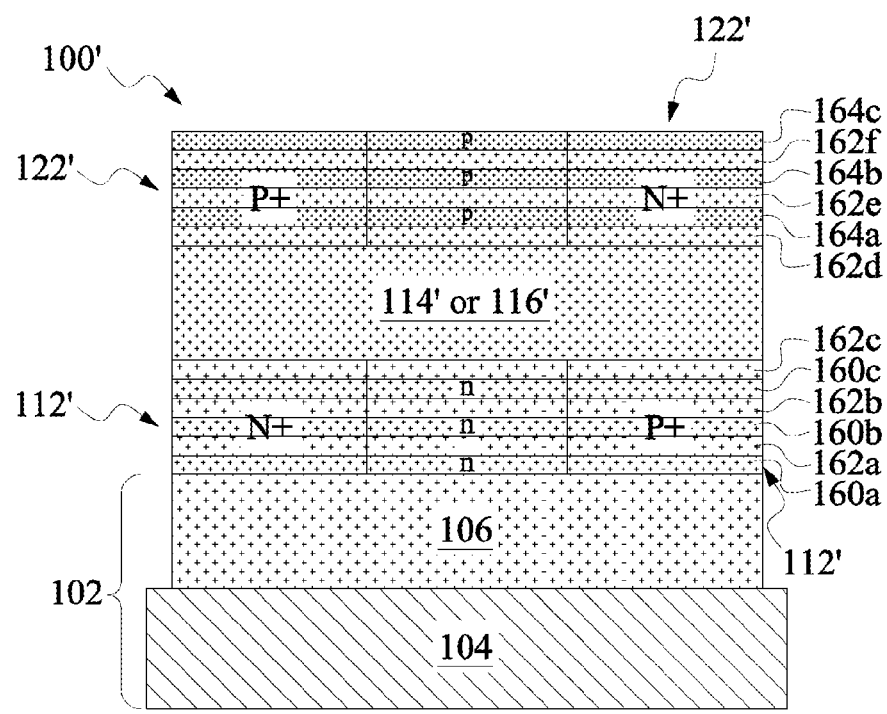

Alternating semiconductive material layers 162d, 164a, 162e, 164b, 162f, and 164c are then formed over the second semiconductive material 114' or 116', also shown in FIG. 35, similar to the manufacturing process step shown in FIG. 29. The alternating semiconductive material layers 162d, 164a, 162e, 164b, 162f, and 164c comprise a plurality of layers of a third semiconductive material in some embodiments. The plurality of layers of the third semiconductive material are implanted with dopants to form the source 122' of the second TFET 165 that is implanted with an P+ dopant and the drain 112' of the second TFET 165 that is implanted with an N+ dopant in some embodiments, as illustrated in FIG. 36. Portions of semiconductive material layers 164a, 164b, and 164c disposed between the source 112' and drain' of the second TFET 165 comprise a second sacrificial material that is later removed (see FIG. 37) to form a channel region 118' comprising multiple channels of the second TFET 165. The channel region 118' of the second TFET 165 comprises the unimplanted semiconductive material layers 162d, 162e, and 162f, for example.

In some embodiments, the plurality of layers of the first semiconductive material shown in FIG. 36 comprises alternating layers of a first material comprising semiconductive material layers 162d, 162e, and 162f and a third material comprising semiconductive material layers 164a, 164b, and 164c, the third material comprising semiconductive material layers 164a, 164b, and 164c being different than the first material comprising semiconductive material layers 162d, 162e, and 162f. The third material comprising semiconductive material layers 164a, 164b, and 164c comprises a second sacrificial material disposed between the source 122' and the drain 122' of the second TFET 165. After the second sacrificial material of the third material comprising semiconductive material layers 164a, 164b, and 164c is later removed (FIG. 37), the first material comprising semiconductive material layers 162d, 162e, and 162f left remaining of the second TFET 165 comprises a channel region 118' disposed between the source 122' and the drain 122' of the second TFET 163.

The materials of the alternating semiconductive material layers 160a, 162a, 160b, 162b, 160c, and 162c used to form the first TFET 163 and the alternating semiconductive material layers 162d, 164a, 162e, 164b, 162f, and 164c used to form the second TFET 165 may comprise Si, SiGe, Ge, GeSn, SiGeSn, or a III-V material, as examples. Adjacent ones of the alternating semiconductive material layers 160a, 162a, 160b, 162b, 160c, and 162c and adjacent ones of the 162d, 164a, 162e, 164b, 162f, and 164c comprise different materials so that a selective etch may be used to remove portions of the semiconductive material layers 160a, 160b, and 160c and portions of the semiconductive material layers 164a, 164b, and 164c. The alternating semiconductive material layers 160a, 162a, 160b, 162b, 160c, and 162c and alternating semiconductive material layers 162d, 164a, 162e, 164b, 162f, and 164c may comprise a thickness of about 5 nm to about 10 nm in some embodiments, for example. The alternating semiconductive material layers 160a, 162a, 160b, 162b, 160c, and 162c and alternating semiconductive material layers 162d, 164a, 162e, 164b, 162f, and 164c may also comprise other materials and dimensions.

The manufacturing process step illustrated in FIG. 36 for the TFET inverter 100' is similar to the manufacturing process shown in FIG. 30; however, rather than implanting an N+ dopant into both the source and drain regions 122 as shown in FIG. 30, the source 122' of the second TFET 165 is implanted with a P+ dopant and the drain 122' of the second TFET 165 is implanted with an N+ dopant in some embodiments, as shown in FIG. 36. A first mask (not shown) may be formed over the channel region disposed between the source and drain regions 122' and over drain region 122', and the P+ implantation process for the source region 122' may then be performed. The first mask is then removed. A second mask (also not shown) may then be formed over the channel region disposed between the source and drain regions 122' and over the source region 122', and the N+ implantation process for the drain region 122' may then be performed. The second mask is then removed. The first and second mask may comprise a photoresist that is patterned using lithography, similar to the mask 110 shown in FIG. 3, for example. The P+ and N+ implantation processes may also be performed using other methods and in a reverse order. The source of the second TFET 165 may be N+ doped, and the drain may be P+ doped, as another example (also not shown), e.g., in some embodiments wherein the source of the first TFET 163 is P+ doped and the drain of the first TFET 163 is N+ doped, as another example.

Figure 37:
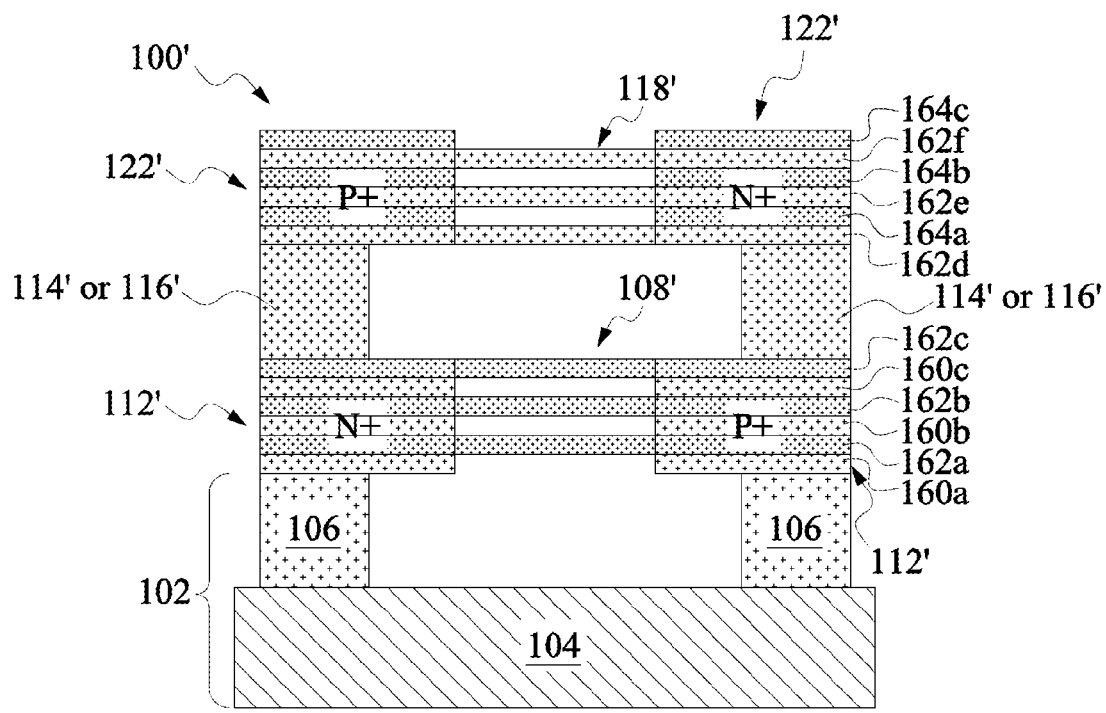

FIG. 37 illustrates a cross-sectional view of the next manufacturing process step in some embodiments, which is similar to the manufacturing process shown in some of the embodiments illustrated in FIG. 31. A lithography process is used to form channel regions 108' and 118' having multiple channels that are comprised of the semiconductive material layers 162a, 162b, and 162c and the semiconductive material layers 162*d*, 162*e*, and 162*f*, respectively, and to form the source and drain regions 112' and 122' of the first TFET 163 and the second TFET 165, respectively, comprised of the implanted alternating semiconductive material layers 160*a*, 162*a*, 160*b*, 162*b*, 160*c*, and 162*c* and the implanted alternating semiconductive material layers 162*d*, 164*a*, 162*e*, 164*b*, 162*f*, respectively. The inverter 100' shown in FIG. 37 comprises a shape in a top view of the inverter 100' that is similar to the shape of the semiconductor device 100 shown for some of the embodiments illustrated in FIG. 6, for example, with the source 122' and drain 122' being wider than the channel region 118'.

Referring again to FIG. 36, to pattern the implanted alternating semiconductive material layers 160*a*, 162*a*, 160*b*, 162*b*, 160*c*, and 162*c* and alternating semiconductive material layers 162*d*, 164*a*, 162*e*, 164*b*, 162*f*, and 164*c* and unimplanted alternating semiconductive material layers 160*a*, 162*a*, 160*b*, 162*b*, 160*c*, and 162*c* and alternating semiconductive material layers 162*d*, 164*a*, 162*e*, 164*b*, 162*f*, and 164*c*, a masking material such as a photoresist, not shown, is deposited over the top-most alternating semiconductive material 164*c*, and the masking material is patterned with a desired shape of the channel regions 108' and 118' and the source and drain 112' and 122' regions of the first TFET 163 and the second TFET 165, respectively. The masking material may be patterned by exposing the masking material to light or energy that is reflected from or transmitted through a lithography mask having a desired pattern thereon, for example. The masking material is then used as an etch mask during an etch process.

The etch process may comprise a selective etch process that is adapted to remove portions of the semiconductive material layers 160*a*, 160*b*, and 160*c*, the semiconductive material layers 164*a*, 164*b*, and 164*c*, the second semiconductive material 114' or 116', and the semiconductive material 106 of the substrate 102, for example. The semiconductive material 106 of the substrate 102 and the second semiconductive material 114' or 116', may etch at a faster rate than the alternating semiconductive material layers 162*d*, 164*a*, 162*e*, 164*b*, 162*f*, and 164*c* and the alternating semiconductive material layers 160*a*, 162*a*, 160*b*, 162*b*, 160*c*, and 162*c* during the etch process in some embodiments, so that the semiconductive material 106 of the substrate 102 and the second semiconductive material 114' or 116' comprise an undercut beneath and/or above the 112' and 122' (S and D) regions, as illustrated in FIGS. 6 and 7. A selective etch process may be chosen in order to achieve a predetermined amount of undercut beneath and above the source and drain 112' and 122' (S and D) regions, for example. The amount of the undercut comprises a dimension comprising (½*W) in some embodiments, as shown and described for some of the embodiments illustrated in FIGS. 6 and 7. The masking material is then removed.

Figure 38:
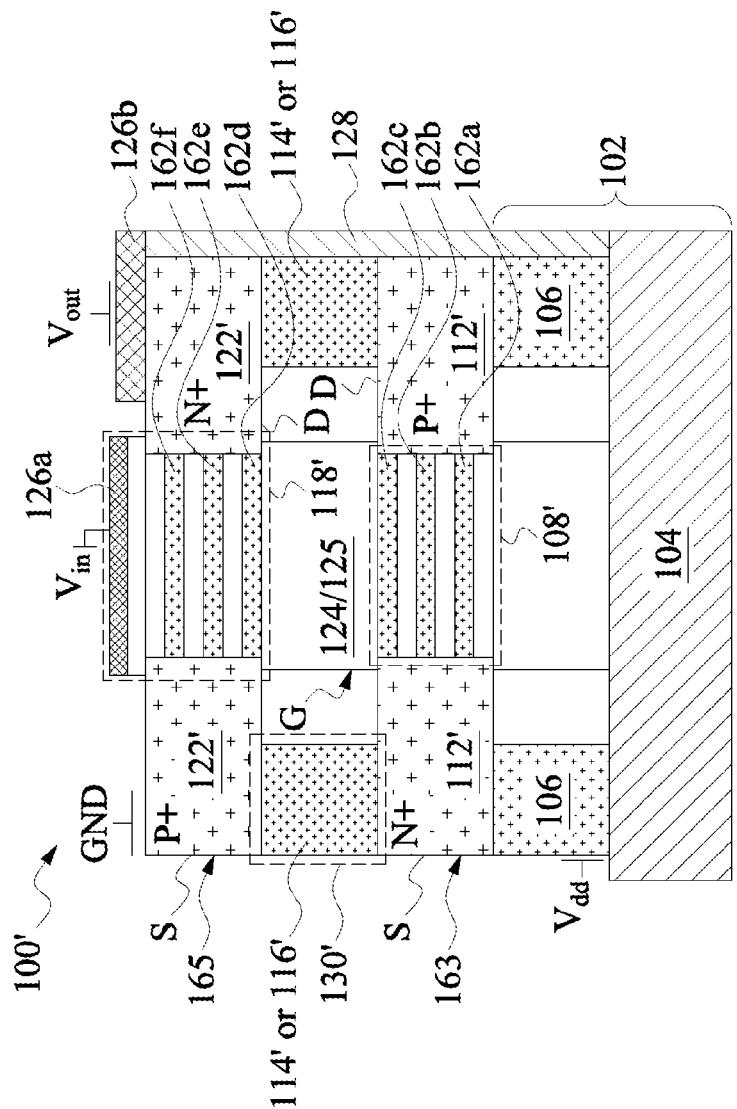

A gate dielectric (not shown) is then formed on the channel regions 108' and 118', and a gate 124/125 (G) is formed over the gate dielectric, as shown in FIG. 38. The gate dielectric 123 is shown in some of the embodiments illustrated in FIGS. 10 and 11, and more details regarding the gate 124/125 are shown in some of the embodiments illustrated in FIGS. 9, 10, and 11, for example. The processes used to for the gate dielectric 123 and the gate 124/125 (G) comprise similar processes and materials as described for the embodiments shown in FIGS. 9, 10, 11, and also FIGS. 32 and 33, which also include multiple channel devices.

FIG. 38 also illustrates contacts 126*a* and 126*b* and side contact 128 that are formed as previously described herein for some embodiments. Contact 126*a* is coupled to the gate 124/125 (G) which comprises the gate of the first TFET 163 and the second TFET 165. The gates G of the first TFET 163 and the second TFET 165 are coupled together, as shown in the schematic 136 illustrated in FIG. 12. Contact 126*b* is coupled to the drain 122' (D) of the second TFET 165. The side contact 128 couples together the drain 112' (D) of the first TFET 163 and the drain 122' (D) of the second TFET 165. The drain 112' (D) of the first TFET 163 is coupled to the drain 122' (D) of the second TFET 165, as shown in the schematic 136 of FIG. 12, for example. Other connections of the schematic 136 shown in FIG. 12 are illustrated in FIG. 38, such as the connection of the source 122' (S) of the second TFET 165 to ground (GND), the connection of the source 112' (S) of the first TFET 163 to a voltage supply (Vdd) via a portion of the semiconductive material 106 of the substrate 102, the connection of the gates 124/125 (G) of the first TFET 163 and the second TFET 165 via the contact 126*a* to a voltage input (Vin), and the connection of the drains 112' (D) and 122' (D) of the first TFET 163 and the second TFET 165, respectively, via contact 126*b* to a voltage output (Vout).

Electrical connections may be made to the TFET inverter 100' shown in FIG. 38 similar to the arrangement of electrical connections of the semiconductor device 100 illustrated in FIG. 13. Again, the schematic 136 shown in FIG. 12 may be referred to for the electrical connections of the TFET inverter 100', in some embodiments. Contact 140*a* shown in FIG. 13 comprises a voltage supply (Vdd) contact that may be coupled to the source 112' (S) of the first TFET 163 shown in FIG. 38 by a portion of the semiconductive material 106 of the substrate 102. Contact 140*b* shown in FIG. 13 comprises a ground (GND) contact that may be coupled to the source 122' (S) of the second TFET 165 shown in FIG. 38. Contact 140*c* shown in FIG. 13 comprises a voltage input (Vin) contact that may be coupled to the gates 124/125 (G) of the first TFET 163 and the second TFET 165 by contact 126*a* shown in FIG. 38. Contact 140*d* shown in FIG. 13 comprises a voltage output (Vout) contact that may be coupled to the drains 112' (D) and 122' (D) of the first TFET 163 and the second TFET 165 shown in FIG. 38, respectively.

Figure 39:
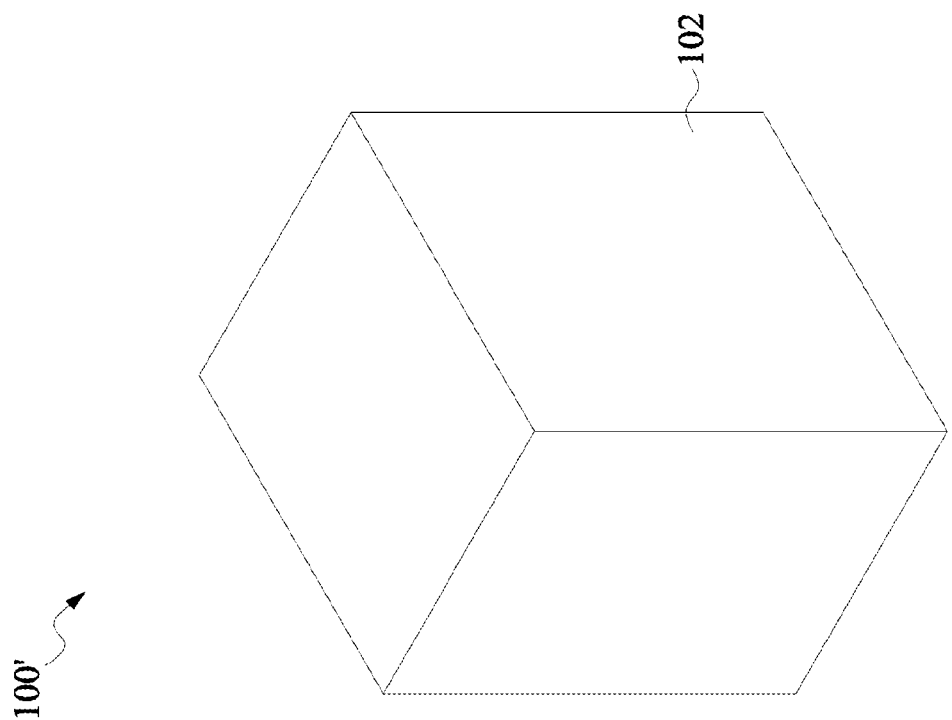

FIGS. 39 through 42, 43A through 43C, 44A through 44C, 45A through 45C, 46A through 46C, 47A through 47C, 48A through 48C, 49A through 49C, 50A through 50C, 51A through 51C, 52A through 52C, 53A through 53C, and 54A through 54C are perspective and cross-sectional views that illustrate an inverter 100' at various stages of manufacturing in accordance with some embodiments. Referring next to FIG. 39, a substrate 102 is provided. The substrate 102 comprises similar materials previously described herein. In some embodiments, the substrate 102 may comprise a Si wafer or substrate, a SiGe wafer or substrate, an SOI substrate, a strained SOI (SSOI) substrate, a germanium on insulator (GOI) substrate, or other types of substrates, as examples.

Figure 40:
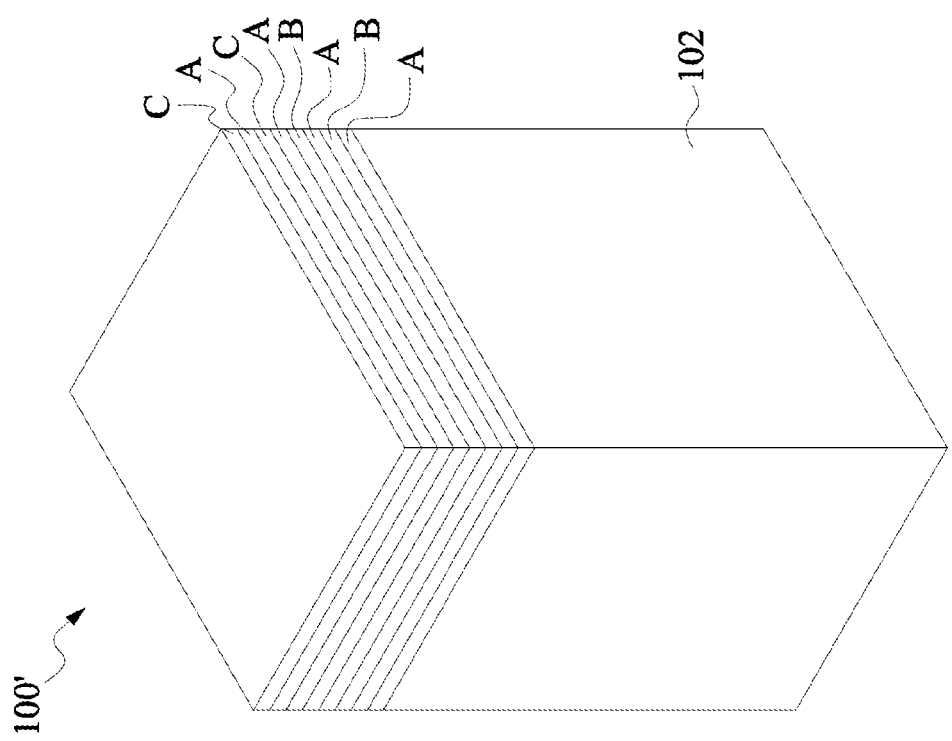

In FIG. 40, a plurality of alternating semiconductive material layers A, B, and C are sequentially formed over the substrate 102. The plurality of alternating semiconductive material layers A, B, and C are formed using epitaxial growth processes in some embodiments. The plurality of alternating semiconductive material layers A, B, and C may also be formed using other methods.

The alternating semiconductive material layers are labelled A, B, and C in some of the embodiments shown in FIGS. 40 through 42, 43A through 43C, 44A through 44C, 45A through 45C, 46A through 46C, 47A through 47C, 48A through 48C, 49A through 49C, 50A through 50C, 51A through 51C, 52A through 52C, 53A through 53C, and 54A through 54C. The alternating semiconductive material layers A, B, and C may comprise similar materials, dimensions, and properties as described herein for the alternating semiconductive material layers 160a, 162a, 160b, 162b, 160c, and 162c and alternating semiconductive material layers 162d, 164a, 162e, 164b, 162f, and 164c: for simplicity in the drawings, A, B, and C are used.

Figures 54B, 54C:
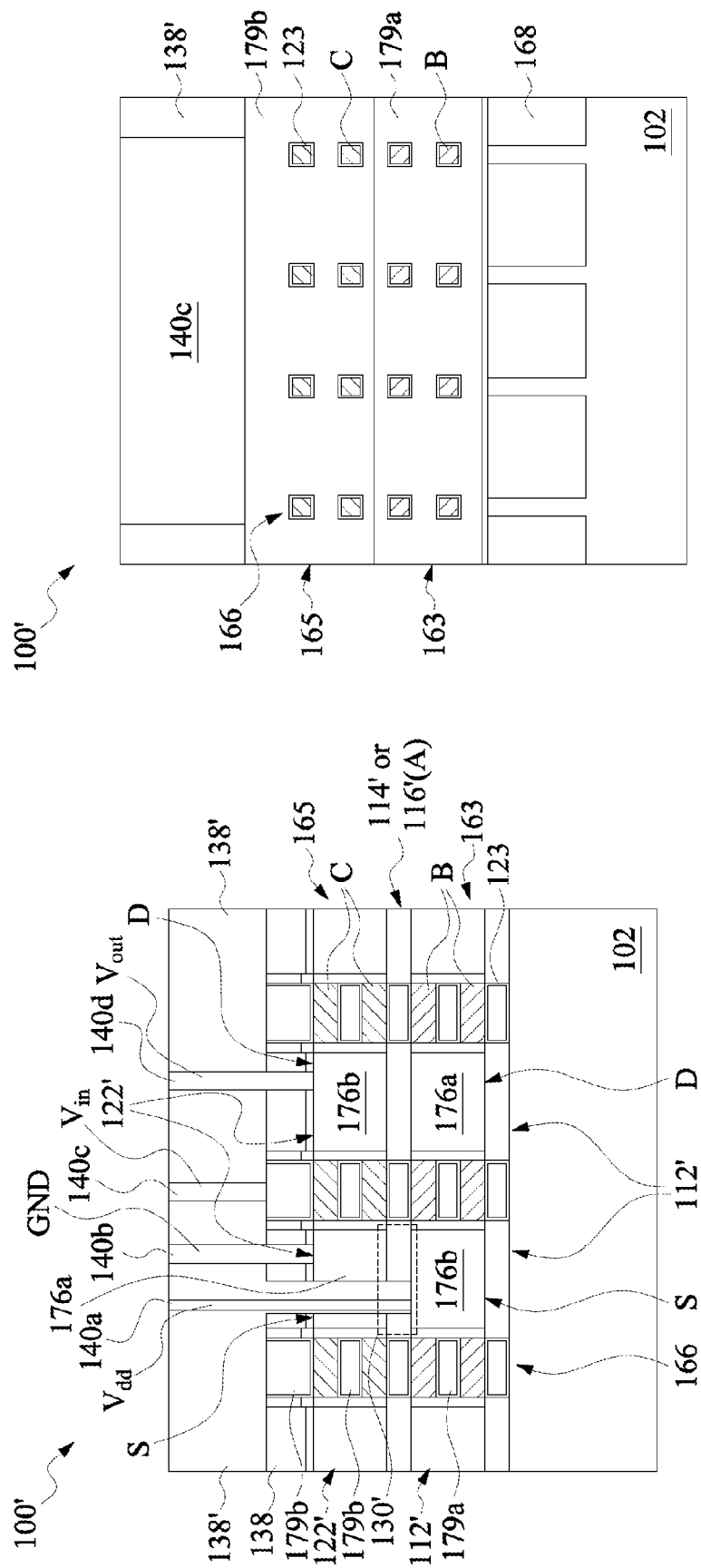

The semiconductive material layers A comprise a similar function as alternating semiconductive material layers 160a, 160b, and 160c that have portions that comprise first sacrificial layers and alternating semiconductive material layers 164a, 164b, and 164c that have portions that comprise second sacrificial layers in some of the embodiments shown in FIGS. 34 through 38, for example. The semiconductive material layer A disposed between a semiconductive material layer B and a semiconductive material layer C also functions as and comprises a second semiconductive material 114' or 116' in accordance with some embodiments, as illustrated in FIG. 44B and 54B. The semiconductive material layers B comprise a similar function as alternating semiconductive material layers 162a, 162b, and 162c that are used to form the channel region 108' of a first TFET 163. The semiconductive material layers C comprise a similar function as alternating semiconductive material layers 162d, 162e, and 162f that are used to form the channel region 118' of a second TFET 165. The alternating semiconductive material layers A, B, and C may also comprise other functions.

Two semiconductive material layers B and two semiconductive material layers C are shown in FIGS. 40 through 42, 43A through 43C, 44A through 44C, 45A through 45C, 46A through 46C, 47A through 47C, 48A through 48C, 49A through 49C, 50A through 50C, 51A through 51C, 52A through 52C, 53A through 53C, and 54A through 54C; however, one or more semiconductive material layers B and one or more semiconductive material layers C may also be used, such as three or more semiconductive material layers B and C. Different numbers of semiconductive material layers B and semiconductive material layers C may be used, depending on the number of channels to be formed in the channel regions 108' and 118' of the first TFET 163 and the second TFET 165, respectively.

Figure 41:
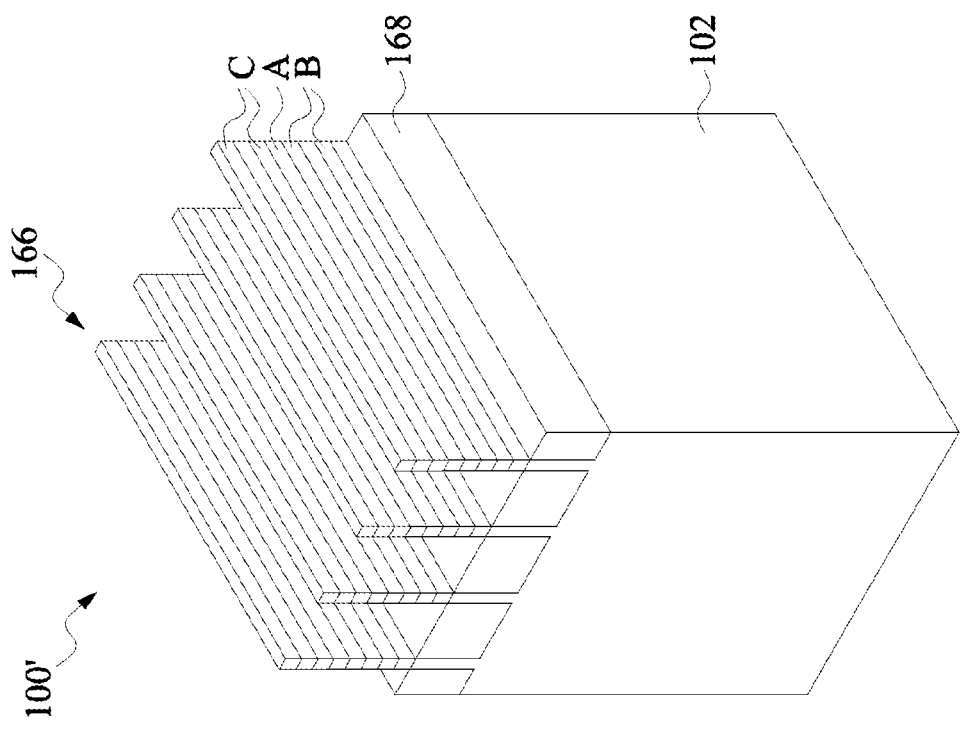

Referring next to FIG. 41, the plurality of alternating semiconductive material layers A, B, and C and an upper portion of the substrate 102 (e.g., an upper portion of the semiconductive material 106 of the substrate 102, not labelled) are patterned using a lithography process to form a plurality of fins. The patterned plurality of alternating semiconductive material layers A, B, and C and substrate 102 is also referred to herein as a plurality of channel fins 166, for example. A masking material (not shown) such as a photoresist is formed over the top semiconductive material layer C, and the masking material is patterned using lithography with a desired pattern of the plurality of channel fins 166. The masking material is then used as a mask during an etch process, forming the channel fins 166 in the plurality of alternating semiconductive material layers A, B, and C and the substrate 102. The masking material is then removed. The patterning process of the plurality of alternating semiconductive material layers A, B, and C and the substrate 102 comprises a FinFET minimum dimension or critical dimension (OD) patterning process in some embodiments, for example.

Figure 42:
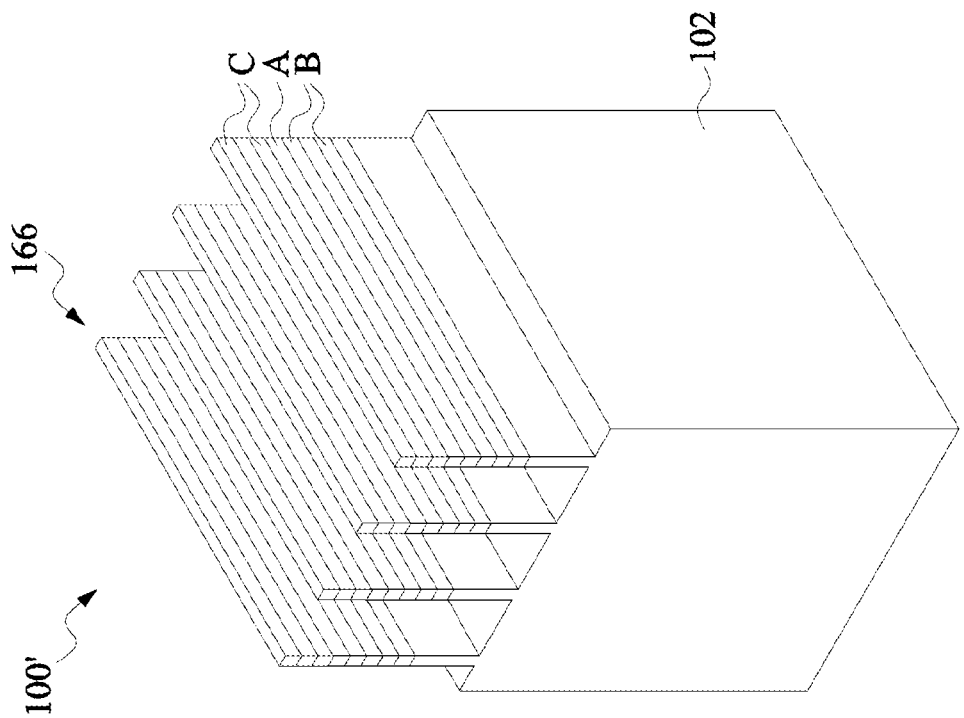

In FIG. 42, shallow trench isolation (STI) regions 168 are formed between the channel fins 166. The STI region 168 comprise an insulating material such as $SiO_2$, $Si_xN_y$, SiON, SiCN, other insulating materials, or combinations and multiple layers thereof, as examples. The STI region 168 may be formed using CVD, PVD, flowable-CVD (FCVD), or other methods, as examples. The STI region 168 material may be blanket deposited over the top of the channel fins 166, and etched back using an etch process to reduce the thickness of the STI region 168 to a predetermined height along the channel fins 166, for example. The STI regions 168 comprise fins of the STI regions 168 disposed between adjacent channel fins 166.

In FIGS. 43A through 43C, 44A through 44C, 45A through 45C, 46A through 46C, 47A through 47C, 48A through 48C, 49A through 49C, 50A through 50C, 51A through 51C, 52A through 52C, 53A through 53C, and 54A through 54C, the "A" drawings illustrate a perspective view of a TFET inverter 100' at various stages of manufacturing, the "B" drawings illustrate a cross-sectional view of the "A" drawings along a channel fin 166, and the "C" drawings illustrate a cross-sectional view of the "A" drawings along a fin of a dummy semiconductive material 172. Each "B" and "C" drawing shows a view of the respective "A" drawing at that particular stage of the manufacturing process, in accordance with some embodiments.

Figure 43C:
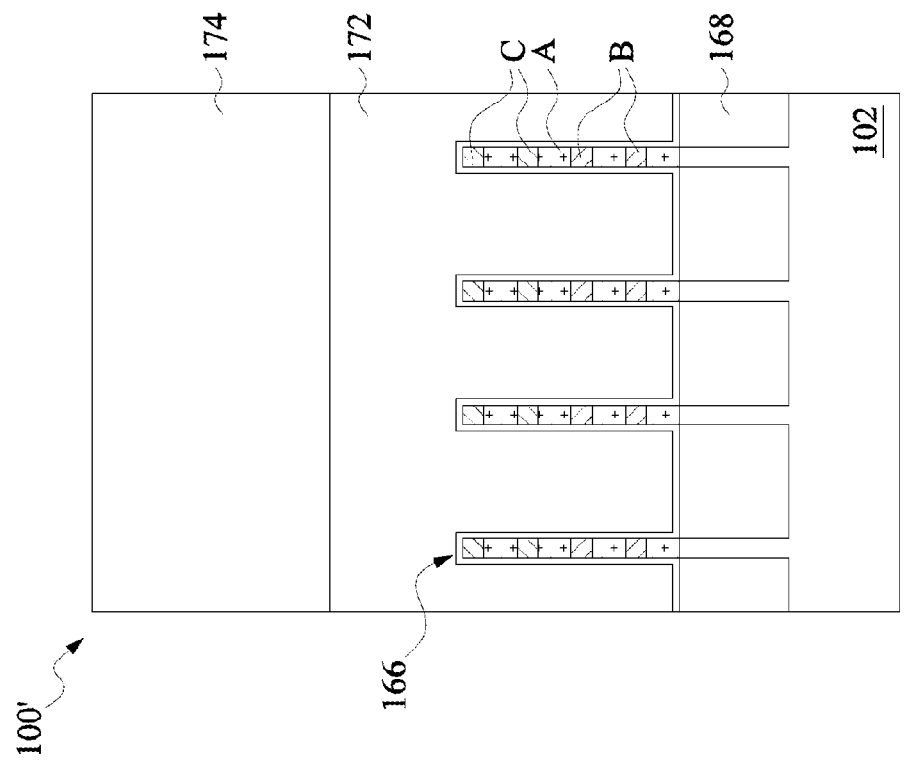
Figure 43B:
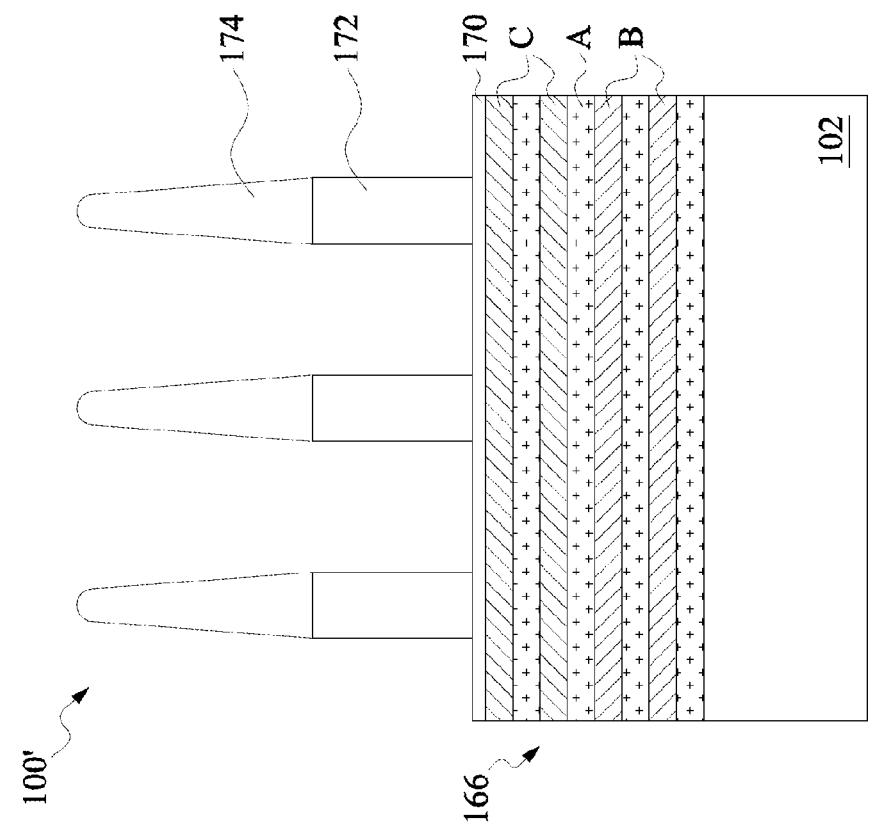

In FIGS. 43A, 43B, and 43C, a dummy insulator 170 is formed over the channel fins 166 and the STI regions 168. The dummy insulator 170 comprises an oxide such as $SiO_2$ or SiON comprising a thickness of about 1 nm to about 5 nm. The dummy insulator 170 may be formed by CVD, ALD, PECVD, or PEALD for example. The dummy insulator 170 may also comprise other materials, dimensions, and formation methods.

A dummy semiconductive material 172 is formed over the dummy insulator 170. The dummy semiconductive material 172 may comprise polycrystalline silicon comprising a thickness of about 50 nm to about 100 nm above a top surface of the plurality of channel fins 166. The dummy semiconductive material 172 may be formed by CVD or rapid thermal CVD (RTCVD), for example. The dummy semiconductive material 172 may also comprise other materials, dimensions, and formation methods.

A hard mask 174 is formed over the dummy semiconductive material 172. The hard mask 174 may comprise an oxide such as $SiO_2$ or $Si_3N_4$ comprising a thickness of about 50 nm to about 100 nm. The hard mask 174 may be formed by CVD, for example. The hard mask 174 may also comprise other materials, dimensions, and formation methods.

The hard mask 174 and the dummy semiconductive material 172 are patterned using a lithography process to form a plurality of fins of the dummy semiconductive material 172 and the hard mask 174. A photoresist, not shown, may be formed over the hard mask 174, and the photoresist may be patterned with a desired pattern for the dummy semiconductive material 172 and the hard mask 174. The photoresist is used as an etch mask for an etch process for the hard mask 174, and the photoresist, or both the photoresist and the hard mask 174, are used as an etch mask for an etch process for the dummy semiconductive material 172. The photoresist is then removed, or the photoresist may be consumed during the etch process for the dummy semiconductive material 172. The top portions of the dummy semiconductive material 172 may comprise a slightly tapered shape, as illustrated in FIGS. 43A and 43B. The top portions of the dummy semiconductive material 172 may also have substantially straight sidewalls, not shown. Forming the dummy insulator 170 and the fins of the dummy semiconductive material 172 and the hard mask 174 comprises a FinFET dummy poly gate process in some embodiments, for example.

The fins of the dummy semiconductive material 172 and the hard mask 174 are disposed substantially perpendicular to the channel fins 166 over the substrate 102, as illustrated in FIG. 43C. The dummy insulator 170 is disposed on the top surfaces of the channel fins 166, which is more clearly visible in FIGS. 43B and 43C. A portion of the fins of the dummy semiconductive material 172 and the hard mask 174 is disposed on the top surfaces of the dummy insulator 170 disposed on the top surfaces of the channel fins 166. The dummy insulator 170 is also disposed on sidewalls of the channel fins 166 and on top surfaces of the STI regions 168, as shown in FIG. 43C. A portion of the dummy semiconductive material 172 is disposed between adjacent channel fins 166 over the dummy insulator 170 on the sidewalls of the channel fins 166, also shown in FIG. 43C.

A lightly doped drain (LDD) implantation process is then performed, which lightly implants exposed portions of the channel fins 166 that are not covered by the fins of dummy semiconductive material 172 and the hard mask 174, as shown in FIGS. 44A and 44B. The view illustrated in FIG. 44C along the fin of dummy semiconductive material 172 and hard mask 174 remains unchanged. Two p-LDD implantation processes are performed: one adapted to lightly p dope an upper portion of the channel fins 166 in regions of semiconductive material layers C and A, and another to lightly p dope a lower portion of the channel fins 166 in regions of semiconductive material layers B and A. A semiconductive material layer A disposed between semiconductive material layers B and C is not implanted, in some embodiments. Semiconductive material layer A disposed between semiconductive material layers B and C functions as a second semiconductive material 114' or 116' that formed a junction isolation region 130' (see FIG. 54B) between the sources 112' (S) and 122' (S) of the first TFET 163 and the second TFET 165 in some embodiments, for example. The parameters of the implantation processes are controlled to achieve a desired depth of the implantation process, such as the power, dosage, dosage rate, temperature, and/or implantation angle, for example. The p-LDD implantation processes form a p type LDD implantation region 175a in an upper portion of the channel fins 166 where a source 122' (S) of a second TFET 165 (not shown in FIGS. 44A through 44C: see FIG. 54B) will be formed, and also form a p type LDD implantation region 175a in an lower portion of the channel fins 166 where a drain (D) of a first TFET 163 will be formed (see also FIG. 54B).

The LDD implantation process also includes two n-LDD implantation processes: one adapted to lightly n dope an upper portion of the channel fins 166 in regions of semiconductive material layers B and A, and another to lightly n dope a lower portion of the channel fins 166 in regions of semiconductive material layers C and A. A semiconductive material layer A disposed between the B and C is not implanted. The parameters of the implantation processes are controlled to achieve a desired depth of the implantation process, such as the power, dosage, dosage rate, temperature, and/or implantation angle for example. The n-LDD implantation processes form an n type LDD implantation region 175b in an upper portion of the channel fins 166 where a drain 122' (D) of a second TFET 165 (not shown in FIGS. 44A through 44C: see FIG. 54B) will be formed, and also form an n type LDD implantation region 175b in a lower portion of the channel fins 166 where a source (S) of a first TFET 163 will be formed (see also FIG. 54B).

The implantation levels for the LDD implantation processes comprises using dopant concentration levels of about $1\times10^{18}$ cm$^{-3}$ to about $5\times10^{20}$ cm$^{-3}$, for example. Other dopant concentration levels may also be used.

To complete the implantation processes for the sources and drains of the TFETs 163 and 165, a source/drain implantation process is next performed to form P+ implantation regions 176a and N+ implantation regions 176b, as illustrated in FIGS. 45A and 45B. The view illustrated in FIG. 45C along the fin of dummy semiconductive material 172 and hard mask 174 remains unchanged. A portion of the p type LDD implantation regions 175a and the n type LDD implantation regions 175b is not implanted during the source/drain implantation process, and thus, a portion of the p type LDD implantation regions 175a and the n type LDD implantation regions 175b is left residing within the channel fins 166, as illustrated in FIG. 45B. A semiconductive material layer A disposed between the B and C is not implanted, in some embodiments.

Before the source/drain implantation process, a sidewall spacer 177 material is formed over exposed surfaces of the device, such as the fins comprising the dummy semiconductive material 172 and the hard mask 174 and the dummy insulator 170. The sidewall spacer 177 material may comprise $Si_xN_y$, SiON, or other insulating materials that may be etched selectively to the material of the dummy insulator 170. The sidewall spacer material may be substantially conformal as-deposited, for example. The sidewall spacer material is etched using an anisotropic etch process to leave sidewall spacers 177 disposed on sidewalls of the dummy semiconductive material 172 and on lower portions of the hard mask 174 in some embodiments. The sidewall spacers 177 reside over a portion of the dummy insulator 170 proximate the dummy semiconductive material 172, as illustrated in FIG. 45B. The sidewall spacers 177 may have a thickness proximate the dummy insulator 170 of about 1 nm to about 5 nm, for example. The sidewall spacer 177 thickness may also comprise other values.

An etch process is used to remove the dummy insulator 170 from exposed surfaces, which is also illustrated in FIGS. 45A and 45B. The etch process may comprise an etch process that is selective to the material of the dummy insulator 170, for example. The materials of the sidewall spacers 177 and the dummy insulator 170 are different in some embodiments, so that the sidewall spacers 177 protect the dummy insulator 170 material from being etched beneath the sidewall spacers 177, in some embodiments. Portions of the dummy insulator 170 are left remaining beneath the dummy semiconductive material 172 and the sidewall spacers 177, as illustrated in FIG. 45B.

The source/drain implantation processes used to form the P+ implantation regions 176a and the N+ implantation regions 176b implant exposed portions of the channel fins 166 with the P+ and N+ dopants that are not covered by the fins of dummy semiconductive material 172 and the hard mask 174 or covered by the sidewall spacers 177. The sidewall spacers 177 prevent the source/drain implantation processes from implanting portions of the LDD implantation regions 175a and 175b proximate the channel fin 166 material beneath the sidewall spacers 177, for example. An upper and central portion of the p type LDD implantation regions 175a and the n type LDD implantation regions 175b are doped with stronger P+ and N+ dopants, respectively, to form the P+ implantation regions 176a and N+ implantation regions 176b, for example.

The dopant processes for the source/drain implantation processes comprise using similar impurity types and concentration levels as previously described herein for FIGS. 3 for a P+ implantation process used to form P+ source and drain regions 112 of a PFET 132 (see FIG. 10) and for FIG. 5 for an N+ implantation process used to form N+source and drain regions 122 of an NFET 134 (see also FIG. 10) in some embodiments, for example. Other impurity types and concentration levels may also be used to form the P+ implantation regions 176a and N+ implantation regions 176b.

Note that the p type LDD implantation regions 175a and the n type LDD implantation regions 175b are not labelled in FIGS. 46B, 47B, 48B, 49B, 50B, 51B, 52B, 53B, or 54B to simplify the drawings. However, the p type LDD implantation regions 175a and the n type LDD implantation regions 175b remain within the TFET inverter 100' in some embodiments.

Figure 46C:
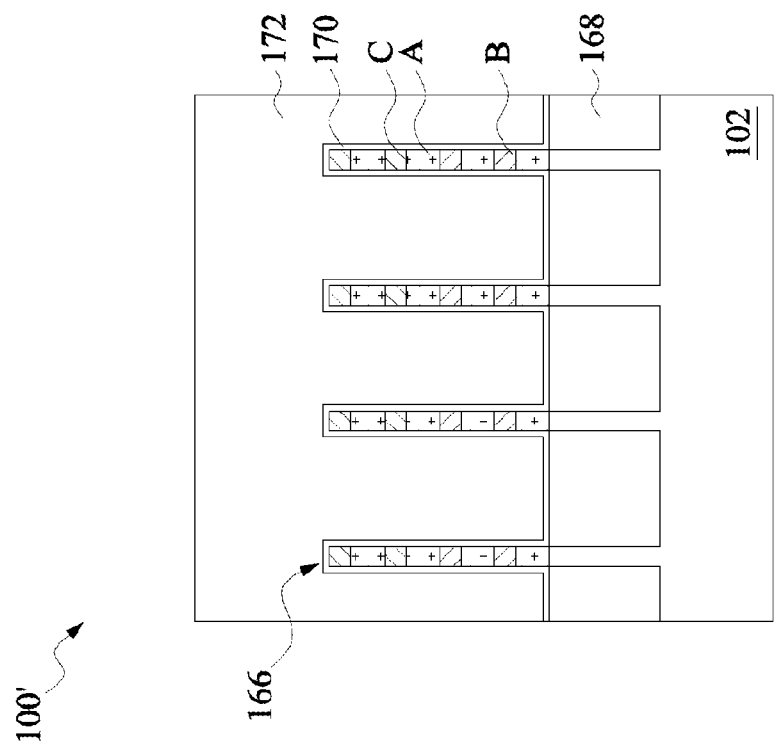
Figure 46B:
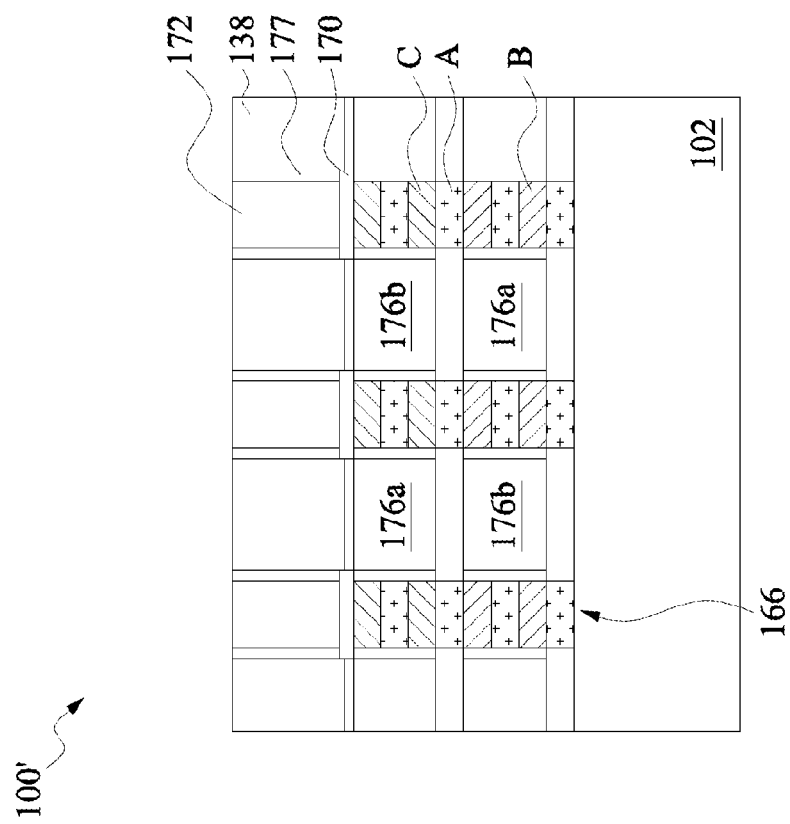

In FIGS. 46A, 46B, and 46C, an insulating material 138 is formed and is planarized. The insulating material 138 may comprise an ILD comprising $SiO_2$ in some embodiments. The insulating material 138 may also comprise other types of materials and insulating structures. The insulating material 138 is removed from over a top surface of the fins of the dummy semiconductive material 172 using a planarization process, such as a CMP process. The hard mask 174 may be removed during the planarization process, or the hard mask 174 may be removed before the insulating material 138 is formed.

Figure 47C:
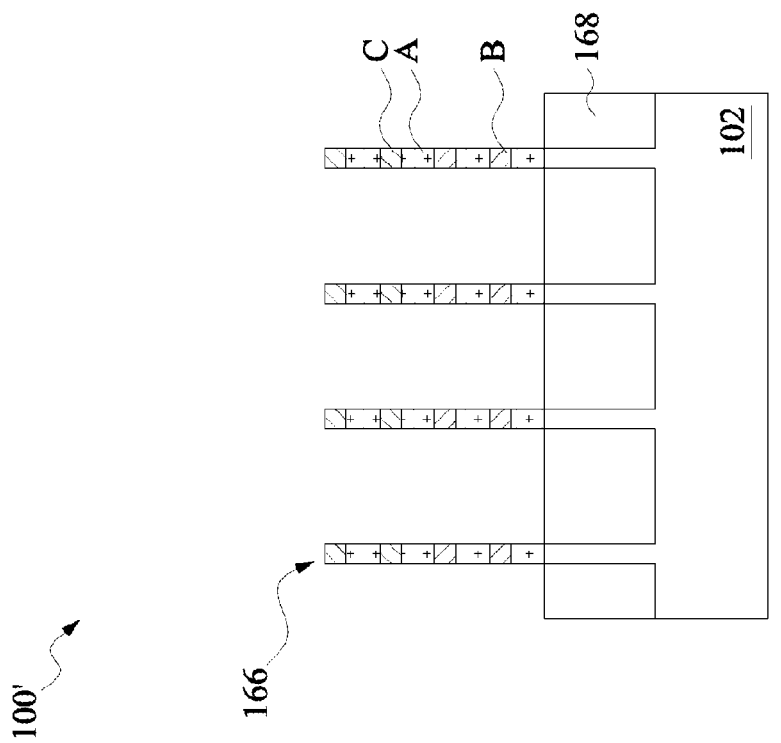
Figure 47B:
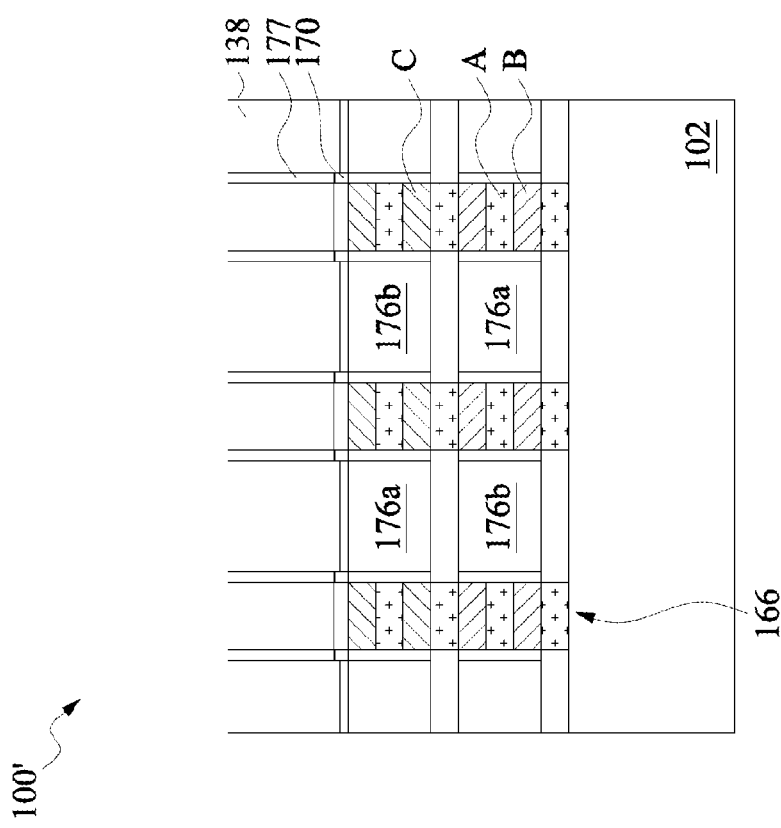

Next, the dummy semiconductive material 172 is removed using an etch process selective to the material of the dummy semiconductive material 172, as shown in FIGS. 47A, 47B, and 47C. Then exposed portions of the remaining dummy insulator 170 are removed, which is also shown in FIGS. 47A, 47B, and 47C. A small portion of the dummy insulator 170 may be left remaining beneath the sidewall spacers 177 after the etch process for the dummy insulator 170, as illustrated in FIG. 47B.

In FIGS. 48C, 48B, and 48C, semiconductive material layer A comprising portions that comprise a sacrificial material is removed using an etch process selective to the material of semiconductive material layer A. Portions of semiconductive material layer A are left remaining beneath the insulating material 138. The portions of semiconductive material layer A disposed between sources of the first TFET and the second TFET comprise a second semiconductive material 114' or 116' that form isolation junction regions 130' (see FIG. 54B), which will be described further herein.

Referring next to FIGS. 49A, 49B, and 49C, a gate dielectric 123 is formed over exposed surfaces, such as semiconductive material layers B and C, as shown in FIG. 49C. The gate dielectric 123 is also formed on top surfaces of insulating material 138, on the sidewall spacers 177, and other exposed surfaces, as shown in FIG. 49B. A first gate 179a material is formed over the gate dielectric 123, which is also illustrated in FIGS. 49A, 49B, and 49C. The first gate 179a material may comprise TiN, TaN, TiC, TiAlC, or W that is formed by PVD, ALD, or CVD in some embodiments. The first gate 179a material may also comprise other materials and formation methods. Excess portions of the first gate 179a material may extend over the gate dielectric 123 disposed on the top surfaces of insulating material 138, as-deposited.

An etch process is then used to remove a top portion of the first gate 179a material from above the semiconductive material layers B, as shown in FIGS. 50A, 50B, and 50C. The first gate 179a material left remaining forms the gate 179a of the first TFET 163 (see first TFET 163 shown in FIG. 54B). The formation of the first gate 179a comprises a self-aligned process in some embodiments, so that there is advantageously not a need for an additional lithography mask. The etch process for the first gate 179a may comprise a timed etch or an etch process with an end-point detector, as examples. The semiconductive material layers B comprise the channel regions of the first TFET 163.

Figures 51B, 51C:
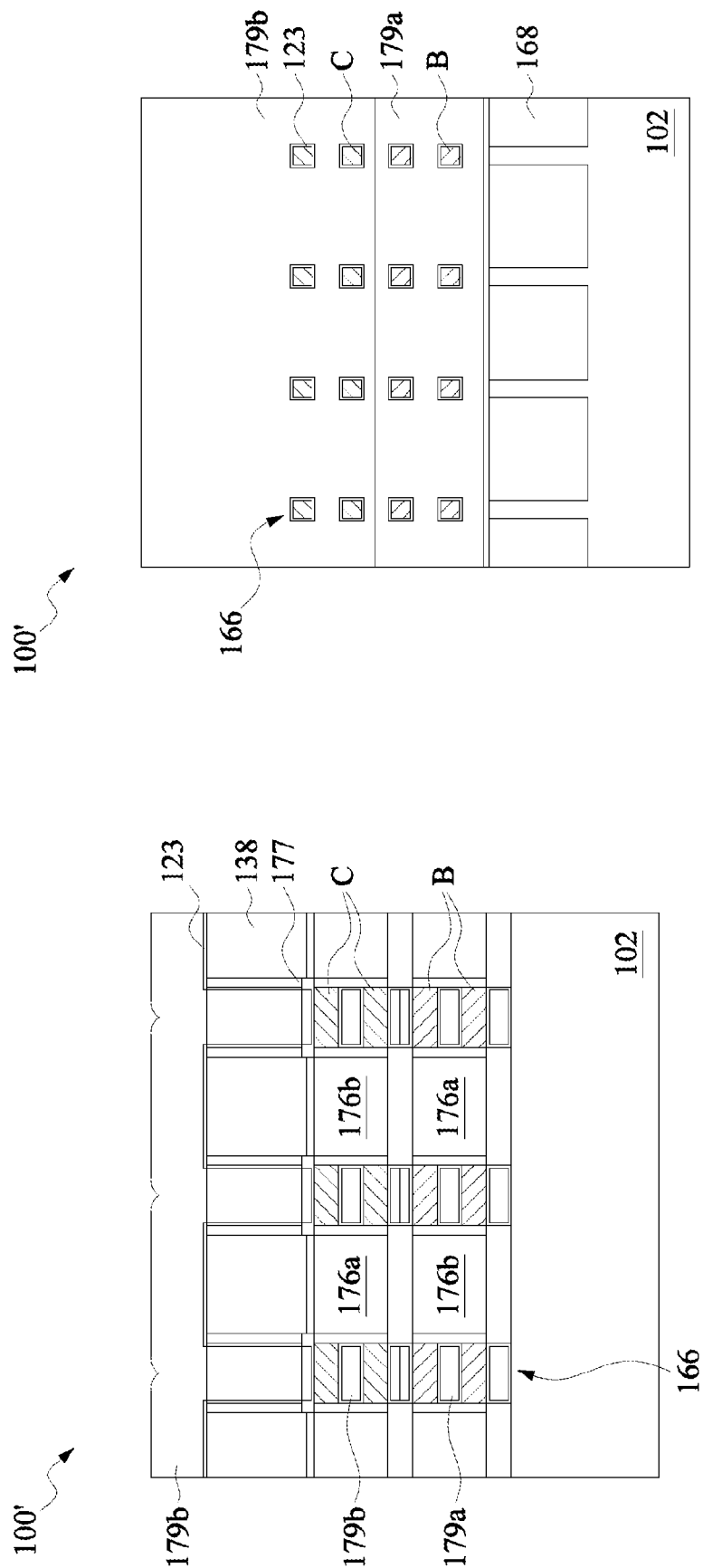

Next, a second gate 179b material is formed over the first gate 179a, as shown in FIGS. 51A, 51B, and 51C. The second gate 179b material may comprise TiN, TaN, TiC, or TiAlC that is formed by PVD, ALD, or CVD in some embodiments. The second gate 179b material may also comprise other materials and formation methods. Excess portions of the second gate 179b material may extend over the gate dielectric 123 disposed on the top surfaces of insulating material 138, as-deposited, as illustrated in FIGS. 51A, 51B, and 51C.

Figure 52C:
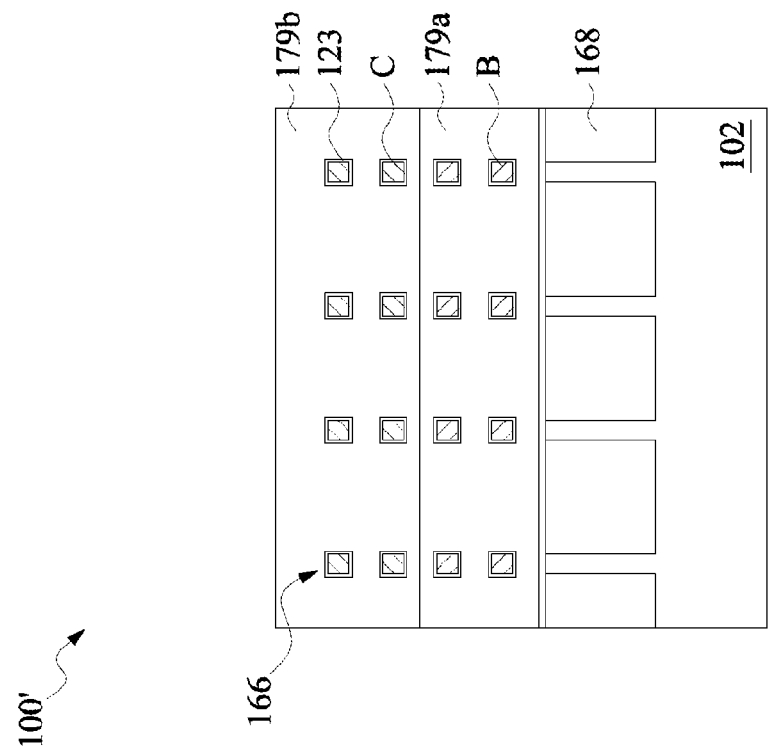
Figure 52B:
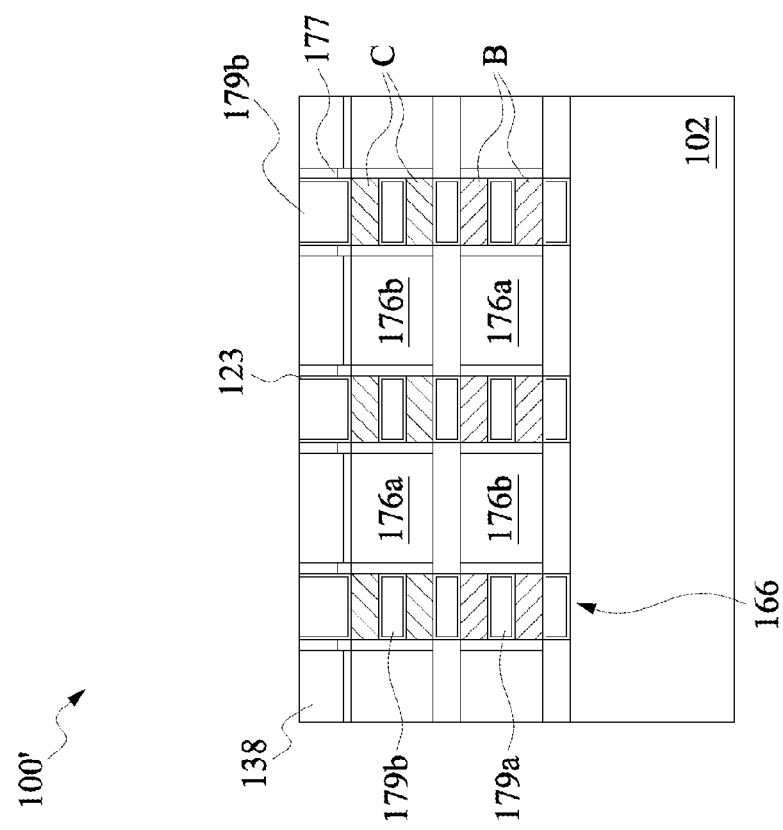

The second gate 179b material is then planarized using a CMP process to remove the second gate 179b material from top surfaces of the insulating material 138 and for the second gate 179b, as illustrated in FIGS. 52A, 52B, and 52C. The first gate 179b material left remaining forms the gate 179b of the second TFET 165 (see second TFET 165 shown in FIG. 54B). The formation of the second gate 179b also comprises a self-aligned process in some embodiments, so that there is advantageously not a need for an additional lithography mask. The second gate 179b is coupled to and is adjacent the first gate 179b in accordance with the schematic 136 shown in FIG. 12 in some embodiments, for example.

In FIGS. 49A, 49B, 49C, 50A, 50B, 50C, 51A, 51B, 51C, 52A, 52B, and 52C, a dual work function metal gate process is illustrated, in accordance with some embodiments. In some embodiments, one gate material may be used. For example, in FIGS. 49A, 49B, and 49C the first gate 179a material may be planarized and used for the gate of both the first TFET 163 and the second TFET 165. Advantageously, whether one gate material or two gate materials are used, due to the structure of the vertically stacked TFETs 163 and 165 that comprise FinFET devices, there is no need for a masking or etching process to pattern the gate material(s); rather, the metal gate patterning process is self-aligned.

Figures 53B, 53C:
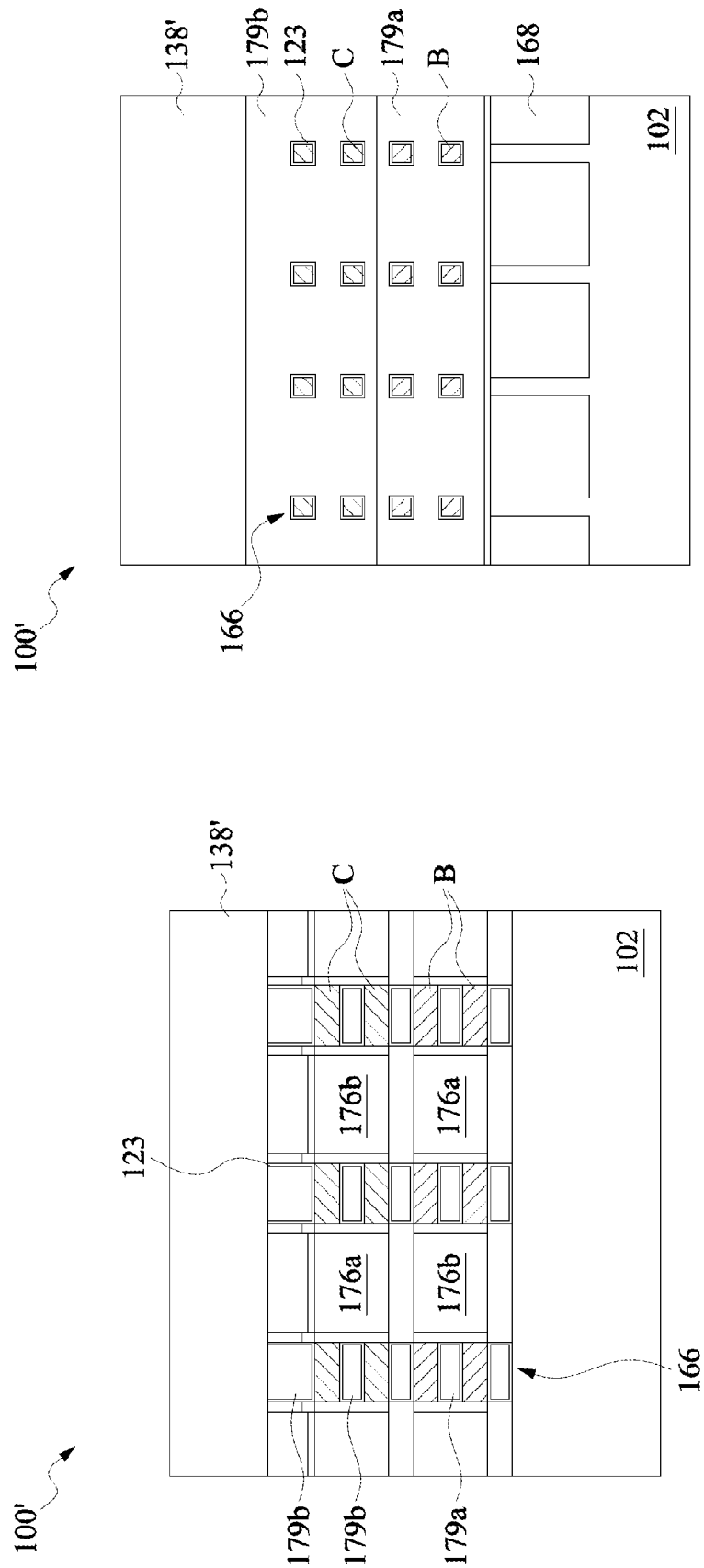

In FIGS. 53A, 53B, and 53C, an insulating material 138' is formed over the insulating material 138 and a top surface of the second gate 179b. The insulating material 138' may comprise a similar material as described for insulating material 138, for example. In some embodiments, the insulating material 138' comprises a back-end-of the line (BEOL) ILD, for example. The insulating material 138' may comprise $SiO_2$ having a thickness of about 50 nm to about 200 nm, for example. The insulating material 138' may also comprise other materials and dimensions.

An interconnection process for the TFET inverter 101' is then performed, as illustrated in FIGS. 54A, 54B, and 54C. The insulating material 138' is patterned with a pattern for contacts 140a, 140b, 140c, and 140d, and the patterns are filled with a conductive material to form the 140a, 140b, 140c, and 140d which have been previously described herein. The contacts 140a, 140b, 140c, and 140d may be formed using a damascene technique, such as a single damascene or a dual damascene process, as examples. The contacts 140a, 140b, 140c, and 140d may also be formed using other methods. Other portions of the TFET inverter 101' than the insulating material 138' may be patterned for the formation of contacts 140a, 140b, and 140d, for example, as illustrated, such as the source 122' (S) of the second TFET 165 for contact 140a and insulating material 138' for contacts 140b and 140d. The manufacturing process for the TFET inverter 101' is then continued to complete the device, such as forming an interconnect structure including conductive lines and vias over the insulating material 138' and contacts 140*a*, 140*b*, 140*c*, and 140*d*, forming contact pads over the interconnect structure, and singulating the devices into individual integrated circuit dies.

The TFET inverter 101' illustrated in FIG. 54B includes a first TFET 163 having an N+ doped source 112' (S) and a P+ doped drain 112' (D). Channel regions of the first TFET 163 comprise multiple channels comprising the semiconductive material layers B disposed between the source 112' (S) and drain 112' (D). The TFET inverter 101' also includes a second TFET 165 having a P+ doped source 122' (S) and an N+ doped drain 122' (D). Channel regions of the second TFET 165 comprise multiple channels comprising the semiconductive material layers C disposed between the source 122' (S) and drain 122' (D). A second semiconductive material layer 114' or 116' is comprised of a portion of a semiconductive material layer A that was disposed between a semiconductive material layer B and a semiconductive material layer C (see FIGS. 47B and 48B). A portion of the second semiconductive material layer 114' or 116' comprises a junction isolation region 130' disposed between a source 112' (S) of the first TFET 163 and a source 122' (S) of the second TFET 165.

In some embodiments illustrated in FIGS. 39 through 42, 43A through 43C, 44A through 44C, 45A through 45C, 46A through 46C, 47A through 47C, 48A through 48C, 49A through 49C, 50A through 50C, 51A through 51C, 52A through 52C, 53A through 53C, and 54A through 54C, forming alternating semiconductive material layers A and B comprises forming a first semiconductive material. The semiconductive material layers A and B comprise a plurality of layers of the first semiconductive material in some embodiments, for example. The plurality of layers of the first semiconductive material comprises alternating layers of a first material comprised of semiconductive material layer A and a second material comprised of semiconductive material layer B, the second material being different than the first material. The first material comprised of semiconductive material layer A includes a portion that comprises a sacrificial material disposed between the source 112' (S) and the drain 112' (D) of the first TFET 163. In some embodiments, forming alternating semiconductive material layers A and C comprises forming a third semiconductive material. The alternating semiconductive material layers A and C comprise a plurality of layers of the third semiconductive material in some embodiments, for example. The plurality of layers of the third semiconductive material comprises alternating layers of a first material comprised of semiconductive material layer A and a third material comprised of semiconductive material layer C, the third material being different than the first material. The first material comprised of semiconductive material layer A includes a portion that comprises a sacrificial material disposed between the source 122' (S) and the drain 122' (D) of the second TFET 165. In some embodiments, after removing the sacrificial material of the first material comprised of semiconductive material layers A, the second material comprised of semiconductive material layer B left remaining of the first TFET 163 comprises a channel region 108' comprising a plurality of channels disposed between the source 112' (S) and the drain 112' (D) of the first TFET 163, and the third material comprised of semiconductive material layer C left remaining of the second TFET 163 comprises a channel region 118' comprising a plurality of channels disposed between the source 122' (S) and the drain 122' (D) of the second TFET 165.

Figure 55:
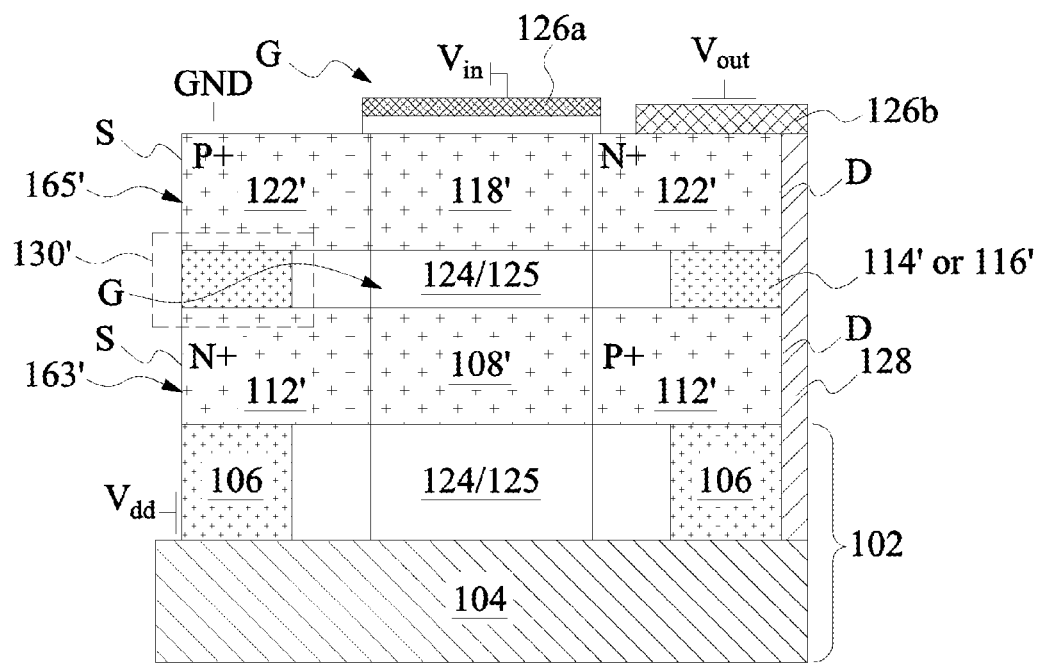
FIG. 55 shows a cross-sectional view of an inverter in accordance with some embodiments.

FIG. 55 shows a cross-sectional view of an inverter 100' comprising TFETs 163 and 165 in accordance with some embodiments. The first TFET 163 and the second TFET 165 each include a channel region 108' and 118' comprising a single channel, respectively. A junction isolation region 130' is disposed within the second semiconductive material 114' or 116' between the sources 112' (S) and 122' (S) of the first TFET 163 and the second TFET 165, respectively. The inverter 100' may be manufactured similar to the methods illustrated in some of the embodiments shown in FIGS. 1 through 11 or FIGS. 14 through 17, as examples, with the primary differences in the manufacturing methods of the inverter 100' from the manufacturing methods of the semiconductor device 100 being the different doping of the source 112' (S) and drain 112' (D) of the first TFET 163, the different doping of the source 122' (S) and drain 122' (D) of the second TFET 165, and the inclusion of one semiconductive material 114' or 116' between the first TFET 163 and the second TFET 165, rather than two semiconductive materials 114 and 116.

For example, the implantation process for the first semiconductive material 108' used to form the source 112' (S) and drain 112' (D) of the first TFET 163 may be performed after the epitaxial growth of the first semiconductive material 108 over the substrate 102, as illustrated in some of the embodiments shown in FIGS. 2 and 3 for semiconductive material 108. However, two masks 110 and two implantation processes may be used, to dope the source 112' (S) and drain 112' (D) differently. The second semiconductive material 114' or 116' is then formed using an epitaxial growth process over the first semiconductive material 108, similar to some of the embodiments shown in FIG. 4 wherein two semiconductive material 114 and 116 layers are formed. The second semiconductive material 114' or 116' may be doped as described for semiconductive materials 114 and 116. However, the second semiconductive material 114' or 116' may also be undoped in some embodiments. The third semiconductive material 118 (see the fourth semiconductive material 118 in FIG. 5) may then be epitaxially grown over the second semiconductive material 114' or 116' shown in FIG. 55 and implanted to form the source 122' (S) and drain 122' (D) of the second TFET 165, similar to some of the embodiments illustrated in FIG. 5. However, two masks 110 and two implantation processes may be used, to dope the source 122' (S) and drain 122' (D) differently within the third semiconductive material 118.

The first semiconductive material 108 and the third semiconductive material 118 are then patterned to form channel regions 108' and 118' comprised of the first semiconductive material 108 and the third semiconductive material 118, respectively, similar to some of the embodiments illustrated in FIGS. 6, 7, and 8 and as illustrated in FIG. 55. An undercut may be formed in the semiconductive material 106 of the substrate 102 and the second semiconductive material 114' or 116' during the etch process. A gate dielectric (not shown in FIG. 55) and a gate (G) 124/125 are formed and patterned, and contacts 126*a* and 126*b* are formed, similar to some of the embodiments illustrated in FIGS. 9, 10, and 11. A schematic for the TFET inverter 100' is similar to the schematic 136 shown in some of the embodiments shown in FIG. 12, wherein the PFET 132 is replaced with the first TFET 163 and the NFET 134 is replaced with the second TFET 165, for example. Contacts 140*a*, 140*b*, 140*c*, and 140*d* formed in insulating materials 138 and 138' may be formed using a similar method and structure as shown in some of the embodiments shown in FIG. 13, for example.

In other embodiments, the various implantation processes used to form the source 112' (S) and drain 112' (D) of the first TFET 163 and the source 122' (S) and drain 122' (D) of the second TFET 165 may be performed after the sequential epitaxial growth of the first semiconductive material 108, the second semiconductive material 114' or 116', and the third semiconductive material 118, as illustrated in some of the embodiments shown in FIGS. 14 through 17. The implantation processes for the various dopants may be controlled to achieve a predetermined depth within a top surface of the structure during the implantation process for the source 112' (S) and drain 112' (D) of the first TFET 163 and the source 122' (S) and drain 122' (D) of the second TFET 165, for example.

The first TFET 163 and the second TFET 165 may comprise channel regions having single channels or multiple channels in accordance with some embodiments. The first TFET 163 may comprise a channel region having a single channel, and the second TFET 165 may comprise a channel region having multiple channels. Likewise, the second TFET 165 may comprise a channel region having a single channel, and the first TFET 163 may comprise a channel region having multiple channels. In some embodiments, the first TFET 163 and the second TFET 165 may both comprise channel regions with multiple channels, with the number of channels being unequal, as another example.

Figure 56:
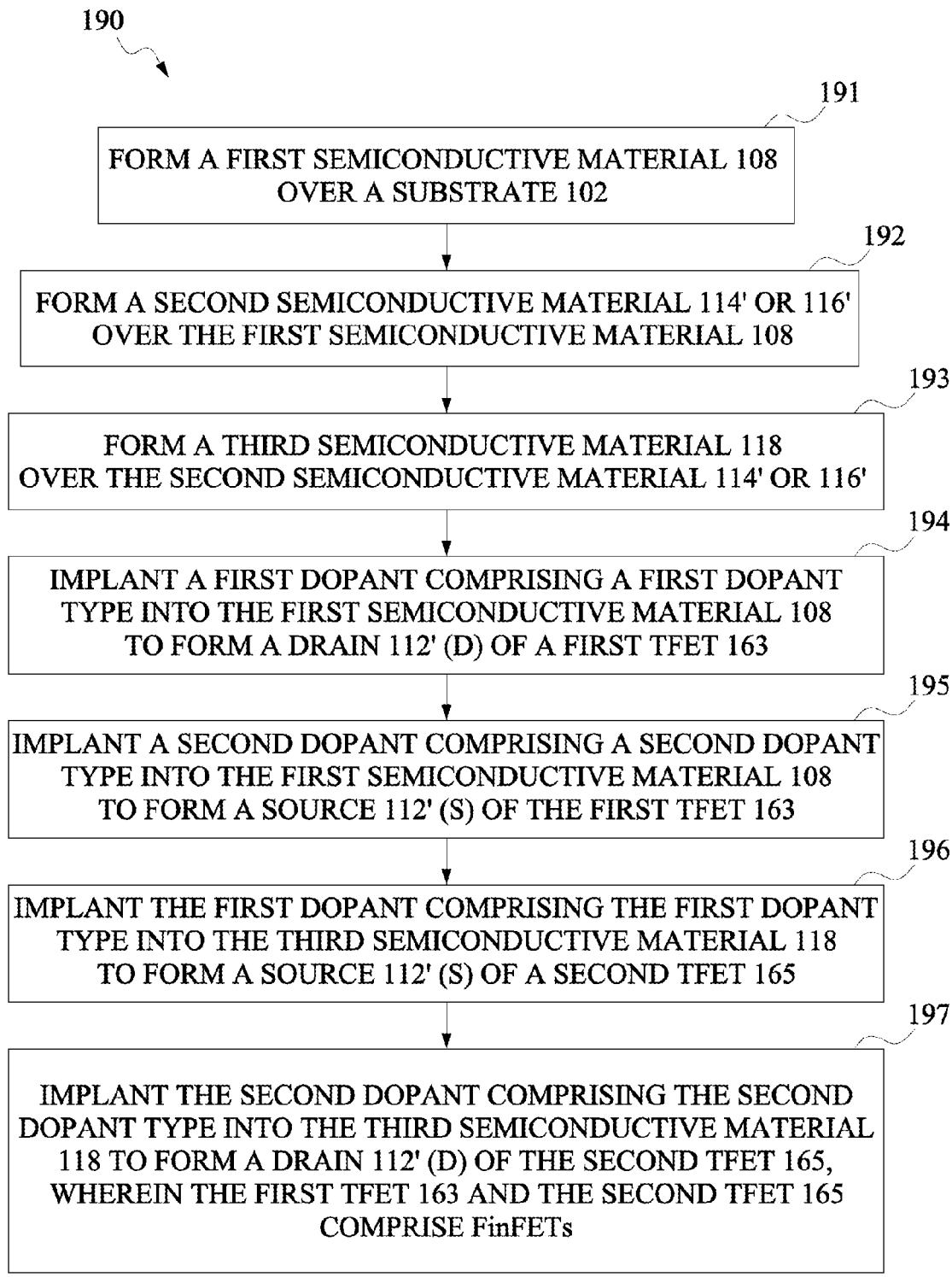
FIG. 56 is a flow chart that illustrates a method of manufacturing an inverter in accordance with some embodiments of the present disclosure.

FIG. 56 is a flow chart 190 that illustrates a method of manufacturing an inverter 100' in accordance with some embodiments of the present disclosure. Referring also to FIG. 2, in step 191, a first semiconductive material 108 is formed over a substrate 102. The first semiconductive material 108 shown in FIG. 2 later forms the channel region 108' of the first TFET 163 shown in FIG. 55 after the formation of the source and drain 112'. In step 192, a second semiconductive material 114' or 116' is formed over the first semiconductive material 108 (see also FIG. 55). In step 193, and a third semiconductive material 118 is formed over the second semiconductive material 114' or 116' (see fourth semiconductive material 118 in FIG. 5 and also FIG. 55). The third (fourth) semiconductive material 118 shown in FIG. 5 later forms the channel region 118' of the second TFET 165 shown in FIG. 55 after the formation of the source 122' and drain 122'. In step 194, a first dopant comprising a first dopant type is implanted into the first semiconductive material 108 to form a drain 112' (D) of a first TFET 163. In step 195, a second dopant comprising a second dopant type is implanted into the first semiconductive material 108 to form a source 112' (S) of the first TFET 163. The first semiconductive material 108 between the source 112' (S) and drain 112' (D) forms the channel region 108' of the first TFET 163 shown in FIG. 55. In step 196, the first dopant comprising the first dopant type is implanted into the third semiconductive material 118 to form a source 122' (S) of a second TFET 165. In step 197, the second dopant comprising the second dopant type is implanted into the third semiconductive material 118 to form a drain 122' (D) of the second TFET 165. The third semiconductive material 118 disposed between the source 122' (S) and drain 122' (D) forms the channel region 118' of the second TFET 165. The first TFET 163 and the second TFET 165 comprise FinFETs.

Some of the embodiments shown in FIGS. 1 through 5, which illustrate a method of forming a 3D stacked FinFET CMOS inverter that comprises a PFET and NFET using multiple cyclic epitaxial growth and implantation processes, may also be referred to in addition to the flow chart 190 shown in FIG. 56. Furthermore, some of the embodiments shown in FIGS. 14 and 15 may also be referred to in addition to the flow chart 190. These embodiments illustrate implantation of the various dopant materials after the epitaxial layers comprising the semiconductive material 108, semiconductive material 114 or 116, and semiconductive material 118, are formed.

Some embodiments of methods of forming TFET inverters 100' described herein may advantageously be integrated with fabrication of other devices on the same semiconductor device in accordance with some embodiments. Other stacked or non-stacked devices, TFETs, FETs, and/or FinFETs may be manufactured simultaneously with the fabrication of the TFET inverters 100' described herein. For example, non-stacked TFETs, PFETs, NFETs, or other FinFETs may be simultaneously formed when portions of the TFET inverters 100' are formed, similar to the methods illustrated in FIGS. 19 through 24. Likewise, TFETs, PFETs, NFETs or other FinFETs, may also be formed in other stacked regions simultaneously with the formation of portions of the TFET inverters 100' described herein, similar to the methods illustrated in FIGS. 25 and 26.

Some advantages of some embodiments of the present disclosure include providing semiconductor devices comprising inverters with transistors comprising stacked FinFETs. The inverters comprise high mobility junction isolation 3D stacked FinFET CMOS devices with GAA channel structures. The inverters may be manufactured using cyclic sequential epitaxial growth and implantation processes, or using implantation processes after all of the epitaxial layers are formed. The fabrication of additional stacked or non-stacked FinFET devices in other regions may be integrated into the manufacturing process flow for the inverters. The inverters have superior circuit performance, and are adapted to operate at low voltages, such as about 0.7 Volts; e.g., about 1 Volt or less. By using epitaxial growth processes and selective etch processes to pattern and form channel regions, source and drain regions, and junction isolation regions or material of the transistors of the inverters, a need for through-substrate via (TSV) fabrication, complicated lithography alignment, wafer-to-wafer or chip-to-chip bonding, and high-aspect-ratio etch technologies are avoided, as examples.

The inverters achieve high speed and circuit performance. The junction isolation regions are self-aligned by the selective etch processes used for the various semiconductive material layers. The junction isolation regions are naturally pinched off and have low or no leakage current. The inverter manufacturing process comprises 3DIC technology, and results in higher yields. The inverters described herein comprise 3D stacked FinFET/nano-wire inverters with minimal physical dimensions and efficient layout usage. Furthermore, the manufacturing process flows and structures described herein are easily implementable in existing manufacturing process flows.

In some embodiments, TFET devices are used for the transistors of inverters, forming 3D stacked inverters that are extremely low power and cost-effective. The channel regions of the TFETs may be stacked double gate or stacked nanowires of a plurality of channels. An inter-layer epitaxial layer (e.g., the second semiconductive material) that forms the junction isolation regions of the TFET inverters may be doped or un-doped. The TFET inverters have high mobility junction isolation regions that are self-aligned. Additional epitaxial material layers are advantageously not required to manufacture the TFET inverters. A selective etch process is used to form the channel regions in some embodiments.

In some embodiments, a semiconductor device includes a first FinFET disposed over a substrate, a second FinFET disposed over the first FinFET, and a junction isolation material disposed between a source of the first FinFET and a source of the second FinFET.

In other embodiments, a semiconductor device includes a first semiconductive material disposed over a substrate. The first semiconductive material includes a first doped region comprising a source of a first FinFET, a second doped region comprising a drain of the first FinFET, and a channel region of the first FinFET disposed between the source and the drain. A junction isolation material is disposed over the source and drain of the first FinFET. A second semiconductive material is disposed over the junction isolation material and the first semiconductive material. The second semiconductive material includes a first doped region comprising a source of a second FinFET, a second doped region comprising a drain of the second FinFET, and a channel region of the second FinFET disposed between the source and the drain. A gate dielectric and a gate are disposed around the channel regions of the first FinFET and the second FinFET. The drains of the first FinFET and the second FinFET are coupled together. The first FinFET and the second FinFET comprise an inverter.

In other embodiments, a method of manufacturing a semiconductor device includes forming a first semiconductive material over a substrate, forming a second semiconductive material over the first semiconductive material, and forming a third semiconductive material over the second semiconductive material. A fourth semiconductive material is formed over the third semiconductive material. The method includes implanting a first dopant comprising a first dopant type into the first semiconductive material to form source and drain regions of a first FinFET, and implanting a second dopant comprising a second dopant type into the fourth semiconductive material to form source and drain regions of a second FinFET. Portions of the second semiconductive material and portions of the third semiconductive material comprise a junction isolation material.

In some embodiments, an inverter includes a substrate, a first TFET disposed over the substrate, the first TFET being a first FinFET. A second TFET is disposed over the first TFET, the second TFET being a second FinFET. A junction isolation region is disposed between a source of the first TFET and a source of the second TFET.

In some embodiments, an inverter includes a first semiconductive material disposed over a substrate. The first semiconductive material includes a first doped region that is a source of a first TFET, a second doped region that is a drain of the first TFET, and a channel region that is disposed between the source and the drain. A junction isolation region is disposed over the source of the first TFET. The inverter includes a second semiconductive material disposed over the junction isolation region and the first semiconductive material. The second semiconductive material includes a first doped region that is a source of a second TFET, a second doped region that is a drain of the second TFET, and a channel region of the second TFET that is disposed between the source and the drain. A gate dielectric and a gate are disposed around the channel regions of the first TFET and the second TFET. The drains of the first TFET and the second TFET are coupled together. The first TFET and the second TFET comprise FinFETs.

In some embodiments, a method of manufacturing an inverter includes forming a first semiconductive material over a substrate, forming a second semiconductive material over the first semiconductive material, and forming a third semiconductive material over the second semiconductive material. The method includes implanting a first dopant comprising a first dopant type into the first semiconductive material to form a drain of a first TFET, and implanting a second dopant comprising a second dopant type into the first semiconductive material to form a source of the first TFET. The method also includes implanting the first dopant comprising the first dopant type into the third semiconductive material to form a source of a second TFET, and implanting the second dopant comprising the second dopant type into the third semiconductive material to form a drain of the second TFET. The first TFET and the second TFET comprise FinFETs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first semiconductive material over a substrate;
   implanting a first dopant comprising a first dopant type into the first semiconductive material to form a drain of a first tunnel FET (TFET);
   implanting a second dopant comprising a second dopant type into the first semiconductive material to form a source of the first TFET;
   forming a second semiconductive material over the first semiconductive material;
   forming a third semiconductive material over the second semiconductive material;
   implanting the first dopant comprising the first dopant type into the third semiconductive material to form a source of a second TFET; and
   implanting the second dopant comprising the second dopant type into the third semiconductive material to form a drain of the second TFET, wherein the first TFET and the second TFET comprise fin field effect transistors (FinFETs).

2. The method of claim 1, further comprising patterning the first semiconductive material and the third semiconductive material to form channel regions between the sources and the drains of the first TFET and the second TFET, respectively.

3. The method of claim 2, wherein patterning the first semiconductive material and the third semiconductive material further comprises patterning the second semiconductive material.

4. The method of claim 1, wherein forming the first semiconductive material comprises forming a plurality of layers of the first semiconductive material, wherein implanting the first dopant and the second dopant into the first semiconductive material comprise implanting the first dopant and the second dopant into the plurality of layers of the first semiconductive material, wherein the plurality of layers of the first semiconductive material comprises alternating layers of a first material and a second material, the second material being different than the first material, and wherein the second material comprises a first sacrificial material disposed between the source and the drain of the first TFET; and wherein forming the third semiconductive material comprises forming a plurality of layers of the third semiconductive material, wherein implanting the first dopant and the second dopant into the third semiconductive material comprise implanting the first dopant and the second dopant into the plurality of layers of the third semiconductive material, wherein the plurality of layers of the third semiconductive material comprises alternating layers of the first material and a third material, the third material being different than the first material, and wherein the third material comprises a second sacrificial material disposed between the source and the drain of the second TFET.

5. The method of claim 4, further comprising:
removing the first sacrificial material of the second material and removing the second sacrificial material of the third material, wherein the first material left remaining of the first TFET comprises a channel region comprising a plurality of channels disposed between the source and the drain of the first TFET, wherein the first material left remaining of the second TFET comprises a channel region comprising a plurality of channels disposed between the source and the drain of the second TFET;
forming a gate dielectric around the channel regions of the first TFET and the second TFET; and
forming a gate around the gate dielectric.

6. The method of claim 1, wherein forming the first semiconductive material comprises forming a plurality of layers of the first semiconductive material, wherein implanting the first dopant and the second dopant into the first semiconductive material comprise implanting the first dopant and the second dopant into the plurality of layers of the first semiconductive material, wherein the plurality of layers of the first semiconductive material comprises alternating layers of a first material and a second material, the second material being different than the first material, and wherein the first material comprises a sacrificial material disposed between the source and the drain of the first TFET; and wherein forming the third semiconductive material comprises forming a plurality of layers of the third semiconductive material, wherein implanting the first dopant and the second dopant into the third semiconductive material comprise implanting the first dopant and the second dopant into the plurality of layers of the third semiconductive material, wherein the plurality of layers of the third semiconductive material comprises alternating layers of the first material and a third material, the third material being different than the first material, and wherein the sacrificial material of the first material is disposed between the source and the drain of the second TFET.

7. The method of claim 6, further comprising:
removing the sacrificial material of the first material, wherein the second material left remaining of the first TFET comprises a channel region comprising a plurality of channels disposed between the source and the drain of the first TFET, wherein the third material left remaining of the second TFET comprises a channel region comprising a plurality of channels disposed between the source and the drain of the second TFET;
forming a gate dielectric around the channel regions of the first TFET and the second TFET; and
forming a gate around the gate dielectric.

8. A method comprising:
forming a first semiconductor region over a substrate;
forming a junction isolation material over the first semiconductor region;
forming a second semiconductor region over the junction isolation material;
patterning the first semiconductor region and the second semiconductor region such that a first source region, a first drain region, and a first channel region are formed in the first semiconductor region, and a second source region, a second drain region, and a second channel region are formed in the second semiconductor region;
implanting a first plurality of dopants into the first semiconductor region to dope the first source region and the first drain region, the first drain region having a different dopant type than the first source region; and
implanting a second plurality of dopants into the second semiconductor region to dope the second source region and the second drain region, the second drain region having a different dopant type than the second source region.

9. The method of claim 8, wherein forming the junction isolation material comprises forming a third semiconductor region over the first semiconductor region.

10. The method of claim 9, further comprising doping the third semiconductor region.

11. The method of claim 8, further comprising removing portions of the junction isolation material overlying the first channel region and underlying the second channel region.

12. The method of claim 8, wherein the first drain region has a different dopant type than the second drain region.

13. The method of claim 8, wherein the first source region has a different dopant type than the second source region.

14. The method of claim 8, wherein the forming the first semiconductor region comprises:
forming a first plurality of layers on the substrate, the first plurality of layers including alternating layers of a first semiconductor material and a second semiconductor material.

15. The method of claim 14, wherein the forming the second semiconductor region comprises:
forming a second plurality of layers on the junction isolation material, the second plurality of layers including alternating layers of the second semiconductor material and a third semiconductor material.

16. The method of claim 15, wherein the patterning the first semiconductor region and the second semiconductor region comprises:
removing portions of the layers of the first semiconductor material in the first channel region; and
removing portions of the layers of the third semiconductor material in the second channel region.

17. The method of claim 15, wherein the first semiconductor material is an n-type material, wherein the second semiconductor material is one of SiGe, Ge, GeSn, SiGeSn, or a III-V material, and wherein the third semiconductor material is a p-type material.

18. A method comprising:
forming a first device comprising:
forming a first semiconductor material over a substrate;
forming a first source region, a first drain region, and a first channel region in the first semiconductor material;
doping the first source region to have a first dopant type; and
doping the first drain region to have a second dopant type different from the first dopant type;
forming a junction isolation region over the first device;
forming a second device comprising:
forming a second semiconductor material over the junction isolation region;

forming a second source region, a second drain region, and a second channel region in the second semiconductor material;

doping the second source region to have the second dopant type; and doping the second drain region to have the first dopant type;

forming a gate dielectric around the first channel region of the first device and the second channel region of the second device; and forming a gate electrode around the gate dielectric.

19. The method of claim 18, further comprising:

coupling the first source region to a voltage supply node;

coupling the second source region to a ground node;

forming a first contact electrically coupled to the first drain region and the second drain region; and forming a second contact electrically coupled to the gate electrode.

20. The method of claim 18, wherein the first source region is formed over the second source region, and the first drain region is formed over the second drain region.

* * * * *